(12) United States Patent
Yamazaki

(10) Patent No.: US 7,858,455 B2
(45) Date of Patent: Dec. 28, 2010

(54) METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 394 days.

(21) Appl. No.: 12/219,017

(22) Filed: Jul. 15, 2008

(65) Prior Publication Data

US 2009/0029508 A1    Jan. 29, 2009

(30) Foreign Application Priority Data

Jul. 27, 2007    (JP)    ............... 2007-196272

(51) Int. Cl.
*H01L 21/84*    (2006.01)
*H01L 21/00*    (2006.01)

(52) U.S. Cl. .................. 438/152; 438/154; 438/155; 438/158; 438/162; 438/166; 257/E21.414

(58) Field of Classification Search ............ None
See application file for complete search history.

(56) References Cited

U.S. PATENT DOCUMENTS

| | | | |
|---|---|---|---|
| 4,619,034 A * | 10/1986 | Janning ............... | 438/158 |
| 5,028,551 A * | 7/1991 | Dohjo et al. ............ | 438/30 |
| 5,198,379 A * | 3/1993 | Adan .................... | 438/151 |
| 5,294,811 A * | 3/1994 | Aoyama et al. ......... | 257/59 |
| 5,453,858 A | 9/1995 | Yamazaki | |
| 5,591,987 A | 1/1997 | Yamazaki et al. | |
| 5,701,167 A | 12/1997 | Yamazaki | |

(Continued)

FOREIGN PATENT DOCUMENTS

JP    04-242724    8/1992

OTHER PUBLICATIONS

Lee et al., "High-Mobility Nanocrystalline Silicon Thin-Film Transistors Fabricated by Plasma-Enhanced Chemical Vapor Deposition", Appl. Phys. Lett. (Applied Physics Letters ), May 24, 2005, vol. 86, pp. 222106-1-222106-3.

(Continued)

*Primary Examiner*—Zandra Smith
*Assistant Examiner*—Khanh B Duong
(74) *Attorney, Agent, or Firm*—Eric J. Robinson; Robinson Intellectual Property Law Office, P.C.

(57) ABSTRACT

A method for manufacturing a semiconductor device and a display device each including a thin film transistor which has excellent electric characteristics and high reliability, with high mass productivity. In a display device which includes a channel-etch inversely-staggered thin film transistor in which a microcrystalline semiconductor layer is used for a channel formation region, the microcrystalline semiconductor layer is formed of a stacked layer of a microcrystalline semiconductor film which is formed by a deposition method and can be a nucleus of crystal growth and an amorphous semiconductor film; a conductive film and a semiconductor film which forms a source region and a drain region and to which an impurity imparting one conductivity is added are formed over the amorphous semiconductor film; and the conductive film is irradiated with laser light. The amorphous semiconductor film over the microcrystalline semiconductor film is crystallized by the laser light, and the microcrystalline semiconductor layer including the microcrystalline semiconductor film formed by a deposition method can be formed.

20 Claims, 36 Drawing Sheets

U.S. PATENT DOCUMENTS

| | | | | |
|---|---|---|---|---|
| 5,834,345 | A | * | 11/1998 | Shimizu ................. 438/158 |
| 5,849,601 | A | | 12/1998 | Yamazaki |
| 6,023,075 | A | | 2/2000 | Yamazaki |
| 6,218,702 | B1 | | 4/2001 | Yamazaki et al. |
| 6,242,758 | B1 | | 6/2001 | Yamazaki et al. |
| 6,252,249 | B1 | | 6/2001 | Yamazaki |
| 6,268,235 | B1 | | 7/2001 | Sakakura et al. |
| 6,287,888 | B1 | | 9/2001 | Sakakura et al. |
| 6,306,213 | B1 | | 10/2001 | Yamazaki |
| 6,797,548 | B2 | * | 9/2004 | Zhang et al. ............. 438/152 |
| 6,838,324 | B2 | * | 1/2005 | Yamazaki et al. ........ 438/149 |
| 6,979,840 | B1 | | 12/2005 | Yamazaki et al. |
| 7,067,844 | B2 | | 6/2006 | Yamazaki |
| 7,098,479 | B1 | | 8/2006 | Yamazaki |
| 7,115,902 | B1 | | 10/2006 | Yamazaki |
| 2005/0012097 | A1 | | 1/2005 | Yamazaki |
| 2007/0018165 | A1 | | 1/2007 | Yamazaki |

OTHER PUBLICATIONS

Lee et al., "High Mobility N-Channel and P-Channel Nanocrystalline Silicon Thin-Film Transistors", IEEE, 2005, pp. 937-940.

Lee et al., "Directly Deposited Nanocrystalline Silicon Thin-Film Transistors with Ultra High Mobilities", Appl. Phys. Lett. (Applied Physics Letters ), Dec. 18, 2006, vol. 89, pp. 252101-1-252101-3.

Lee et al., "How to Achieve High Mobility Thin Film Transistors by Direct Deposition of Silicon Using 13.56 MHz RF PECVD?", IEDM, 2006, pp. 295-298.

Esmaeili et al., "High Stability, Low Leakage Nanocrystalline Silicon Bottom Gate Thin Film Transistors for AMOLED Displays", IEEE, 2006, pp. 303-306.

Lee et al., "Leakage Current Mechanisms in Top-Gate Nanocrystalline Silicon Thin-Film Transistors", Appl. Phys. Lett. (Applied Physics Letters ), Feb. 28, 2008, vol. 92, pp. 083509-1-083509-3.

Esmaeili et al., "Absence of Defect State Creation in Nanocrystalline Silicon Thin-Film Transistors Deduced from Constant Current Stress Measurements", Appl. Phys. Lett. (Applied Physics Letters ), Sep. 12, 2007, vol. 91, pp. 113511-1-113511-3.

Lee et al., "Stability of nc-Si:H TFTs Wth Silicon Nitride Gate Dielectric", IEEE Transactions on Electron Devices, 2007, vol. 54, No. 1, pp. 45-51.

Sazonov et al., "Low-Temperature Materials and Thin Film Transistors for Flexible Electronics", Proceedings of the IEEE, Aug. 1, 2005, vol. 93, No. 8, pp. 1420-1428.

Esmaeili et al., "Stability of Nanocrystalline Silicon Bottom-Gate Thin-Film Transistors with Silicon Nitride Gate Dielectrics", J. Appl. Phys. (Journal of Applied Physics ), Sep. 28, 2007, vol. 102, pp. 064512-1- 064512-7.

Lee et al., "Top-Gate TFTs Using 13.56MHz PECVD Microcrystalline Silicon", IEEE Electron Device Letters, Sep. 5, 2005, vol. 26, No. 9, pp. 637-639.

Lee et al., "Postdeposition Thermal Annealing and Material Stability of 75° C. Hydrogenated Nanocrystalline Silicon Plasma-Enhanced Chemical Vapor Deposition Films", J. Appl. Phys. (Journal of Applied Physics ), Aug. 4, 2005, vol. 98, pp. 034305-1-034305-7.

Arai et al., "Micro Silicon Technology for Active Matrix OLED Display", SID '07 Digest, May 23-25, 2007, pp. 1370-1373.

* cited by examiner

A3  352b 352a 351 350 365a 355 354 353  B3

A3  383 382  B3

365c 365b 359
356

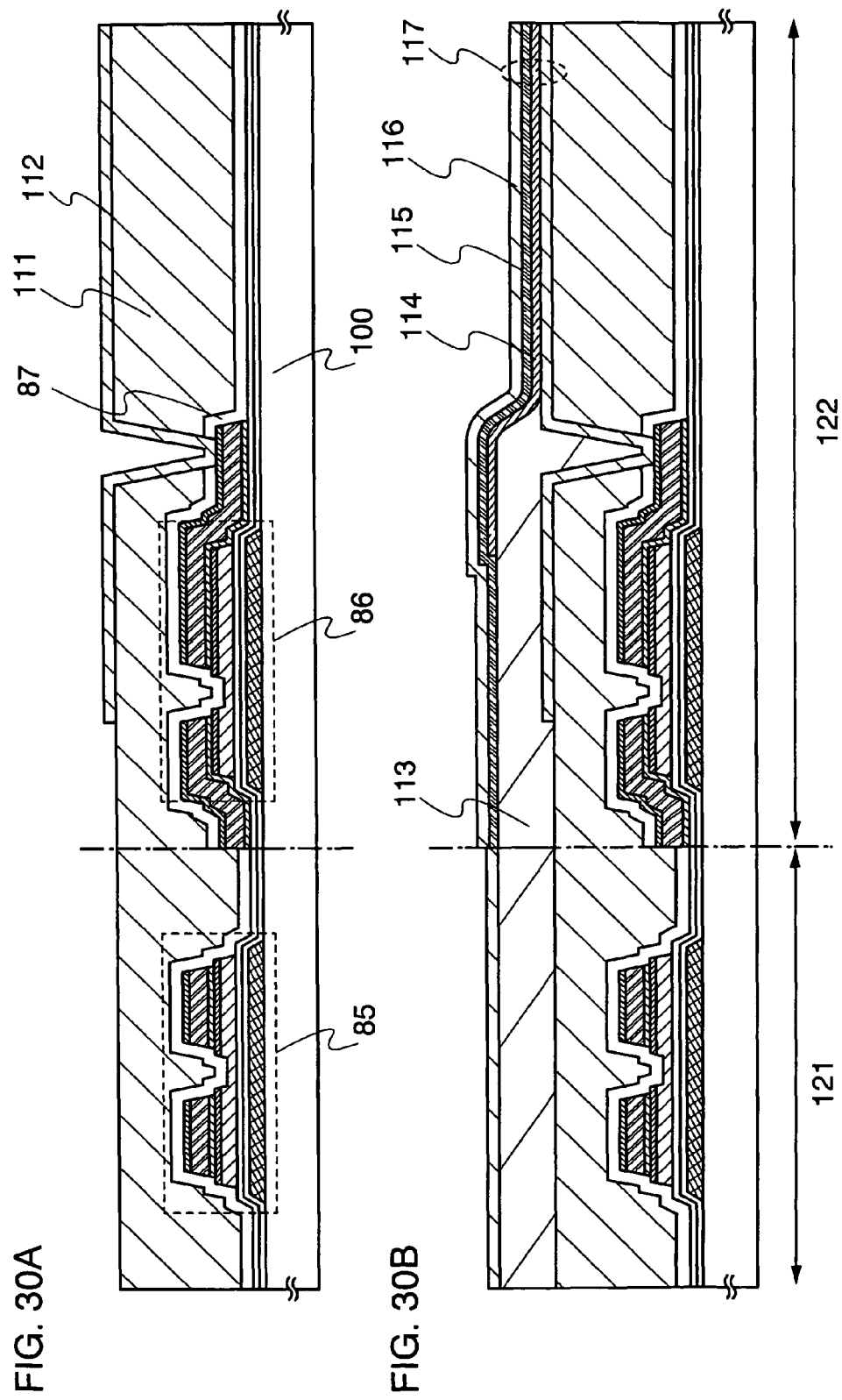

METHOD FOR MANUFACTURING SEMICONDUCTOR DEVICE

BACKGROUND OF THE INVENTION

1. Field of the Invention

The present invention relates to a method for manufacturing a semiconductor device and a display device using a thin film transistor in at least a pixel portion.

2. Description of the Related Art

In recent years, a technique that is used to form thin film transistors using semiconductor thin films (with thicknesses of from several nanometers to several hundreds of nanometers, approximately) formed over substrates having an insulating surface has been attracting attention. Thin film transistors are widely applied to electronic devices such as ICs or electro-optical devices, and development of thin film transistors which are to be used as switching elements especially in image display devices is being pushed.

As a switching element in an image display device, a thin film transistor using an amorphous semiconductor film, a thin film transistor using a polycrystalline semiconductor film, or the like is used. As a method for forming a polycrystalline semiconductor film, a technique is known in which a pulsed excimer laser beam is shaped into a linear laser beam by an optical system and an amorphous silicon film is scanned and irradiated with the linear beam to be crystallized.

Furthermore, as a switching element in an image display device, a thin film transistor using a microcrystalline semiconductor film is used (see Patent Document 1: U.S. Pat. No. 5,591,987 and Patent Document 2: Japanese Published Patent Application No. H4-242724).

Moreover, as a method for manufacturing a thin film transistor using a microcrystalline semiconductor film, a method is known in which after an amorphous silicon film is formed on a gate insulating film, a metal film is formed on a surface of the amorphous silicon film, and the metal film is irradiated with a diode laser so that the amorphous silicon film is modified into a microcrystalline silicon film (For example, see Non-Patent Document 1: Toshiaki Arai et al., SID 07 DIGEST, 2007, pp. 1370-1373). According to this method, the metal film formed over the amorphous silicon film is a film for converting optical energy of the diode laser into thermal energy, and should be removed later in order to complete the thin film transistor.

However, there are problems in that a process becomes complicated when steps of forming and removing a metal film for crystallization of a semiconductor film are performed as in Non-Patent Document 1, and accordingly yield is reduced and cost is increased.

SUMMARY OF THE INVENTION

In view of the above-described problems, it is an object of the present invention to provide a method for manufacturing a display device including a thin film transistor which has excellent electric characteristics and high reliability, with high mass productivity.

In a display device which includes an inversely-staggered thin film transistor with a channel-etch structure in which a microcrystalline semiconductor layer is used for a channel formation region, the microcrystalline semiconductor layer is formed as a stacked layer of a microcrystalline semiconductor film which is formed by a deposition method and can be a nucleus of crystal growth and an amorphous semiconductor film; a semiconductor film which forms a source region and a drain region and to which an impurity imparting one conductivity type is added and a conductive film are formed over the amorphous semiconductor film; and the conductive film is irradiated with laser light. The microcrystalline semiconductor layer in which the amorphous semiconductor film over the microcrystalline semiconductor film is crystallized by the laser light and which includes the microcrystalline semiconductor film formed by a deposition method can be formed.

In the present invention, a microcrystalline semiconductor layer is formed in such a manner that a microcrystalline semiconductor film obtained by crystallization of an amorphous semiconductor film is formed over a microcrystalline semiconductor film formed by a deposition method, and thus even a thick microcrystalline semiconductor layer can be formed without requiring long processing time. Accordingly, time required for a manufacturing process of a thin film transistor having a microcrystalline semiconductor layer can be shortened, and thus productivity is increased.

In addition, as the semiconductor film to which the impurity imparting one conductivity type is added, the microcrystalline semiconductor film which is crystallized by laser light and to which the impurity imparting one conductivity type is added is used as a source region and a drain region. Thus, lower resistance of the source region and the drain region can be realized and electric characteristics can be improved.

The conductive film not only functions as a protective film which prevents oxidation, contamination, or the like of the semiconductor films formed thereunder in a laser light irradiation step, but also, in the present invention, etches the conductive film irradiated with laser light, so that a source electrode and a drain electrode are formed.

Thus, since deterioration such as oxidation of the semiconductor films in the process can be prevented, reliability is improved. Furthermore, since formation and removal of a conductive film for a laser irradiation step for forming a microcrystalline semiconductor layer are not performed, the process can be simplified. Thus, the yield is increased and a thin film transistor (a semiconductor device) and a display device including the thin film transistor can be manufactured with high mass productivity.

Unlike a polycrystalline semiconductor film, a microcrystalline semiconductor film can be directly formed over a substrate as a microcrystalline semiconductor film. Specifically, the microcrystalline semiconductor film can be formed using silicon hydride as a source gas with use of a microwave plasma CVD apparatus with a frequency of greater than or equal to 1 GHz. In addition, since plasma generated with use of microwaves with a frequency of greater than or equal to 1 GHz has high electron density, silicon hydride which is a source gas can be easily dissociated. Accordingly, in the case of using a microwave plasma CVD apparatus with a frequency of greater than or equal to 1 GHz, the microcrystalline semiconductor film can be formed more easily and a deposition rate can be more increased than in the case of using a microwave plasma CVD apparatus with a frequency of several tens of MHz to several hundreds of MHz.

In addition, a thin film transistor (TFT) is manufactured using the microcrystalline semiconductor film, and a display device is manufactured using the thin film transistor in a pixel portion, and further, in a driver circuit. The thin film transistor using a microcrystalline semiconductor film has a mobility of 1 to 20 $cm^2$/V·sec, which is 2 to 20 times higher than that of a thin film transistor using an amorphous semiconductor film. Therefore, part of the driver circuit or the whole driver circuit can be formed over the same substrate as the pixel portion, whereby a system-on-panel can be manufactured.

A gate insulating film, the microcrystalline semiconductor film, the amorphous semiconductor film, and the amorphous semiconductor film which forms a source region and a drain region and to which the impurity imparting one conductivity type is added may be formed in the same reaction chamber. Alternatively, they may be formed in different reaction chambers. In addition, the conductive film used as a source electrode and a drain electrode may be successively formed, and a laser light irradiation step thereafter may also be successively performed without exposure to air.

Before a substrate is carried in a reaction chamber to perform deposition, it is desirable to perform cleaning, flushing (washing) treatment (hydrogen flushing using hydrogen as a flushing substance, silane flushing using silane as a flushing substance, or the like), and coating in which the inner wall of each reaction chamber is coated with a protective film (the coating is also referred to as pre-coating treatment). The pre-coating treatment is treatment in which plasma treatment is performed by flowing of a deposition gas in a reaction chamber to thinly coat the inside of the reaction chamber with a protective film using a film which is to be formed, in advance. By the flushing treatment and the pre-coating treatment, a film to be formed can be prevented from being contaminated by impurities such as oxygen, nitrogen, and fluorine in the reaction chamber.

The amorphous semiconductor film can be formed by a plasma CVD method, a sputtering method, or the like. In addition, after the amorphous semiconductor film is formed, a surface of the amorphous semiconductor film is subjected to treatment with nitrogen plasma, hydrogen plasma, or halogen plasma, so that the surface of the amorphous semiconductor film is nitrided, hydrogenated, or halogenated.

One aspect of the present invention is a method for manufacturing a semiconductor device, which includes the steps of sequentially forming a gate insulating film, a microcrystalline semiconductor film, an amorphous semiconductor film, a semiconductor film to which an impurity imparting one conductivity type is added, and a conductive film over a gate electrode; emitting laser light to the conductive film to modify at least the amorphous semiconductor film into a microcrystalline semiconductor film; and manufacturing a channel-etch type thin film transistor while the conductive film remains over the semiconductor film to which the impurity imparting one conductivity type is added.

Another aspect of the present invention is a method for manufacturing a semiconductor device, which includes the steps of sequentially forming a gate insulating film, a microcrystalline semiconductor film, an amorphous semiconductor film, a semiconductor film to which an impurity imparting one conductivity type is added, and a conductive film over a gate electrode; emitting laser light to the conductive film to modify the amorphous semiconductor film into a microcrystalline semiconductor film and to modify the semiconductor film to which the impurity imparting one conductivity type is added into a microcrystalline semiconductor film to which the impurity imparting one conductivity type is added; and manufacturing a channel-etch type thin film transistor while the conductive film remains over the semiconductor film to which the impurity imparting one conductivity type is added.

Another aspect of the present invention is a method for manufacturing a semiconductor device, which includes the steps of sequentially forming a gate insulating film, a microcrystalline semiconductor film, an amorphous semiconductor film, a semiconductor film to which an impurity imparting one conductivity type is added, and a conductive film over a gate electrode; emitting laser light to the conductive film to modify at least the amorphous semiconductor film into a microcrystalline semiconductor film; manufacturing a channel-etch type thin film transistor while the conductive film remains over the semiconductor film to which the impurity imparting one conductivity type is added; and forming a pixel electrode which is electrically connected to the channel-etch type thin film transistor.

Another aspect of the present invention is a method for manufacturing a semiconductor device, which includes the steps of sequentially forming a gate insulating film, a microcrystalline semiconductor film, an amorphous semiconductor film, a semiconductor film to which an impurity imparting one conductivity type is added, and a conductive film over a gate electrode; emitting laser light to the conductive film to modify the amorphous semiconductor film into a microcrystalline semiconductor film and to modify the semiconductor film to which the impurity imparting one conductivity type is added into a microcrystalline semiconductor film to which the impurity imparting one conductivity type is added; manufacturing a channel-etch type thin film transistor while the conductive film remains over the semiconductor film to which the impurity imparting one conductivity type is added; and forming a pixel electrode which is electrically connected to the channel-etch type thin film transistor.

The semiconductor device having a display function (a display device) includes a display element. As the display element, a liquid crystal element (also referred to as a liquid crystal display element) or a light-emitting element (also referred to as a light-emitting display element) can be used. A light-emitting element includes, in its category, an element whose luminance is controlled by current or voltage, especially, organic EL (electroluminescence), inorganic EL, and the like. Furthermore, a display medium whose contrast is changed by an electric effect, such as an electronic ink, can be used.

In addition, the display device includes a panel in which a display element is sealed, and a module in which an IC and the like including a controller are mounted on the panel. The present invention further relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film which is to be a pixel electrode is formed and before the conductive film is etched to form the pixel electrode, or any other states.

A display device in this specification means an image display device, a display device, or a light source (including a lighting device). Moreover, the display device includes any of the following modules in its category: a module including a connector such as an flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

The present invention makes it possible to manufacture a semiconductor device and a display device each of which includes a thin film transistor which has excellent electric characteristics and high reliability, with high mass productivity.

BRIEF DESCRIPTION OF THE DRAWINGS

In the accompanying drawings:

FIGS. 30A and 30B are views illustrating a display device of the present invention;

DETAILED DESCRIPTION OF THE INVENTION

Figure 1A:
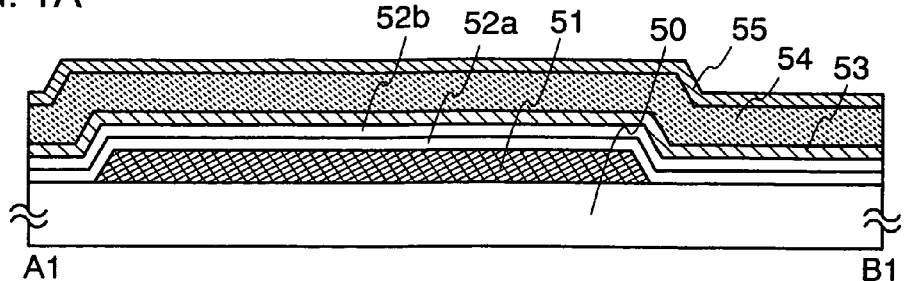
FIGS. 1A to 1E are views illustrating a method for manufacturing a display device of the present invention.

Embodiment Modes of the present invention will be hereinafter described with reference to the accompanying drawings. Note that the present invention is not limited to the description below and it is easily understood by those skilled in the art that modes and details of the present invention can be modified in various ways without departing from the purpose and scope of the present invention. Therefore, the present invention should not be interpreted as being limited to the description of Embodiment Modes below. Note that, in the structures of the present invention described below, reference numerals denoting the same portions may be used in common in different drawings.

Embodiment Mode 1

In this embodiment mode, a manufacturing process of a thin film transistor used in a semiconductor device (a display device) will be described with reference to FIGS. 1A to 1E, FIGS. 2A to 2D, FIGS. 3A and 3B, and FIGS. 4A to 4D. FIGS. 1A to 1E, FIGS. 2A to 2D, and FIGS. 3A and 3B are cross-sectional views illustrating a manufacturing process of a thin film transistor. FIGS. 4A to 4D are plane views of a connection region between a thin film transistor and a pixel electrode in one pixel. FIGS. 1A to 1E, FIGS. 2A to 2D, and FIGS. 3A and 3B are cross-sectional views illustrating a manufacturing process of the thin film transistor taken along lines A1-B1 in FIGS. 4A to 4D.

Although an n-type thin film transistor which has a microcrystalline semiconductor film is more suitable for a driver circuit than a p-type thin film transistor which has a microcrystalline semiconductor film because of its high mobility, either an n-type thin film transistor or a p-type thin film transistor may be used in the present invention. When a thin film transistor with either polarity is used, it is desirable that all the thin film transistors formed over one substrate have the same polarity so that the number of manufacturing steps is suppressed. In this embodiment mode, the case of using an n-channel thin film transistor will be described.

Hereinafter, a manufacturing method will be described in detail. A gate electrode 51 is formed over a substrate 50. As the substrate 50, a plastic substrate or the like with heat resistance which can withstand a processing temperature of the manufacturing process can be used as well as a non-alkaline glass substrate manufactured by a fusion method or a float method, such as a barium borosilicate glass substrate, an aluminoborosilicate glass substrate, or an aluminosilicate glass substrate, and a ceramic substrate. Alternatively, a metal substrate such as a stainless steel alloy substrate, provided with an insulating film on its surface, may be used. The substrate 50 can have various sizes, such as sizes of 300 mm×400 mm of the first generation, 550 mm×650 mm of the third generation, 730 mm×920 mm of the fourth generation, 1000 mm×1200 mm of the fifth generation, 1500 mm×1850 mm of the sixth generation, 1870 mm×2200 mm of the seventh generation, 2200 mm×2400 mm of the eighth generation, 2400×2800 mm of the ninth generation, and 2880 mm×3080 mm of the tenth generation.

The gate electrode 51 is formed of a metal material such as titanium, molybdenum, chromium, tantalum, tungsten, or aluminum, or an alloy material thereof. The gate electrode 51 can be formed as follows: a conductive film is formed over the substrate 50 by a sputtering method or a vacuum evaporation method, a mask is formed over the conductive film by a photolithography technique or an ink-jet method, and the conductive film is etched with use of the mask. Alternatively, the gate electrode 51 can be formed in such a manner that a conductive nanopaste of silver, gold, copper, or the like is discharged by an ink-jet method and baked. Note that a nitride film formed of the above-described metal material may be provided between the substrate 50 and the gate electrode 51 to improve the adhesiveness of the gate electrode 51 to the substrate 50 and to serve as a barrier metal for preventing diffusion of impurities to a base. In addition, the gate electrode 51 may have a stacked-layer structure such as stacked layers of, from the substrate 50 side, an aluminum film and a molybdenum film; a copper film and a molybdenum film; a copper film and a titanium nitride film; a copper film and a tantalum nitride film; or the like. In the above-described stacked-layer structure, a molybdenum film or a nitride film such as a titanium nitride film or a tantalum nitride film, which is formed as an upper layer, has an effect as the barrier metal.

Note that, since a semiconductor film and a wiring are formed over the gate electrode 51, the gate electrode 51 is desirably processed to have tapered edges so that the semiconductor film and the wiring thereover are not disconnected. In addition, although not shown, the wiring connected to the gate electrode 51 can be formed at the same time in this step.

Figure 4A:
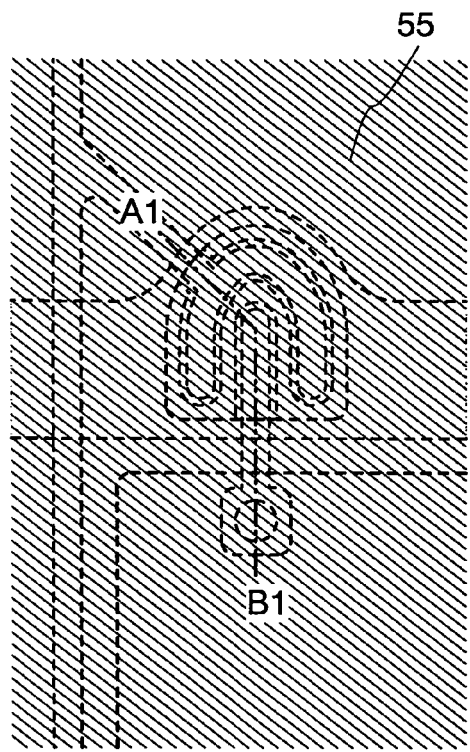
FIGS. 4A to 4D are views illustrating a method for manufacturing a display device of the present invention.
Figure 4B:
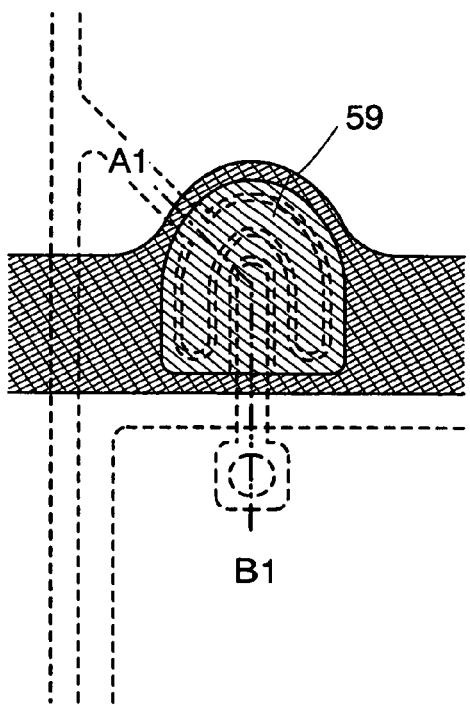

Next, gate insulating films 52a and 52b, a microcrystalline semiconductor film 53, an amorphous semiconductor film 54, and an amorphous semiconductor film 55 to which an impurity imparting one conductivity type is added are formed in this order over the gate electrode 51 (see FIG. 1A and FIG. 4A). FIG. 1A corresponds to the cross-sectional view taken along the line A1-B1 in FIG. 4A.

The microcrystalline semiconductor film 53 may be formed on a surface of the gate insulating film 52b while making hydrogen plasma act thereon (on which hydrogen plasma has acted). When microcrystalline semiconductor film is formed over a gate insulating film on which hydrogen plasma has acted, the crystal growth of the microcrystal can be promoted.

In addition, lattice distortion at an interface between the gate insulating film and the microcrystalline semiconductor film can be reduced and the interface characteristics between the gate insulating film and the microcrystalline semiconductor film can be improved. Thus, the microcrystalline semiconductor film which is to be obtained can have excellent electric characteristics and high reliability.

Note that the gate insulating films 52a and 52b, the microcrystalline semiconductor film 53, and the amorphous semiconductor film 54 may be formed successively without being exposed to air. The gate insulating films 52a and 52b, the microcrystalline semiconductor film 53, and the amorphous semiconductor film 54 are formed successively without being exposed to air, whereby each interface between the stacked layers can be formed without being contaminated by atmospheric components or contamination impurity elements contained in air. Thus, variations in characteristics of the thin film transistor can be reduced.

Each of the gate insulating films 52a and 52b can be formed of a silicon oxide film, a silicon nitride film, a silicon oxynitride film, or a silicon nitride oxide film by a CVD method, a sputtering method, or the like. In this embodiment mode, a mode is shown in which a stacked layer of a silicon nitride film or a silicon nitride oxide film as the gate insulating film 52a and a silicon oxide film or a silicon oxynitride film as the gate insulating film 52b is formed. Note that the gate insulating film is not limited to the two-layer structure and it can be formed as a three-layer structure in which a silicon nitride film or a silicon nitride oxide film, a silicon oxide film or a silicon oxynitride film, and a silicon nitride film or a silicon nitride oxide film are stacked in this order from the substrate side. Alternatively, the gate insulating film can be formed as a single layer of a silicon oxide film, a silicon nitride film, a silicon oxynitride film, or a silicon nitride oxide film. Furthermore, it is desirable that the gate insulating film be formed with use of a microwave plasma CVD apparatus with a frequency of 1 GHz. A silicon oxynitride film or a silicon nitride oxide film formed with use of a microwave plasma CVD apparatus has high withstand voltage, and thus reliability of a thin film transistor which is to be manufactured later can be increased.

As an example of the three-layer structure of the gate insulating film, a structure may be employed in which a silicon nitride film or a silicon nitride oxide film as a first layer, a silicon oxynitride film as a second layer, and a silicon nitride film as a third layer are stacked over the gate electrode. In this case, it is desirable that the silicon nitride film or the silicon nitride oxide film, which is the first layer, be thicker than 50 nm, and such a film achieves an effect of serving as a barrier for blocking impurities such as sodium, and effects of preventing hillock of the gate electrode and preventing oxidation of the gate electrode. The silicon nitride film, which is the third layer, has effects of improving the adhesiveness of the microcrystalline semiconductor film and preventing oxidation thereof.

A very thin nitride film like a silicon nitride film is formed on a surface of the gate insulating film as described above, whereby the adhesiveness of the microcrystalline semiconductor film can be improved. The nitride film may be formed by a plasma CVD method or through nitridation treatment by high-density low-temperature plasma treatment by a microwave. Alternatively, a silicon nitride film or a silicon nitride oxide film may be formed when performing silane flushing on a reaction chamber.

The silicon oxynitride film here means a film that contains more oxygen than nitrogen and includes oxygen, nitrogen, silicon, and hydrogen at concentrations ranging from 55 to 65 atomic %, 1 to 20 atomic %, 25 to 35 atomic %, and 0.1 to 10 atomic %, respectively. In addition, the oxygen-containing silicon nitride film means a film that contains more nitrogen than oxygen and includes oxygen, nitrogen, silicon, and hydrogen at concentrations ranging from 15 to 30 atomic %, 20 to 35 atomic %, 25 to 35 atomic %, and 15 to 25 atomic %, respectively.

In the case where an n-channel thin film transistor is formed, as a typical impurity element, phosphorus may be added to the amorphous semiconductor film 55 to which the impurity imparting one conductivity type is added, and an impurity gas such as $PH_3$ may be added to silicon hydride. In addition, in the case where a p-channel thin film transistor is formed, boron may be added as a typical impurity element, and an impurity gas such as $B_2H_6$ may be added to silicon hydride. The amorphous semiconductor film 55 to which the impurity imparting one conductivity type is added can be formed of a microcrystalline semiconductor film or an amorphous semiconductor film. The amorphous semiconductor film 55 to which the impurity imparting one conductivity type is added may be formed to a thickness of 2 to 50 nm (preferably, 10 to 30 nm).

Figure 1B:
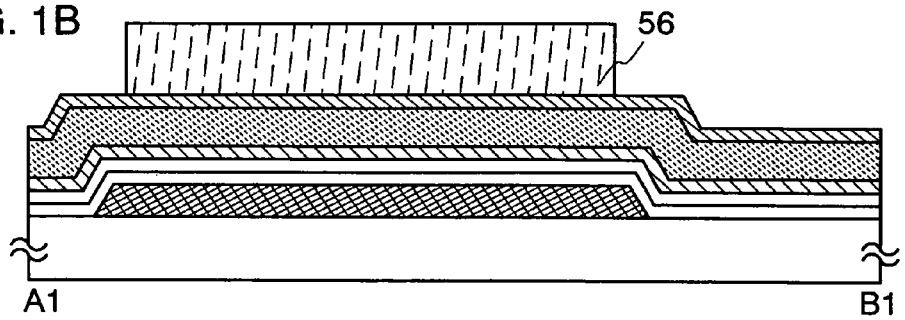

A mask 56 is formed over the microcrystalline semiconductor film 53, the amorphous semiconductor film 54, and the amorphous semiconductor film 55 to which the impurity imparting one conductivity type is added (see FIG. 1B). The mask 56 is formed by a photolithography technique or an ink-jet method.

Figure 1C:
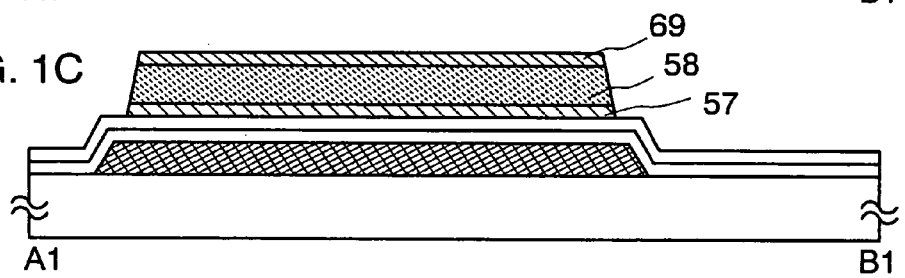

Next, the microcrystalline semiconductor film 53, the amorphous semiconductor film 54, and the amorphous semiconductor film 55 to which the impurity imparting one conductivity type is added are etched with use of the mask 56 to be separated, whereby a microcrystalline semiconductor film 57, an amorphous semiconductor film 58, and an amorphous semiconductor film 69 to which the impurity imparting one conductivity type is added are formed (see FIG. 1C). After that, the mask 56 is removed. Note that FIG. 1C corresponds to the cross-sectional view taken along the line A1-B1 in FIG. 4B.

Edges of each of the microcrystalline semiconductor film 57, the amorphous semiconductor film 58, and the amorphous semiconductor film 69 to which the impurity imparting one conductivity type is added may be etched into a tapered shape. Etching is performed so that the taper angle of the edge is 30° to 90°, preferably 45° to 80°. Accordingly, disconnection of a wiring due to the shape of steps can be prevented.

Figure 1D:
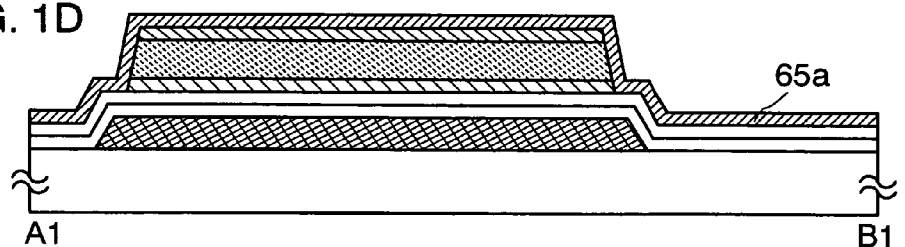

Next, a conductive film 65a is formed over the microcrystalline semiconductor film 57, the amorphous semiconductor film 58, the amorphous semiconductor film 69 to which the impurity imparting one conductivity type is added, and the gate insulating film 52b (see FIG. 1D).

Figure 1E:
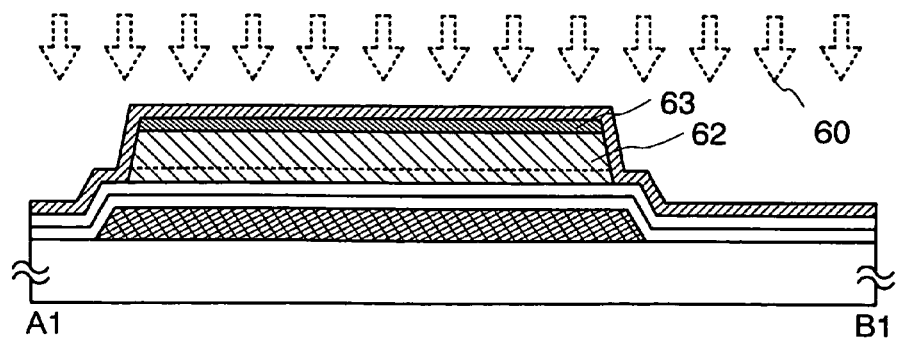

The conductive film 65a is irradiated with laser light 60 to crystallize (microcrystallize) the amorphous semiconductor film 69 to which the impurity imparting one conductivity type is added and the amorphous semiconductor film 58, whereby a microcrystalline semiconductor film 63 to which the impurity imparting one conductivity type is added and a microcrystalline semiconductor layer 62 are formed (see FIG. 1E).

The amorphous semiconductor film 58 over the microcrystalline semiconductor film 57 is crystallized by the laser light 60, and the microcrystalline semiconductor layer 62 including the microcrystalline semiconductor film 57 formed by a deposition method can be formed. The microcrystalline semiconductor film 57 formed by a deposition method can be a nucleus of crystal growth.

The conductive film 65a also functions as a protective film which prevents oxidation, contamination, or the like of the semiconductor films formed thereunder in the irradiation step with the laser light 60. Thus, since deterioration such as oxidation of the semiconductor films during the step can be prevented, reliability is improved. Thus, a display device including a thin film transistor with high reliability can be manufactured.

In addition, since the microcrystalline semiconductor film to which the impurity imparting one conductivity type is added is used as a source region and a drain region, lower resistance of the source region and the drain region can be realized, and electric characteristics of the thin film transistor can be improved.

Furthermore, in the present invention, the conductive film irradiated with the laser light is etched to form a source electrode and a drain electrode. Therefore, a conductive film for a laser irradiation step for forming a microcrystalline semiconductor layer is not formed and removed, and thus the process can be simplified. Thus, yield is increased, and a thin film transistor and a display device including the thin film transistor, can be manufactured with high mass productivity.

For the conductive film 65a irradiated with the laser light, a refractory metal such as tungsten (W), chromium (Cr), tantalum (Ta), tantalum nitride, or molybdenum (Mo), or an alloy or compound containing such a refractory metal as its main component (e.g., nitride of such a metal element) is desirably used.

Light which is emitted to the conductive film is acceptable as long as it can give the conductive film high energy, and laser light can be preferably used.

A wavelength of the light is set to a wavelength that is absorbed by the conductive film. The wavelength can be determined in consideration of the skin depth of the laser light, and the like. In addition, the energy of the light can be determined in consideration of the wavelength and skin depth of the light, the thickness of the conductive film which is to be irradiated with the light, and the like. The material of the conductive film, the wavelength of the light, and the irradiation conditions may be set as appropriate so that the light is absorbed by the conductive film.

A continuous wave laser, a pseudo continuous wave laser, or a pulsed laser can be used as a laser oscillating the laser light. For example, an excimer laser such as a KrF laser, or a gas laser such as an Ar laser or a Kr laser can be used. Alternatively, as a solid-state laser, a YAG laser, a YVO$_4$ laser, a YLF laser, a YAlO$_3$ laser, a GdVO$_4$ laser, a KGW laser, a KYW laser, an alexandrite laser, a Ti:sapphire laser, a Y$_2$O$_3$ laser, or the like can be used. An excimer laser is a pulsed laser, and some solid lasers such as a YAG laser can be used as a continuous laser, a pseudo continuous laser, and a pulsed laser. Note that, as for the solid-state laser oscillator, the fundamental wave or any of the second to fifth harmonics is desirably employed. Alternatively, a semiconductor laser such as a GaN laser, a GaAs laser, a GaAlAs laser, or an InGaAsP laser can be used.

Alternatively, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. A flash annealing using the above-described lamp light may be performed. Flash annealing performed desirably using a halogen lamp, a xenon lamp, or the like requires very short processing time, and thus increase in temperature of a supporting substrate can be suppressed.

A shutter, a reflector such as a mirror or a half mirror, an optical system including a cylindrical lens, a convex lens, or the like may be provided to adjust the shape or path of light.

Note that light may be selectively emitted or light can be emitted while being moved in the X-axis and Y-axis directions. In this case, a polygon mirror or a galvanometer mirror is preferably used for an optical system.

The microcrystalline semiconductor layer 62 belongs to an intermediate metastable state between an amorphous semiconductor and a single crystal semiconductor when Gibbs free energy is considered. That is, the microcrystalline semiconductor layer 62 is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, shifts to the lower wavenumber side than 520 cm$^{-1}$ which represents single crystal silicon. That is, the peak of the Raman spectrum of the microcrystalline silicon exists between 520 cm$^{-1}$ which represents single-crystalline silicon and 480 cm$^{-1}$ which represents amorphous silicon. In addition, the microcrystalline silicon contains hydrogen or halogen of at least 1 atomic % in order to terminate dangling bonds. Moreover, a rare gas element such as helium, argon, krypton, or neon may be contained to further promote lattice distortion, whereby a favorable microcrystalline semiconductor film stability of which is increased can be obtained.

This microcrystalline semiconductor layer can be formed by a high-frequency plasma CVD method with a frequency of several tens of MHz to several hundreds of MHz or with a microwave plasma CVD apparatus with a frequency of greater than or equal to 1 GHz. The microcrystalline semiconductor layer can be formed in such a manner that silicon hydride, typically, $SiH_4$, $Si_2H_6$, $SiH_2Cl_2$, $SiHCl_3$, $SiCl_4$, $SiF_4$, or the like is diluted with hydrogen. Alternatively, the microcrystalline semiconductor film can be formed by dilution with one or plural kinds of rare gas elements selected from helium, argon, krypton, or neon in addition to silicon hydride and hydrogen. In these cases, the flow ratio of hydrogen to silicon hydride is set to greater than or equal to 5 times and less than or equal to 200 times, preferably greater than or equal to 50 times and less than or equal to 150 times, further preferably 100 times.

In addition, the microcrystalline semiconductor layer has low n-type conductivity when an impurity element for controlling valence electrons is not intentionally added thereto. Therefore, an impurity element imparting p-type conductivity may be added to the microcrystalline semiconductor layer which functions as a channel formation region of a thin film transistor at the same time as or after formation of the microcrystalline semiconductor layer, whereby the threshold value can be controlled. A typical example of an impurity element imparting p-type conductivity is boron, and an impurity gas such as $B_2H_6$ or $BF_3$ may be mixed into silicon hydride at a proportion of 1 to 1000 ppm, preferably 1 to 100 ppm. The concentration of boron is desirably set at $1\times10^{14}$ to $6\times10^{16}$ atoms/cm$^3$.

The concentration of oxygen in the microcrystalline semiconductor layer is desirably set at less than or equal to $5\times10^{19}$ atoms/cm$^3$, preferably less than or equal to $1\times10^{19}$ atoms/cm$^3$, and the concentration of each of nitrogen and carbon in the microcrystalline semiconductor layer is desirably set at less than or equal to $1\times10^{18}$ atoms/cm$^3$. The concentrations of oxygen, nitrogen, and carbon mixed into the microcrystalline semiconductor film are reduced, whereby the microcrystalline semiconductor film can be prevented from being an n-type microcrystalline semiconductor film.

In the present invention, the microcrystalline semiconductor layer 62 is formed of the microcrystalline semiconductor film 53 formed by a deposition method and the microcrystalline semiconductor film obtained by microcrystallization of the amorphous semiconductor film 54 in the laser light irradiation step. Therefore, the thickness of the microcrystalline semiconductor layer 62 is almost the same as the total thickness of the microcrystalline semiconductor film 53 which is formed by a deposition method and serves as a nucleus of crystal growth and the amorphous semiconductor film 54. The thickness of the microcrystalline semiconductor layer 62 may be about 25 to 300 nm (preferably, about 30 to 150 nm). The microcrystalline semiconductor film 53 is acceptable as long as it serves as a nucleus of the crystal growth of the amorphous semiconductor film 54, and thus the thickness of the microcrystalline semiconductor film 53 may be thin or very thin. The amorphous semiconductor film 54 is crystallized while being stacked on the microcrystalline semiconductor film 53, and thus a microcrystalline semiconductor layer with a microcrystalline state, which has excellent electric characteristics and high reliability, can be obtained.

Alternatively, the microcrystalline semiconductor layer 62 may be formed to a thickness of greater than 0 nm and less than or equal to 50 nm, preferably greater than 0 nm and less than or equal to 20 nm. The microcrystalline semiconductor layer 62 serves as a channel formation region of a thin film transistor which is to be manufactured later. The thickness of the microcrystalline semiconductor layer 62 is set to the above-described range, whereby the thin film transistor which is to be manufactured later can be a fully depleted transistor.

In addition, since a microcrystalline semiconductor layer includes microcrystals, it has lower resistance than an amorphous semiconductor film. Thus, a thin film transistor using the microcrystalline semiconductor film has steep inclination of a rising portion of a curved line which shows current-voltage characteristics and has excellent response as a switching element, and high-speed operation is possible. Moreover, the microcrystalline semiconductor layer is used for a channel formation region of the thin film transistor, whereby variations in the threshold voltage of the thin film transistor can be suppressed. Accordingly, a display device with few variations of electric characteristics can be manufactured.

Moreover, a microcrystalline semiconductor film has higher mobility than an amorphous semiconductor film. Thus, a thin film transistor in which a channel formation region is formed of a microcrystalline semiconductor film is used for switching a display element, whereby the area of the channel formation region, that is, the area of the thin film transistor can be small. Accordingly, the area of the thin film transistor in one pixel is reduced, and the aperture ratio of the pixel can be increased. As a result, a device with high resolution can be manufactured.

Furthermore, a microcrystalline semiconductor film has a needle-like crystal which grows longitudinally from the lower side. An amorphous structure and a crystalline structure are mixed in the microcrystalline semiconductor film, and a crack is easily generated between a crystal region and an amorphous region due to local stress, and thus a gap is easily formed. A new radical enters the gap and can generate crystal growth. However, since an upper crystal plane becomes larger, the crystal is likely to grow upward into a needle shape. Even when the microcrystalline semiconductor film grows longitudinally as described above, it grows 10 to 100 times slower than the deposition rate of an amorphous semiconductor film.

In the present invention, a microcrystalline semiconductor layer is formed in such a manner that a microcrystalline semiconductor film obtained by crystallization of an amorphous semiconductor film is formed over a microcrystalline semiconductor film formed by a deposition method, and thus even a thick microcrystalline semiconductor layer can be formed without requiring long processing time. Accordingly, time required for a manufacturing process of a thin film transistor having a microcrystalline semiconductor layer can be shortened, and thus productivity is increased.

Figure 2A:
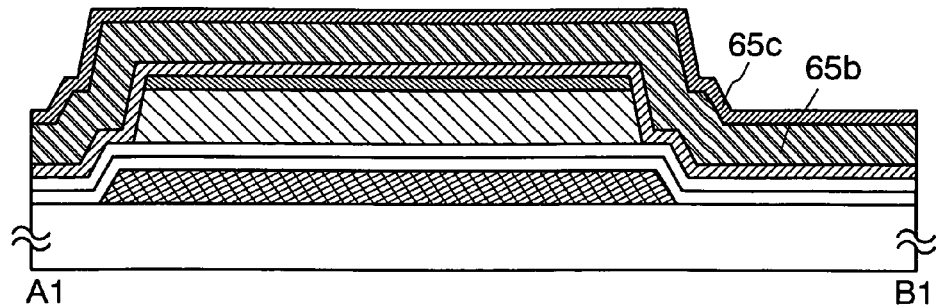
FIGS. 2A to 2D are views illustrating a method for manufacturing a display device of the present invention.

After the conductive film 65a is irradiated with the laser light, a conductive film 65b and a conductive film 65c, like the conductive film 65a, each of which serves as a source electrode or a drain electrode and also functions as a wiring are stacked (see FIG. 2A).

The conductive film is desirably formed as a single layer or a stacked layer of aluminum; copper; or an aluminum alloy to which an element which improves heat resistance or prevents hillocks, such as silicon, titanium, neodymium, scandium, or molybdenum is added. Alternatively, the conductive film may be formed as a stacked layer in such a manner that the conductive film 65a which is in contact with the semiconductor film to which the impurity imparting one conductivity type is added is formed of titanium, tantalum, molybdenum, or tungsten, or nitride of such an element, and aluminum or an aluminum alloy is formed thereon. Further alternatively, a stacked-layer structure may be employed in which an upper surface and a lower surface of aluminum or an aluminum alloy is sandwiched by titanium, tantalum, molybdenum, or tungsten, or nitride of such an element. In this embodiment mode, as the conductive film, a conductive film which has a structure in which three layers of the conductive films 65a to 65c are stacked is described, and a stacked conductive film of the conductive film 65a formed of a molybdenum film, the conductive film 65b formed of an aluminum film, and the conductive film 65c formed of a molybdenum film and a stacked conductive film of the conductive film 65a formed of a titanium film, the conductive film 65b formed of an aluminum film, and the conductive film 65c formed of a titanium film are described. As in this embodiment mode, a high melting point material, such as molybdenum, which is not easily dissolved, is used for the conductive film 65a which is irradiated with the laser light, while a conductive material, such as aluminum, which has low resistance and high conductivity although it is a low melting point material, is used for the conductive film 65b which is not irradiated with the laser light, whereby both higher reliability and higher performance can be realized.

The conductive films 65a to 65c are formed by a sputtering method or a vacuum evaporation method. Alternatively, a CVD method may be used. Further alternatively, the conductive films 65a to 65c may be formed in such a manner that conductive nanopaste of silver, gold, copper, or the like is discharged by a screen printing method, an ink-jet method, or the like and baked.

Next, a mask 66 is formed over the conductive films 65a to 65c. The mask 66 can be formed in a similar manner to the mask 56.

Figure 2B:
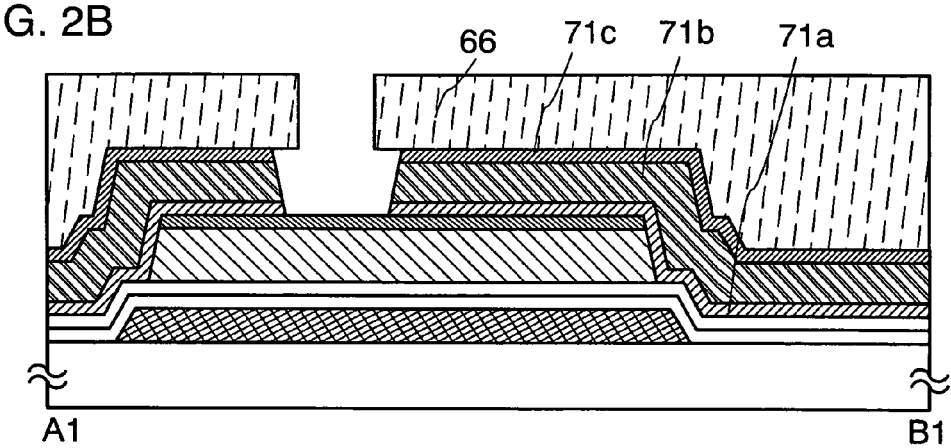

The conductive films 65a to 65c are etched with use of the mask 66 to be separated, whereby source and drain electrodes 71a to 71c are formed (see FIG. 2B). When the conductive films 65a to 65c are etched by wet etching as in this embodiment mode, they are isotropically etched, and thus edges of the source and drain electrodes 71a to 71c do not coincide with edges of the mask 66 and further recede. Next, the microcrystalline semiconductor film 63 to which the impurity imparting one conductivity type is added and the microcrystalline semiconductor layer 62 are etched with use of the mask 66, whereby source and drain regions 72 and a microcrystalline semiconductor layer 73 are formed (see FIG. 2C). Note that only part of the microcrystalline semiconductor layer 73 is etched, so that the microcrystalline semiconductor layer 73 has a groove (a depressed portion).

Part of the microcrystalline semiconductor layer 73 is etched, and a groove is formed between the source and drain electrodes 71a to 71c. Edges of the groove of the microcrystalline semiconductor layer 73 almost coincide with edges of the source and drain regions 72. This groove is formed through the same etching process as that for forming the source and drain regions 72. Therefore, the groove is formed in a self-alignment process in which the groove almost coincides with the opening of the mask 66 which is the same photoresist mask as used for etching the source and drain regions 72.

Figure 4C:
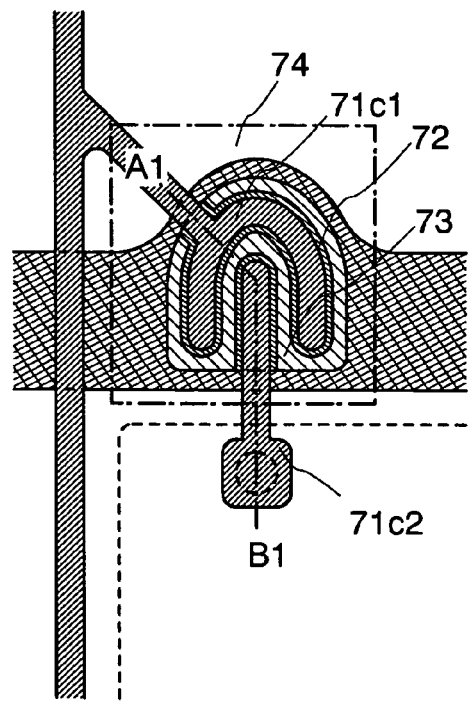
Figure 4D:
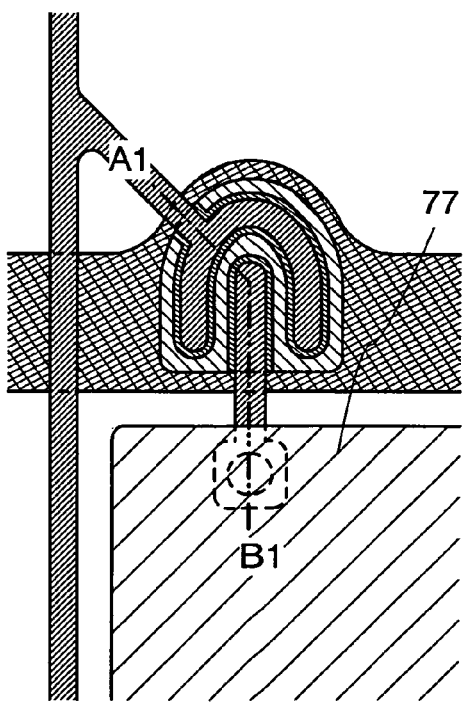

The edges of the source and drain regions 72 do not coincide with the edges of the source and drain electrodes 71a to 71c, and are formed outside the edges of the source and drain electrodes 71a to 71c. After that, the mask 66 is removed. Note that FIG. 2C corresponds to the cross-sectional view taken along the line A1-B1 in FIG. 4C. As shown in FIG. 4C, the edges of the source and drain regions 72 are located outside the edges of the source and drain electrode 71c. In addition, either the source electrode or the drain electrode also serves as a source wiring or a drain wiring.

Figure 2C:
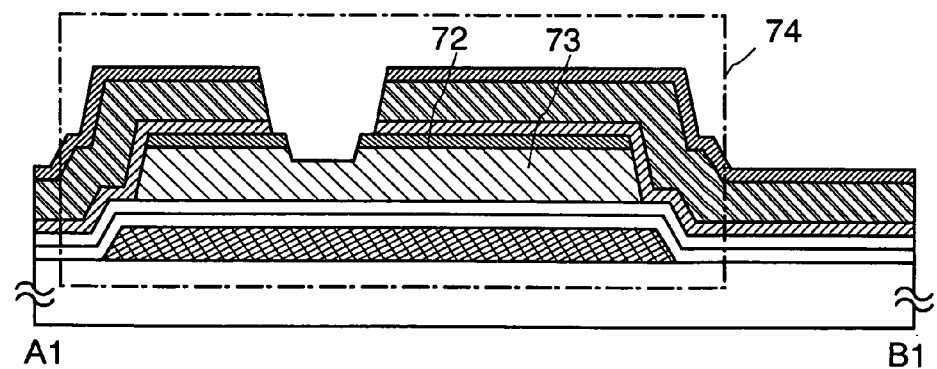

As shown in FIG. 2C, the edges of the source and drain electrodes 71a to 71c do not coincide with the edges of the source and drain regions 72, whereby the edges of the source electrodes 71a to 71c and the edges of the drain electrodes 71a to 71c are away from each other. Thus, leak current or a short circuit between the source electrode and the drain electrode can be prevented. Accordingly, a thin film transistor which has high reliability and high withstand voltage can be manufactured.

Through the above-described steps, a channel-etch type thin film transistor 74 can be manufactured.

Figure 2D:
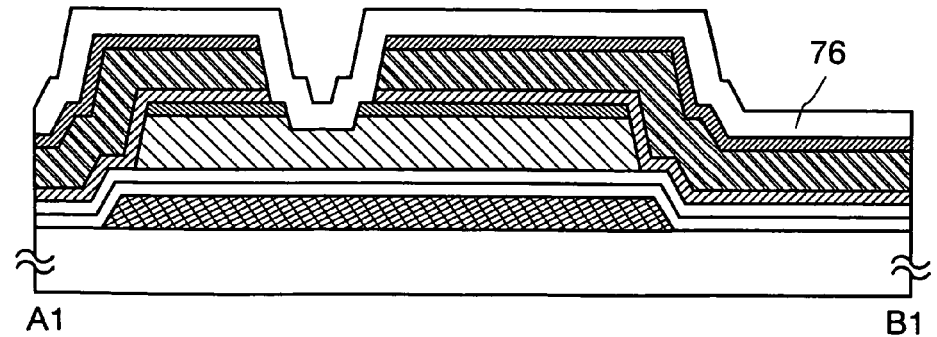

Next, an insulating film 76 is formed over the source and drain electrodes 71a to 71c, the source and drain regions 72, the microcrystalline semiconductor film 61, and the gate insulating film 52b (see FIG. 2D). The insulating film 76 can be formed in a similar manner to the gate insulating films 52a and 52b. Note that the insulating film 76 is provided in order to prevent contamination impurities such as an organic substance, a metal, and moisture contained in air from entering, and is desirably a dense film.

Next, a contact hole is formed in the insulating film 76, and a pixel electrode 77 which is in contact with the source or drain electrode 71c is formed in the contact hole. Note that FIG. 3A corresponds to the cross-sectional view taken along the line A1-B1 in FIG. 4D.

The pixel electrode 77 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, the pixel electrode 77 can be formed using a conductive composition containing a conductive high molecule (the conductive high molecule is also referred to as a conductive polymer). The pixel electrode formed using the conductive composition desirably has a sheet resistance of less than or equal to 10000 Ω/square and a transmittance of greater than or equal to 70% at a wavelength of 550 nm. In addition, the resistance of the conductive high molecule contained in the conductive composition is desirably less than or equal to 0.1Ω·cm.

As a conductive high molecule, a so-called π-electron conjugated conductive polymer can be used. For example, the following can be given: polyaniline or a derivative thereof, polypyrrole or a derivative thereof, polythiophene or a derivative thereof, a copolymer of two or more kinds of them, and the like.

Figure 3A:
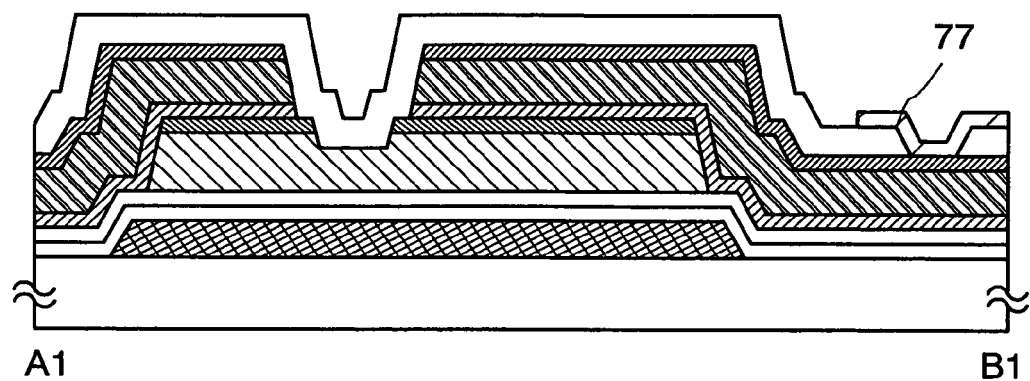
FIGS. 3A and 3B are views illustrating a method for manufacturing a display device of the present invention.
Figure 3B:
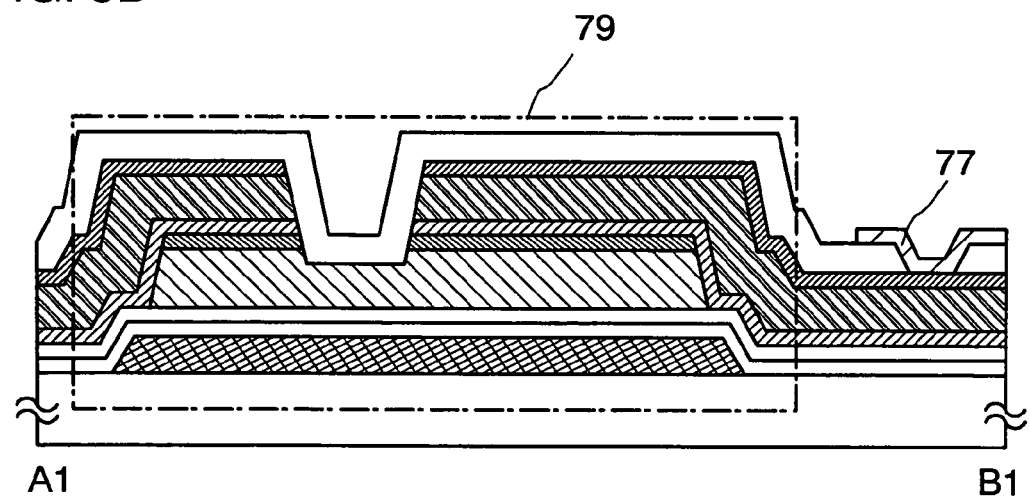

Alternatively, the edges of the source and drain regions 72 may coincide with the edges of the source and drain electrodes 71a to 71c. In FIG. 3B, a thin film transistor 79 in which the edges of the source and drain regions 72 coincide with the edges of the source and drain electrodes 71a to 71c is shown. The source and drain electrodes 71a to 71c and the source and drain regions 72 are etched by dry etching, whereby the form of the thin film transistor 79 can be obtained. Alternatively, the form of the thin film transistor 79 can be obtained in such a manner that the semiconductor film to which the impurity imparting one conductivity type is added is etched with use of the source and drain electrodes 71a to 71c as a mask and the source and drain regions 72 are formed.

The number of manufacturing steps of the channel-etch type thin film transistor is small, and thus the cost can be reduced. In addition, the channel formation region is formed using the microcrystalline semiconductor film, whereby a field effect mobility of 1 to 20 cm$^2$/V·sec can be obtained. Thus, the thin film transistor can be used as a switching element of a pixel in a pixel portion and an element included in a driver circuit on a scan line (gate line) side.

This embodiment mode makes it possible to manufacture a display device including a thin film transistor which has excellent electric characteristics and high reliability, with high mass productivity.

Embodiment Mode 2

In this embodiment mode, an example in which the form of a thin film transistor is different from that in Embodiment Mode 1 will be described. Therefore, other parts can follow Embodiment Mode 1, and the same portions as or the portions having similar functions to in Embodiment Mode 1, and repeated explanations of the steps are omitted.

In this embodiment mode, a thin film transistor used in a display device and a manufacturing process thereof will be described with reference to FIGS. 5A to 5D, FIGS. 6A to 6D, FIGS. 7A to 7C, and FIGS. 8A to 8D. FIGS. 5A to 5D, FIGS. 6A to 6D, and FIGS. 7A to 7C are cross-sectional views illustrating a manufacturing method of a thin film transistor and a pixel electrode. FIGS. 8A to 8D are plane views of a connection region between the thin film transistor and the pixel electrode in one pixel. FIGS. 5A to 5D, FIGS. 6A to 6D, and FIGS. 7A to 7C correspond to cross-sectional views taken along lines A2-B2 in FIGS. 8A to 8D illustrating the thin film transistor and a manufacturing process thereof.

Figure 5A:
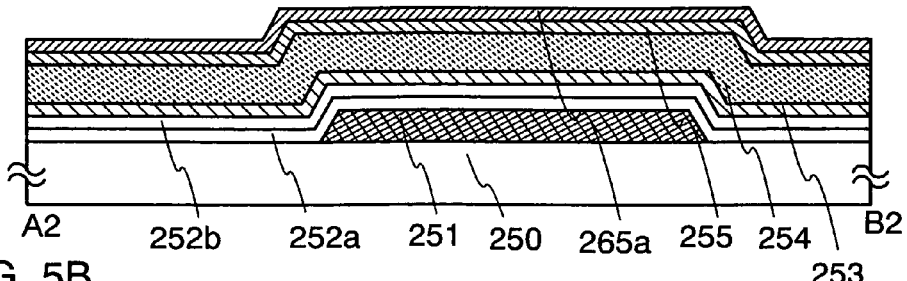
FIGS. 5A to 5D are views illustrating a method for manufacturing a display device of the present invention.

A gate electrode 251 is formed over a substrate 250. Next, over the gate electrode 251, gate insulating films 252a and 252b, a microcrystalline semiconductor film 253, and an amorphous semiconductor film 254, an amorphous semiconductor film 255 to which an impurity imparting one conductivity type is added, and a conductive film 265a are formed in this order (see FIG. 5A and FIG. 8A). FIG. 5A corresponds to the cross-sectional view taken along the line A2-B2 in FIG. 8A.

In this embodiment mode, an example is shown in which, after a laser light irradiation step, an etching step of the microcrystalline semiconductor layer and the microcrystalline semiconductor film to which the impurity imparting one conductivity type is added is performed in the same step as source and drain electrodes. Thus, the microcrystalline semiconductor layer, the microcrystalline semiconductor film to which the impurity imparting one conductivity type is added, and the source and drain electrodes are formed reflecting the same mask shape.

The gate insulating films 252a and 252b, the microcrystalline semiconductor film 253, the amorphous semiconductor film 254, and the amorphous semiconductor film 255 to which the impurity imparting one conductivity type is added may be successively formed without being exposed to air. Furthermore, steps up to formation of the conductive film 265a may be successively performed without exposure to air. The gate insulating films 252a and 252b, the microcrystalline semiconductor film 253, the amorphous semiconductor film 254, the amorphous semiconductor film 255 to which the impurity imparting one conductivity type is added (and the conductive film 265a) are successively formed without being exposed to air, whereby each interface between the stacked layers can be formed without being contaminated by atmospheric components or contamination impurity elements contained in air. Thus, variations in the characteristics of a thin film transistor can be reduced.

Figure 5B:
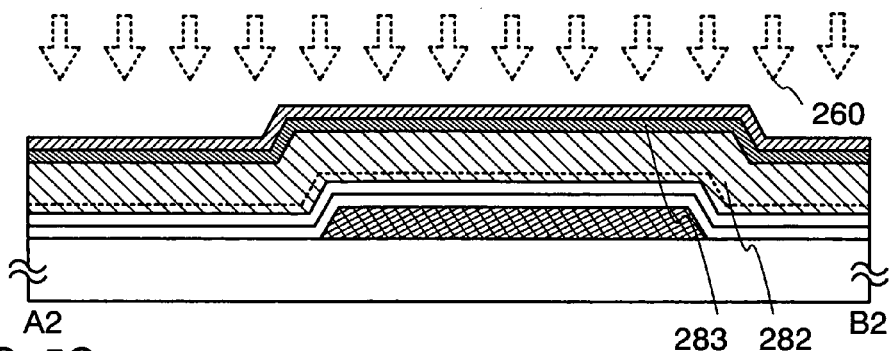

The conductive film 265a is irradiated with laser light 260 to crystallize (microcrystallize) the amorphous semiconductor film 255 to which the impurity imparting one conductivity type is added and the amorphous semiconductor film 254, whereby a microcrystalline semiconductor film 283 to which the impurity imparting one conductivity type is added and a microcrystalline semiconductor layer 282 are formed (see FIG. 5B).

The amorphous semiconductor film 254 over the microcrystalline semiconductor film 253 is crystallized by the laser light 260, and the microcrystalline semiconductor layer 282 including the microcrystalline semiconductor film 253 formed by a deposition method can be formed. The microcrystalline semiconductor film 253 formed by a deposition method can be a nucleus of crystal growth.

The conductive film 265a also functions as a protective film which prevents oxidation, contamination, or the like of the semiconductor films formed thereunder in the irradiation step with the laser light 260. Thus, since deterioration such as oxidation of the semiconductor films during the step can be prevented, reliability is improved. Thus, a display device including a thin film transistor with high reliability can be manufactured.

Furthermore, in the present invention, the conductive film 265a irradiated with the laser light 260 is etched to form a source electrode and a drain electrode. Therefore, a conductive film for a laser irradiation step for forming a microcrystalline semiconductor layer is not formed and removed, and thus the process can be simplified. Thus, yield is increased, and a thin film transistor and a display device including the thin film transistor can be manufactured with high mass productivity.

In this embodiment mode, an example in which exposure using a high-tone mask is performed for forming a mask 256 is shown. A resist is formed in order to form the mask 256. As the resist, a positive type resist or a negative type resist can be used. In this embodiment mode, a positive type resist is used.

Next, the resist is irradiated with light with use of a multi-tone mask 59 as a photomask, so that the resist is exposed to the light.

Here, the exposure using the multi-tone mask 59 will be described with reference to FIGS. 11A to 11D.

A multi-tone mask is a mask which is capable of performing three levels of exposure: fully-exposed, semi-exposed, and non-exposed portions. The multi-tone mask is capable of forming a resist mask with plural thicknesses (typically, two kinds of thicknesses) by one exposure step and one development step. Therefore, the use of the multi-tone mask makes it possible to reduce the number of photomasks.

Figure 11A:
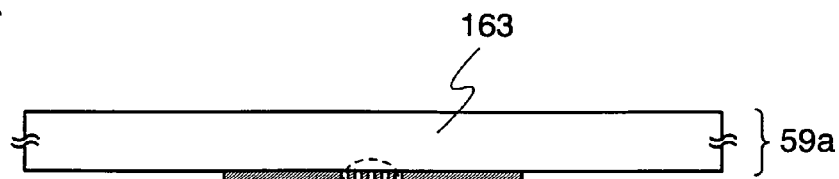
FIGS. 11A to 11D are views illustrating multi grayscale masks which can be applied to the present invention.
Figure 11B:
Figure 11C:
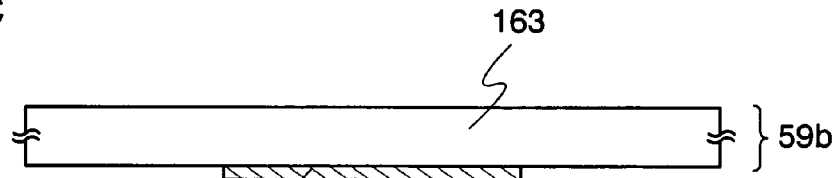

As typical examples of the multi-tone mask, there are a gray-tone mask 59a shown in FIG. 11A and a half-tone mask 59b shown in FIG. 11C.

As shown in FIG. 11A, the gray-tone mask 59a includes a light-transmitting substrate 163, and a light-shielding portion 164 and a diffraction grating 165 formed on the light-transmitting substrate 163. The transmittance of light through the light-shielding portion 164 is 0%. On the other hand, the diffraction grating 165 can control the transmittance of light in such a manner that an interval between light-transmitting portions such as slits, dots, or mesh is set to an interval less than or equal to the resolution limit of light used for exposure. Note that either periodic slits, dots, and mesh, or non-periodic slits, dots, and mesh can be used for the diffraction grating 165.

A light-transmitting substrate such as a quartz substrate can be used as the light-transmitting substrate 163. The light-shielding portion 164 and the diffraction grating 165 can be formed using a light-shielding material which absorbs light, such as chromium or chromium oxide.

When the gray-tone mask 59a is irradiated with exposure light, as shown in FIG. 11B, transmittance 166 of the light through the light-shielding portion 164 is 0%, whereas the transmittance 166 of the light through the portion where the light-shielding portion 164 and the diffraction grating 165 are not provided is 100%. In addition, the transmittance of light through the diffraction grating 165 can be controlled in the range of 10 to 70%. Control of the transmittance of light through the diffraction grating 165 is possible by control of an interval between slits, dots, or mesh of the diffraction grating and pitch thereof.

As shown in FIG. 11C, the half-tone mask 59b includes the light-transmitting substrate 163, and a semi-transmissive portion 167 and a light-shielding portion 168 formed on the light-transmitting substrate 163. MoSiN, MoSi, MoSiO, MoSiON, CrSi, or the like can be used for the semi-transmissive portion 167. The light-shielding portion 168 can be formed using a light-shielding material which absorbs light, such as chromium or chromium oxide.

Figure 11D:
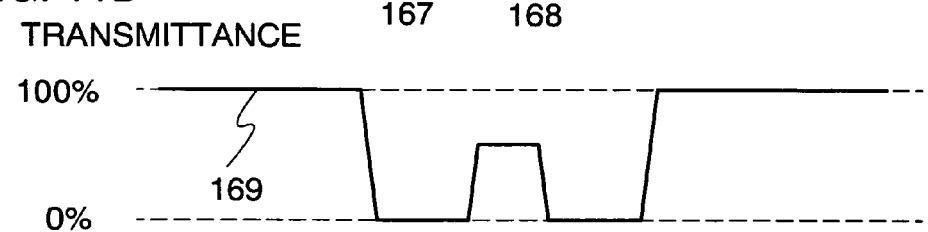

When the half-tone mask 59b is irradiated with exposure light, as shown in FIG. 11D, transmittance 169 of the light through the light-shielding portion 168 is 0%, whereas the transmittance 169 of the light through the portion where the light-shielding portion 168 and the semi-transmissive portion 167 are not provided is 100%. In addition, the transmittance of light through the semi-transmissive portion 167 can be controlled in the range of 10 to 70%. Control of the transmittance of light through the semi-transmissive portion 167 is possible by control of a material of the semi-transmissive portion 167.

Figure 5C:
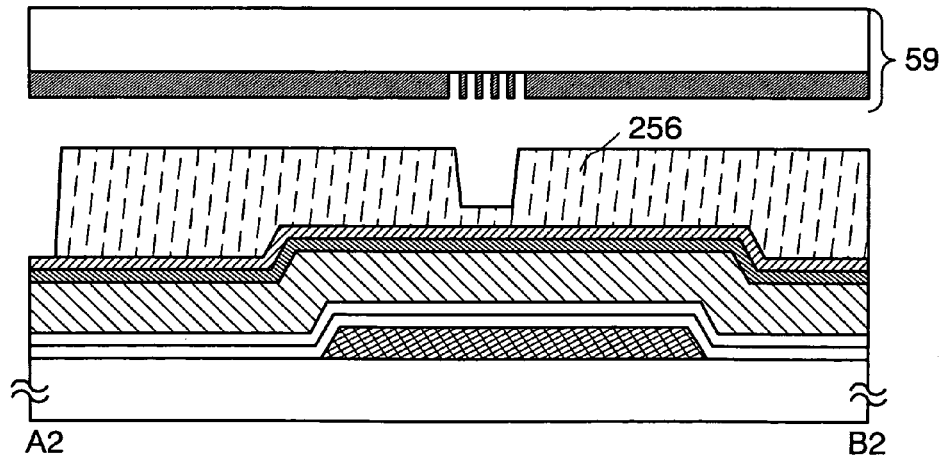
Figure 5D:
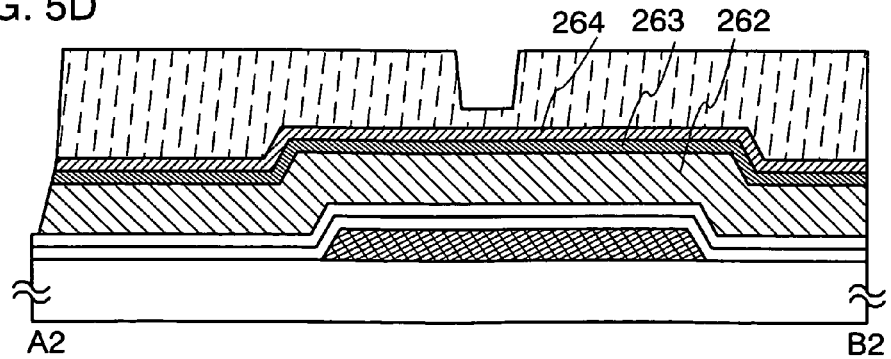

After the exposure using the multi-tone mask 59, development is performed, whereby the mask 256 including regions with different thicknesses can be formed as shown in FIG. 5C.

Next, the microcrystalline semiconductor layer 282, the microcrystalline semiconductor film 283 to which the impurity imparting one conductivity type is added, and the conductive film 265a are etched with use of the mask 256 to be separated. As a result, a microcrystalline semiconductor layer 262, a microcrystalline semiconductor film 263 to which the impurity imparting one conductivity type is added, and a conductive film 264 can be formed (see FIG. 5D).

Next, ashing is performed on the mask 256, and accordingly the area of the mask is reduced and the thickness thereof is reduced. At the time of the ashing, the resist of the mask in a region with a small thickness (a region overlapping with part of the gate electrode 251) is removed, and divided masks 266 can be formed (see FIG. 6A).

The conductive film 264 is etched with use of the mask 266 to form source and drain electrodes 271a. When the conductive film 264 is etched by wet etching as in this embodiment mode, it is isotropically etched, and thus the edges of the source and drain electrodes 271a do not coincide with the edges of the mask 266 and further recede, and the edges of the microcrystalline semiconductor film 263 to which the impurity imparting one conductivity type is added and the microcrystalline semiconductor layer 262 protrude outside the edges of the source and drain electrodes 271a. Next, with use of the masks 266, the microcrystalline semiconductor film 263 to which the impurity imparting one conductivity type is added and the microcrystalline semiconductor layer 262 are etched to form source and drain regions 272 and a microcrystalline semiconductor layer 273 (see FIG. 6B). Note that only part of the microcrystalline semiconductor layer 273 is etched, so that the microcrystalline semiconductor layer 273 has a groove.

The formation of the source and drain regions 272 and the formation of the groove in the microcrystalline semiconductor layer 273 can be performed in the same step, and similarly, part of the edge of the microcrystalline semiconductor layer 273 is etched to be exposed. After that, the masks 266 are removed.

Figure 6A:
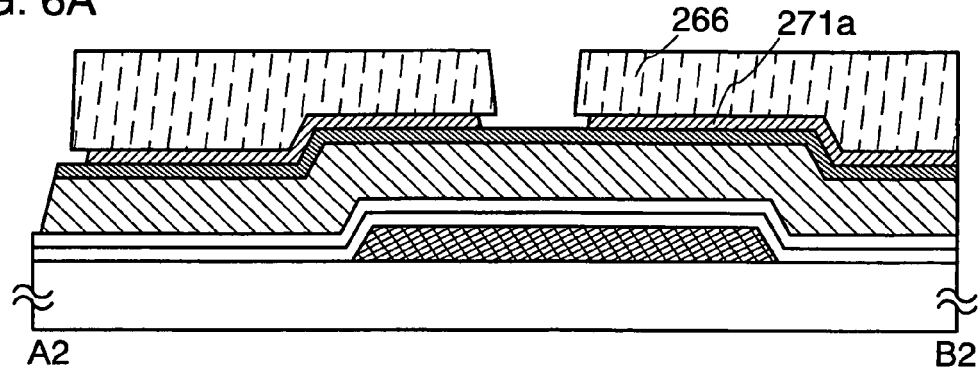
FIGS. 6A to 6D are views illustrating a method for manufacturing a display device of the present invention.
Figure 6B:
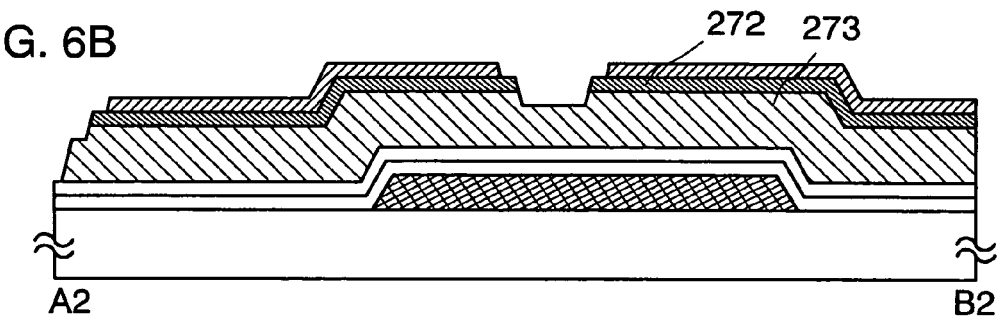
Figure 6C:
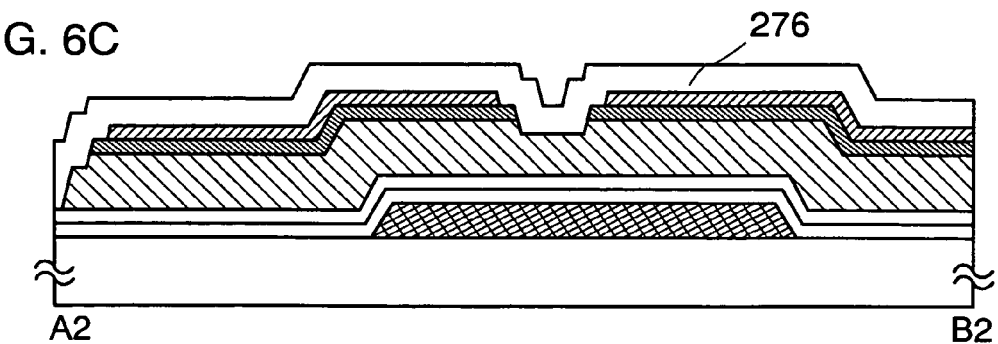

Next, an insulating film 276 is formed over the source and drain electrodes 271a, the source and drain regions 272, the microcrystalline semiconductor layer 273, and the gate insulating film 252b (see FIG. 6C).

Figure 6D:
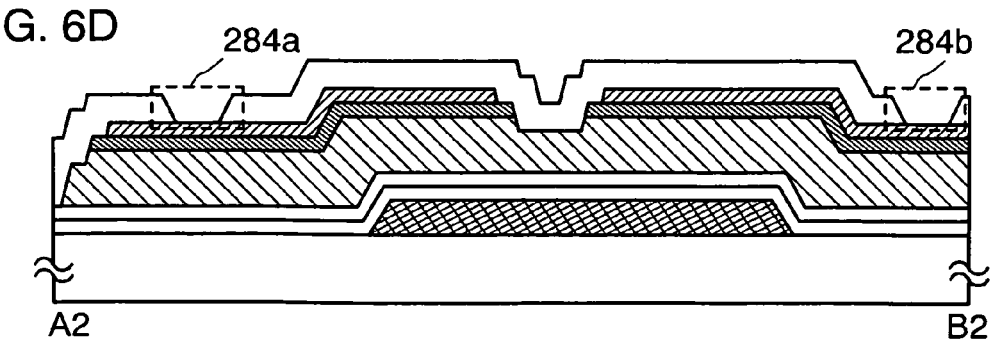
Figure 8A:
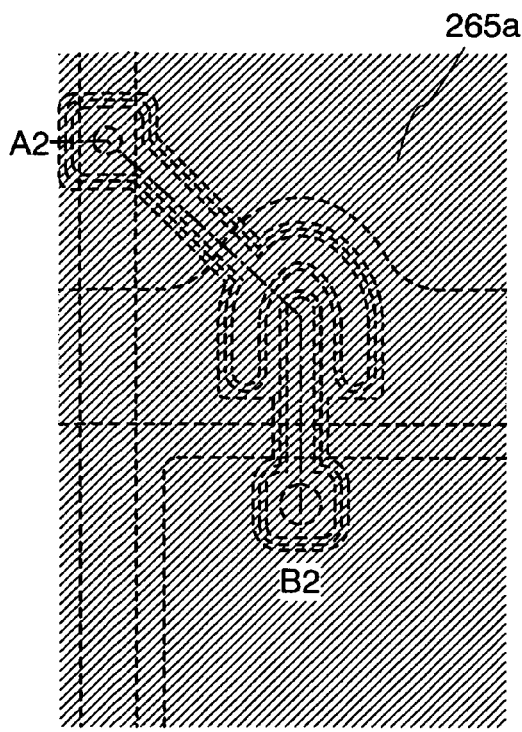
FIGS. 8A to 8D are views illustrating a method for manufacturing a display device of the present invention.
Figure 8B:
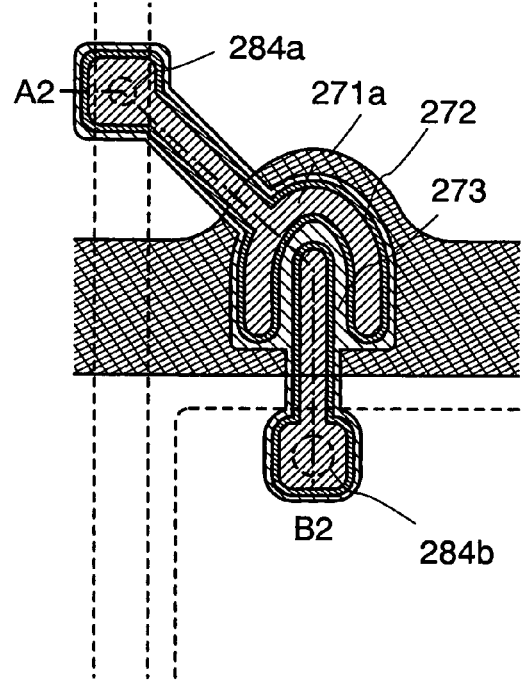

Next, contact holes 284a and 284b are formed in the insulating film 276 (see FIG. 6D and FIG. 8B). Note that FIG. 6D corresponds to the cross-sectional view taken along the line A2-B2 in FIG. 8B.

Figure 7A:
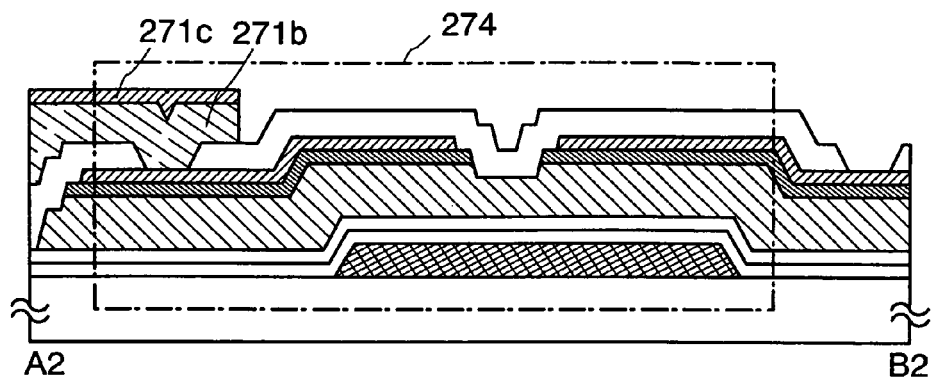
FIGS. 7A to 7C are views illustrating a method for manufacturing a display device of the present invention.
Figure 8C:
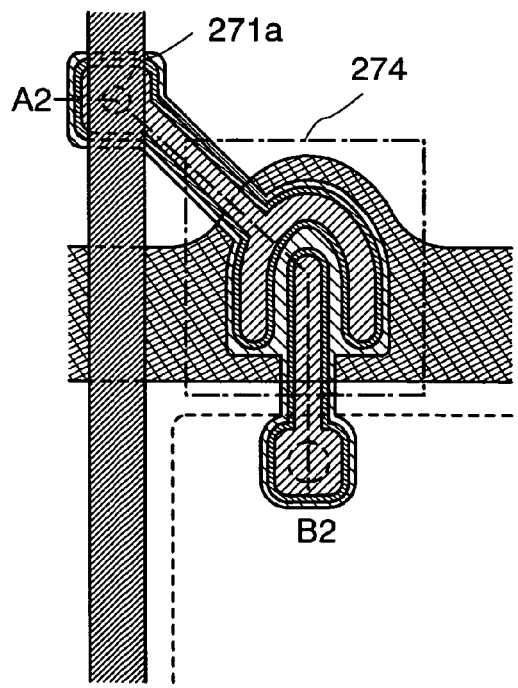

In the contact hole 284a, wirings 271b and 271c which are in contact with the source or drain electrode 271a are formed (see FIG. 7A and FIG. 8C). Note that FIG. 7A corresponds to the cross-sectional view taken along the line A2-B2 in FIG. 8C. The wirings 271b and 271c function as a source wiring. Through the above-described steps, a channel-etch type thin film transistor 274 can be manufactured.

Figure 7B:
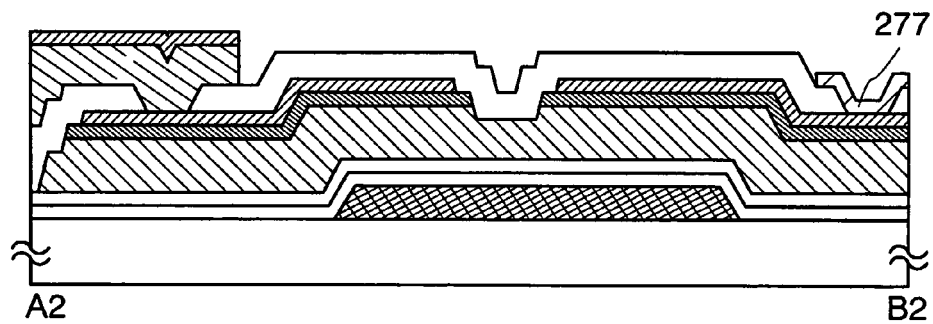
Figure 8D:
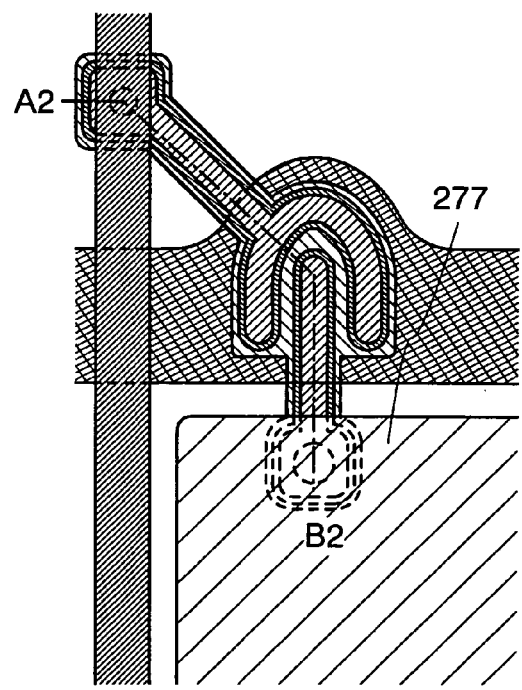

In the contact hole 284b, a pixel electrode 277 which is in contact with the source or drain electrode 271a is formed (see FIG. 7B and FIG. 8D). Note that FIG. 7B corresponds to the cross-sectional view taken along the line A2-B2 in FIG. 8D.

Figure 7C:
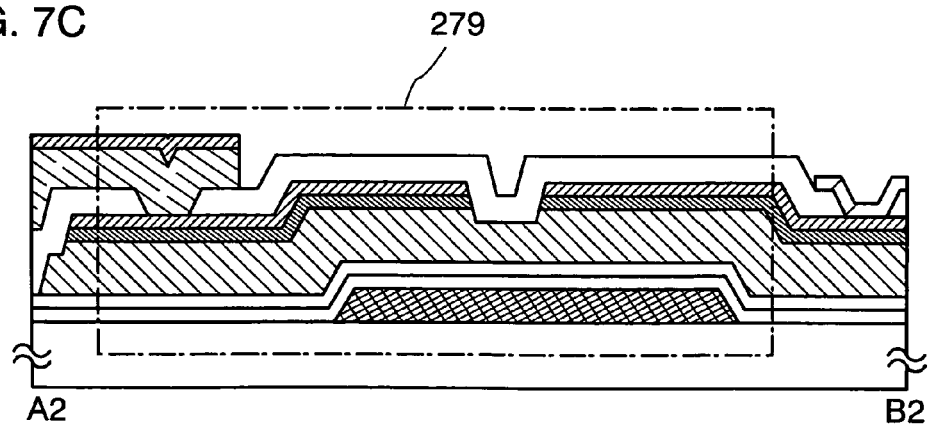

Alternatively, the edges of the source and drain regions 272 and the edges of the source and drain electrodes 271a may coincide with each other. In FIG. 7C, a channel-etch type thin film transistor 279 which has a form in which the edges of the source and drain regions 272 and the edges of the source and drain electrodes 271a coincide with each other is shown. The source and drain electrodes 271a and the source and drain regions 272 are etched by dry etching, whereby the form of the thin film transistor 279 can be obtained. Alternatively, the form of the thin film transistor 279 can be obtained in such a manner that the semiconductor film to which the impurity imparting one conductivity type is added is etched with use of the source and drain electrodes 271a as a mask and the source and drain regions 272 are formed.

The number of manufacturing steps of the channel-etch type thin film transistor is small and the cost can be reduced. In addition, the channel formation region using the microcrystalline semiconductor film is formed, whereby a field effect mobility of 1 to 20 $cm^2/V \cdot sec$ can be obtained. Thus, the thin film transistor can be used as a switching element of a pixel in a pixel portion and an element included in a driver circuit on a scan line (gate line) side.

This embodiment mode makes it possible to manufacture a display device including a thin film transistor which has excellent electric characteristics and high reliability, with high mass productivity.

Embodiment Mode 3

In this embodiment mode, an example in which the form of a thin film transistor is different from that in Embodiment Mode 1 is described. Therefore, other parts can follow Embodiment Mode 1, and the same portions as or the portions having similar functions to in Embodiment Mode 1, and repeated explanations of the steps are omitted.

In this embodiment mode, a thin film transistor used in a display device and a manufacturing process thereof will be described with reference to FIGS. 26A to 26D, FIGS. 27A to 27D, FIGS. 28A and 28B, and FIGS. 29A to 29C. FIGS. 26A to 26D, FIGS. 27A to 27D, and FIGS. 28A and 28B are cross-sectional views illustrating a manufacturing method of a thin film transistor and a pixel electrode. FIGS. 29A to 29C are plane views of a connection region between the thin film transistor and the pixel electrode in one pixel. FIGS. 26A to 26D, FIGS. 27A to 27D, and FIGS. 28A and 28B correspond to cross-sectional views taken along lines A3-B3 in FIGS. 29A to 29C illustrating the thin film transistor and a manufacturing process thereof.

Figure 26A:
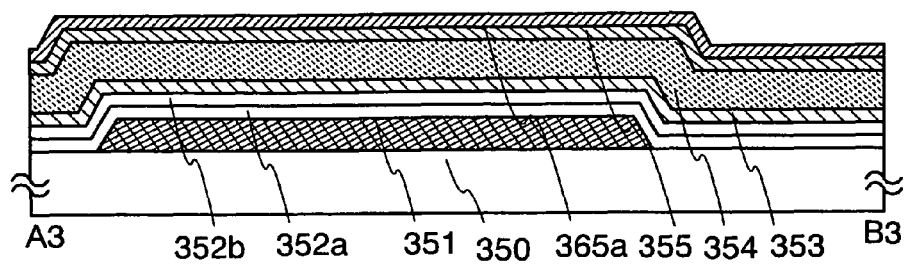
FIGS. 26A to 26D are views illustrating a method for manufacturing a display device of the present invention.

A gate electrode 351 is formed over a substrate 350. Next, over the gate electrode 351, gate insulating films 352a and 352b, a microcrystalline semiconductor film 353, and an amorphous semiconductor film 354, an amorphous semiconductor film 355 to which an impurity imparting one conductivity type is added, and a conductive film 365a are formed in this order (see FIG. 26A and FIG. 29A). FIG. 26A corresponds to the cross-sectional view taken along the line A3-B3 in FIG. 29A.

In this embodiment mode, an example is shown in which, after a laser light irradiation step, an etching step of the microcrystalline semiconductor layer and the microcrystalline semiconductor film to which the impurity imparting one conductivity type is added is performed in the same step as source and drain electrodes. Thus, the microcrystalline semiconductor layer, the microcrystalline semiconductor film to which the impurity imparting one conductivity type is added, and the source and drain electrodes are formed reflecting the same mask shape.

The gate insulating films 352a and 352b, the microcrystalline semiconductor film 353, the amorphous semiconductor film 354, and the amorphous semiconductor film 355 to which the impurity imparting one conductivity type is added may be successively formed without being exposed to air. Furthermore, steps up to formation of the conductive film 365a may be successively performed without exposure to air. The gate insulating films 352a and 352b, the microcrystalline semiconductor film 353, the amorphous semiconductor film 354, the amorphous semiconductor film 355 to which the impurity imparting one conductivity type is added (and the conductive film 365a) are successively formed without being exposed to air, whereby each interface between the stacked layers can be formed without being contaminated by atmospheric components or contamination impurity elements contained in air. Thus, variations in the characteristics of a thin film transistor can be reduced.

Figure 26B:
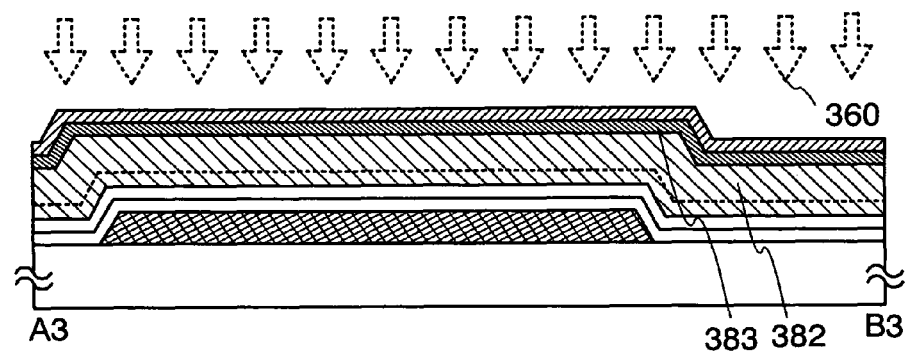

The conductive film 365a is irradiated with laser light 360 to crystallize (microcrystallize) the amorphous semiconductor film 355 to which the impurity imparting one conductivity type is added and the amorphous semiconductor film 354, whereby a microcrystalline semiconductor film 383 to which the impurity imparting one conductivity type is added and a microcrystalline semiconductor layer 382 are formed (see FIG. 26B).

The amorphous semiconductor film 354 over the microcrystalline semiconductor film 353 is crystallized by the laser light 360, and the microcrystalline semiconductor layer 382 including the microcrystalline semiconductor film 353 formed by a deposition method can be formed. The microcrystalline semiconductor film 353 formed by a deposition method can be a nucleus of crystal growth.

The conductive film 365a also functions as a protective film which prevents oxidation, contamination, or the like of the semiconductor films formed thereunder in the irradiation step with the laser light 360. Thus, since deterioration such as oxidation of the semiconductor films during the step can be prevented, reliability is improved. Thus, a display device including a thin film transistor with high reliability can be manufactured.

Furthermore, in the present invention, the conductive film irradiated with the laser light is etched to form a source electrode and a drain electrode. Therefore, a conductive film for a laser irradiation step for forming the microcrystalline semiconductor layer is not formed and removed, and thus the process can be simplified. Thus, yield is increased, and a thin film transistor and a display device including the thin film transistor can be manufactured with high mass productivity.

Figure 26C:
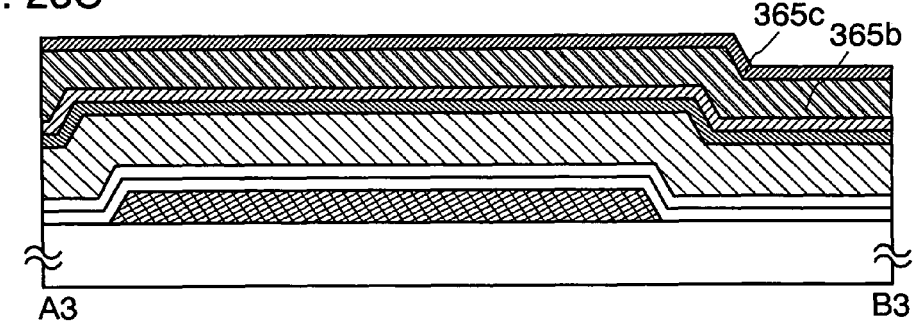
Figure 26D:
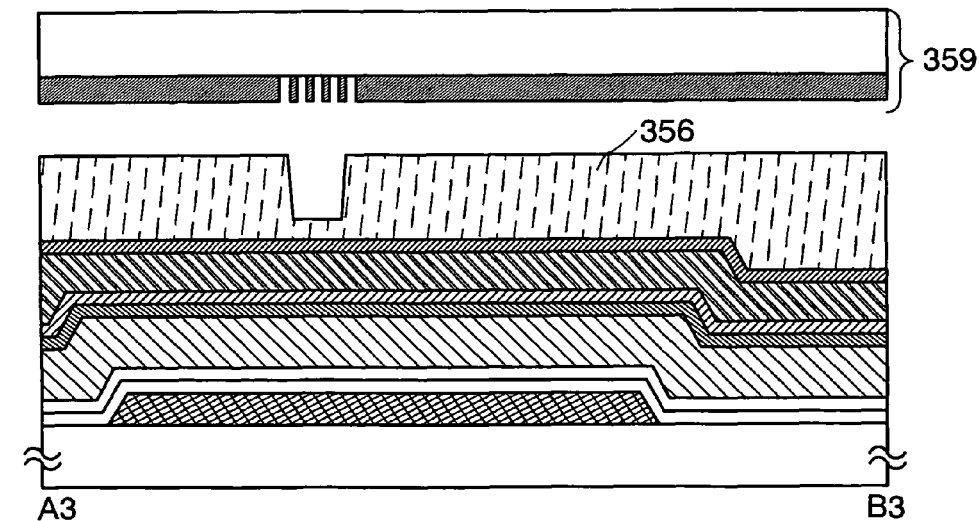

Conductive films 365b and 365c are stacked over the conductive film 365a (see FIG. 26C).

In this embodiment mode, an example in which exposure using a high-tone mask is performed in order to form a mask 356 is shown. A resist is formed for forming the mask 356. As the resist, a positive type resist or a negative type resist can be used. In this embodiment mode, a positive type resist is used.

Next, the resist is irradiated with light with use of a multi-tone mask 359 as a photomask, so that the resist is exposed to the light.

After the exposure using the multi-tone mask 359, development is performed, whereby the mask 356 including regions with different thicknesses can be formed as shown in FIG. 26C.

Next, the microcrystalline semiconductor layer 382, the microcrystalline semiconductor film 383 to which the impurity imparting one conductivity type is added, and the conductive films 365a to 365c are etched with use of the mask 356 to be separated. As a result, a microcrystalline semiconductor layer 362, a microcrystalline semiconductor film 363 to which the impurity imparting one conductivity type is added, and conductive films 364a to 364c can be formed (see FIG. 27D).

Next, ashing is performed on the mask 356, and accordingly the area of the mask 356 is reduced and the thickness thereof is reduced. At the time of the ashing, the resist of the mask in a region with a small thickness (a region overlapping with part of the gate electrode 351) is removed, and divided masks 366 can be formed (see FIG. 27B).

The conductive films 364a to 364c are etched with use of the mask 366 to form source and drain electrodes 371a to 371c. When the conductive films 364a to 364c are etched by wet etching as in this embodiment mode, they are isotropically etched, and thus the edges of the source and drain electrodes 371a to 371c do not coincide with the edge of the mask 366 and further recede, and the edges of the microcrystalline semiconductor film 363 to which the impurity imparting one conductivity type is added and the microcrystalline semiconductor layer 362 protrude outside the edges of the source and drain electrodes 371a to 371c. Next, with use of the masks 366, the microcrystalline semiconductor film 363 to which the impurity imparting one conductivity type is added and the microcrystalline semiconductor layer 362 are etched to form source and drain regions 372 and a microcrystalline semiconductor layer 373 (see FIG. 27C). Note that only part of the microcrystalline semiconductor layer 373 is etched, so that the microcrystalline semiconductor layer 373 has a groove.

The formation of the source and drain regions 372 and the formation of the groove in the microcrystalline semiconductor layer 373 can be performed in the same step, and similarly, part of the edge of the microcrystalline semiconductor layer 373 is etched to be exposed. After that, the masks 366 are removed.

Figure 27A:
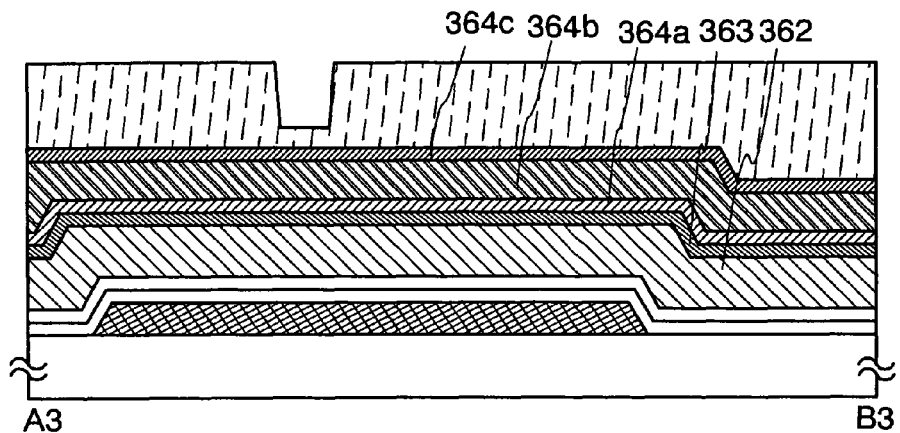
FIGS. 27A to 27D are views illustrating a method for manufacturing a display device of the present invention.
Figure 27B:
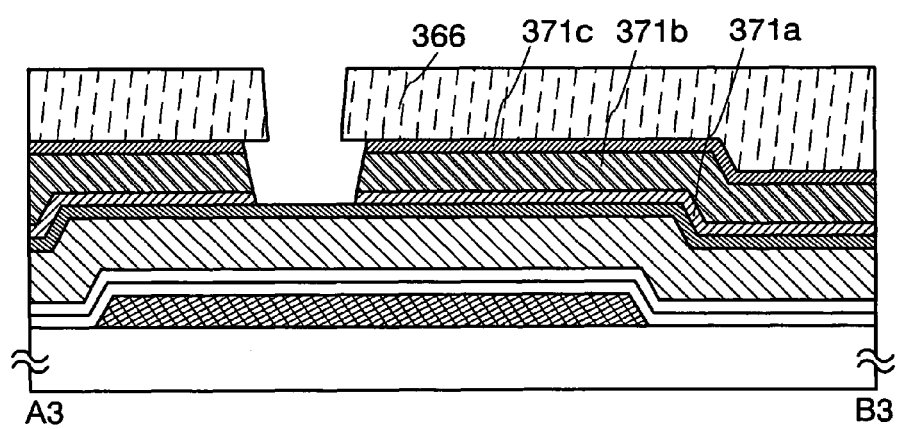
Figure 27C:
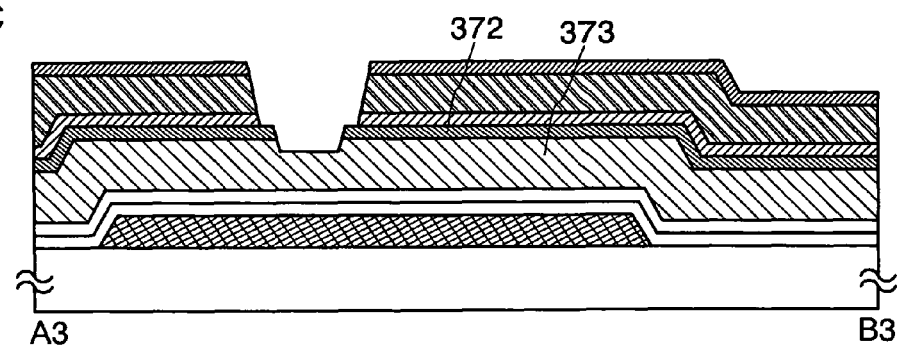
Figure 27D:
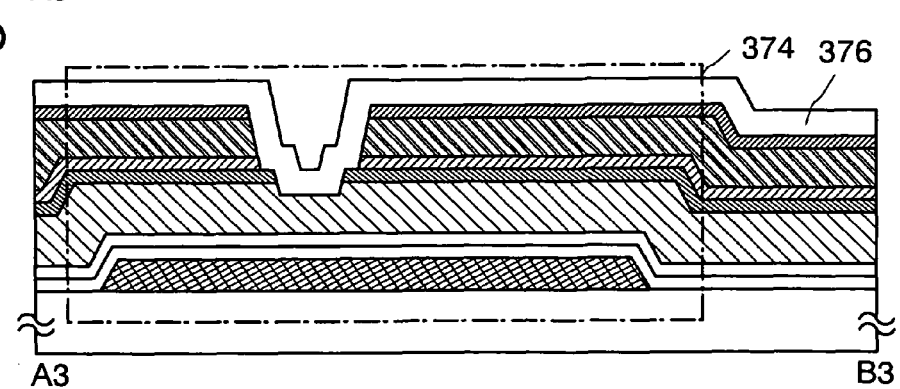

Next, an insulating film 376 is formed over the source and drain electrodes 371a, the source and drain regions 372, the microcrystalline semiconductor layer 373, and the gate insulating film 352b (see FIG. 27D and FIG. 29B). Note that FIG. 27D corresponds to the cross-sectional view taken along the line A3-B3 in FIG. 29B. Through the above-described steps, a channel-etch type thin film transistor 374 can be manufactured.

Figure 28A:
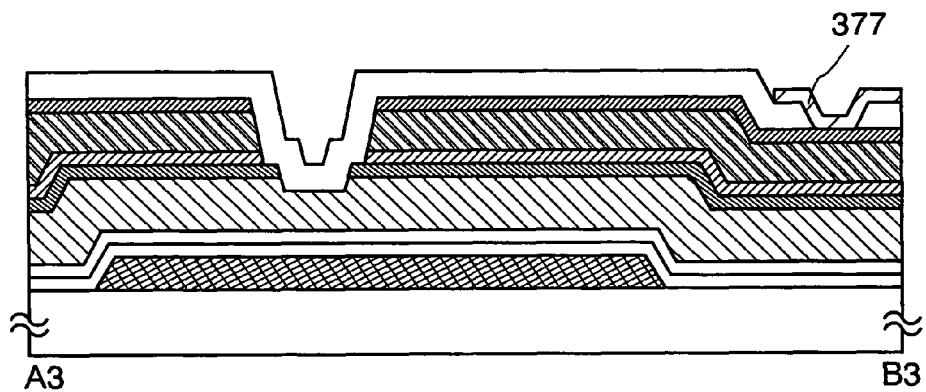
FIGS. 28A and 28B are views illustrating a method for manufacturing a display device of the present invention.
Figure 29A:
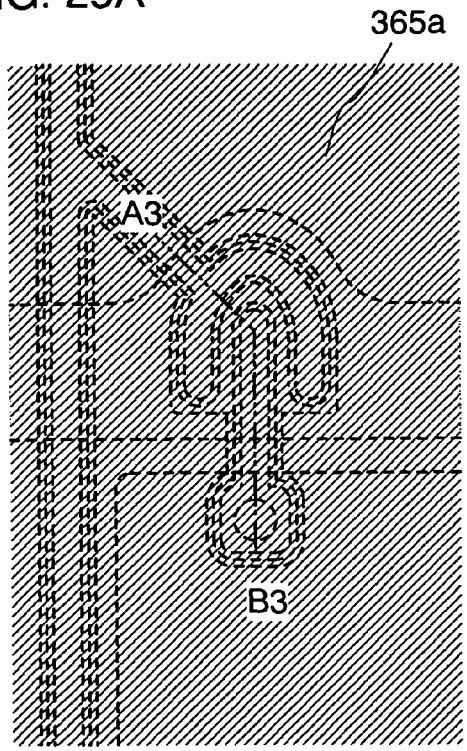
FIGS. 29A to 29C are views illustrating a method for manufacturing a display device of the present invention.
Figure 29B:
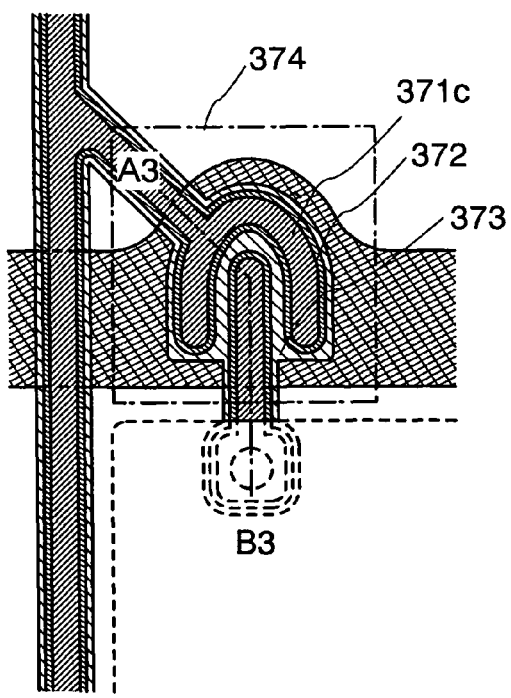
Figure 29C:
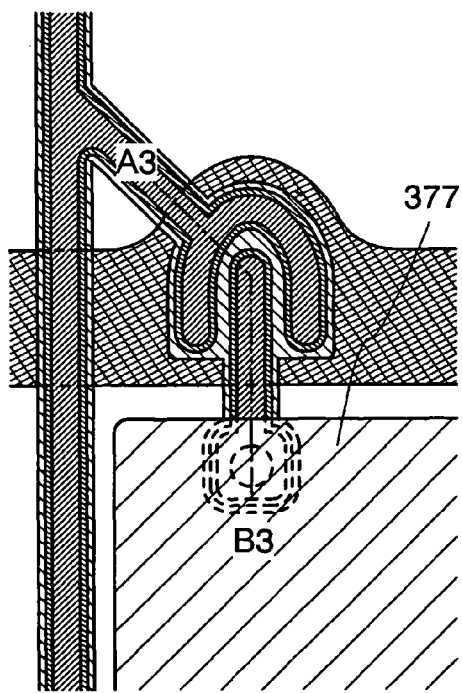

Next, a contact hole is formed in the insulating film 376, and a pixel electrode 377 which is in contact with the source or drain electrode 371c is formed in the contact hole (see FIG. 28A and FIG. 29C). Note that FIG. 28A corresponds to the cross-sectional view taken along the line A3-B3 in FIG. 29C.

Figure 28B:
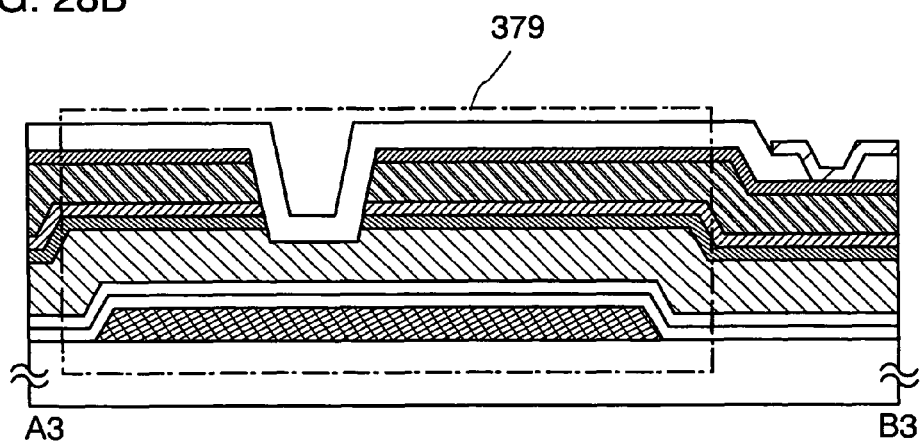

Alternatively, the edges of the source and drain regions 372 and the edges of the source and drain electrodes 371a to 371c may coincide with each other. In FIG. 28B, a channel-etch type thin film transistor 379 which has a form in which the edges of the source and drain regions 372 and the edges of the source and drain electrodes 371a to 371c coincide with each other is shown. The source and drain electrodes 371a to 371c and the source and drain regions 372 are etched by dry etching, whereby the form of the thin film transistor 379 can be obtained. Alternatively, the form of the thin film transistor 379 can be obtained in such a manner that the semiconductor film to which the impurity imparting one conductivity type is added is etched with use of the source and drain electrodes 371a to 371c as a mask and the source and drain regions 372 are formed.

The number of manufacturing steps of the channel-etch type thin film transistor is small and the cost can be reduced. In addition, the channel formation region using the microcrystalline semiconductor film is formed, whereby a field effect mobility of 1 to 20 $cm^2/V \cdot sec$ can be obtained. Thus, the thin film transistor can be used as a switching element of a pixel in a pixel portion and an element included in a driver circuit on a scan line (gate line) side.

This embodiment mode makes it possible to manufacture a display device including a thin film transistor which has excellent electric characteristics and high reliability, with high mass productivity.

Embodiment Mode 4

In this embodiment mode, an example in which the form of a gate insulating film of a thin film transistor is different from that in Embodiment Mode 1 will be described. Therefore, other parts can follow Embodiment Mode 1, and the same portions as or the portions having similar functions to in Embodiment Mode 1, and repeated explanations of the steps are omitted.

In this embodiment mode, an example in which a gate insulating film has a three-layer structure will be described.

Figure 36A:
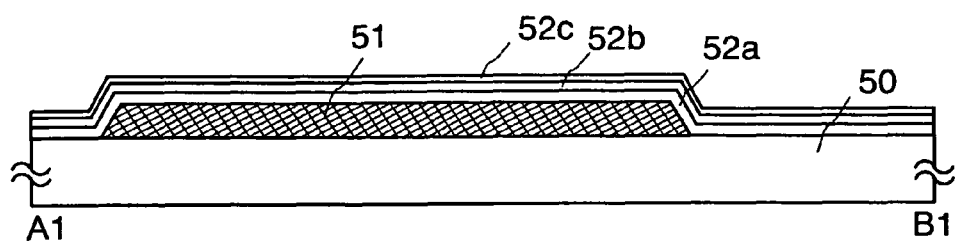
FIGS. 36A and 36B are views illustrating a display device of the present invention.

A gate electrode 51 is formed over a substrate 50, and gate insulating films 52a, 52b, and 52c are stacked over the gate electrode 51 (see FIG. 36A).

Each of the gate insulating films 52a, 52b, and 52c can be formed of a silicon oxide film, a silicon nitride film, a silicon oxynitride film, or a silicon nitride oxide film by a CVD method, a sputtering method, or the like. As described in this embodiment mode, two-layered gate insulating films are not formed but three-layered gate insulating films can be formed in which a silicon nitride film or a silicon nitride oxide film, a silicon oxide film or a silicon oxynitride film, and a silicon nitride film or a silicon nitride oxide film are stacked in this order from the substrate side. Furthermore, the gate insulating film is desirably formed with a microwave plasma CVD apparatus with a frequency of 1 GHz. A silicon oxynitride film and a silicon nitride oxide film formed with a microwave plasma CVD apparatus has high withstand voltage, and thus reliability of a thin film transistor which is to be manufactured later can be increased.

In this embodiment mode, as an example of a three-layer structure of the gate insulating film, a silicon nitride film or a silicon nitride oxide film as the gate insulating film 52a; a silicon oxynitride film as the gate insulating film 52b, and a silicon nitride film as the gate insulating film 52c are stacked over the gate electrode 51, and a microcrystalline semiconductor film is formed over the silicon nitride film which is the uppermost layer. In this case, the thickness of the silicon nitride film or the silicon nitride oxide film which is the gate insulating film 52a is desirably greater than 50 nm, and it achieves an effect of serving as a barrier for blocking impurities such as sodium and effects of preventing a hillock of the gate electrode and preventing oxidation of the gate electrode. The silicon nitride film which is the gate insulating film 52c achieves effects of improving the adhesiveness of the microcrystalline semiconductor film and preventing oxidation thereof.

A very thin nitride film like a silicon nitride film is formed as the gate insulating film 52c which is the surface of the gate insulating film as described above, whereby the adhesiveness of the microcrystalline semiconductor film can be improved. The nitride film may be formed by a plasma CVD method or through nitridation treatment by high-density low-temperature plasma treatment by a microwave. Alternatively, a silicon nitride film or a silicon nitride oxide film may be formed when silane flushing treatment is performed on a reaction chamber.

Figure 36B:
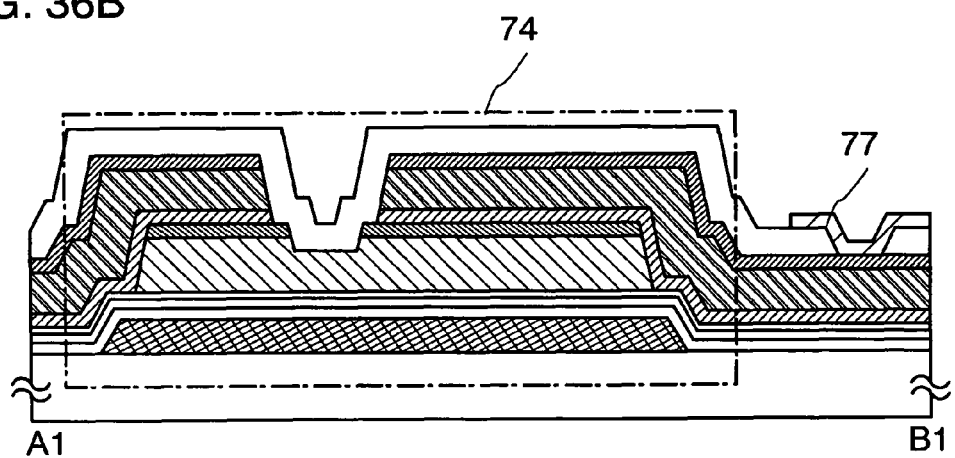

The subsequent steps may be performed in a similar manner to Embodiment Mode 1. As shown in FIG. 36B, a display device including a pixel electrode 77 and a thin film transistor 74 having the three-layered gate insulating film can be manufactured.

The number of manufacturing steps of the channel-etch type thin film transistor is small, and thus the cost can be reduced. In addition, the channel formation region is formed using the microcrystalline semiconductor film, whereby a field effect mobility of 1 to 20 $cm^2/V \cdot sec$ can be obtained. Thus, the thin film transistor can be used as a switching element of a pixel in a pixel portion and an element included in a driver circuit on a scan line (gate line) side.

This embodiment mode makes it possible to manufacture a display device including a thin film transistor which has excellent electric characteristics and high reliability, with high mass productivity.

This embodiment mode can be implemented in combination with any of the structures described in other embodiment modes as appropriate.

Embodiment Mode 5

In this embodiment mode, an example of a manufacturing process of a display device in Embodiment Modes 1 to 4 will be described in detail. Therefore, the same portions as or the portions having similar functions to in Embodiment Modes 1 to 4, and repeated explanations of the steps are omitted.

In Embodiment Modes 1 to 4, before the formation of the microcrystalline semiconductor film, cleaning and flushing (washing) treatment (hydrogen flushing with use of hydrogen as a flushing substance, silane flushing with use of silane as a flushing substance, or the like) may be performed on a reaction chamber. The flushing treatment makes it possible to prevent a film which is to be formed from being contaminated by impurities such as oxygen, nitrogen, and fluorine in the reaction chamber.

The flushing treatment makes it possible to remove impurities such as oxygen, nitrogen, and fluorine in the reaction chamber. For example, the flushing treatment is performed as follows: with use of a plasma CVD apparatus, monosilane used as a flushing substance is continuously introduced into the chamber at a gas flow rate of 8 to 10 SLM for 5 to 20 minutes, preferably, 10 to 15 minutes. Note that 1 SLM corresponds to 1000 sccm, that is, 0.06 m$^3$/h.

For example, cleaning can be performed with use of fluorine radicals. Note that the inside of the reaction chamber can be cleaned by introduction of fluorine radicals into the reaction chamber, which are generated by introduction of carbon fluoride, nitrogen fluoride, or fluorine into a plasma generator provided outside of the reaction chamber and by dissociation thereof.

The flushing treatment may be performed before the formation of a gate insulating film, an amorphous semiconductor film, and a semiconductor film to which an impurity imparting one conductivity type is added. Note that the flushing treatment is effective when it is performed after cleaning.

Before a substrate is carried in a reaction chamber for deposition, coating may be performed in which a protective film is formed of a film used for a film formed on the inner wall of each reaction chamber (the coating is also referred to as pre-coating treatment). The pre-coating treatment is treatment in which plasma treatment is performed by flowing of a deposition gas in a reaction chamber to coat the inner wall of the reaction chamber with a thin protective film in advance. For example, before a microcrystalline silicon film is formed as a microcrystalline semiconductor film, pre-coating treatment may be performed in which the inner wall of the reaction chamber is thinly coated with an amorphous silicon film with a thickness of 0.2 to 0.4 µm. Flushing treatment may be performed after pre-coating treatment (hydrogen flushing, silane flushing, or the like). In the case of performing cleaning and pre-coating treatment, it is necessary that a substrate be carried out from a reaction chamber. However, in the case of performing flushing treatment (hydrogen flushing, silane flushing, or the like), a substrate may be in a reaction chamber because plasma treatment is not performed.

A protective film formed of an amorphous silicon film is formed on the inner wall of the reaction chamber in which a microcrystalline silicon film is formed, and hydrogen plasma treatment is performed before deposition. In this case, the protective film is etched and an extremely small amount of silicon is deposited on a substrate. The silicon can be a nucleus of crystal growth.

The pre-coating treatment makes it possible to prevent a film which is to be formed from being contaminated by impurities such as oxygen, nitrogen, and fluorine in a reaction chamber.

The pre-coating treatment may also be performed before formation of a gate insulating film and a semiconductor film to which an impurity imparting one conductivity type is added.

Furthermore, an example of a formation method of the gate insulating film, the microcrystalline semiconductor film, the amorphous semiconductor film, and the semiconductor film to which the impurity imparting one conductivity type is added will be described in detail.

Figure 10A:
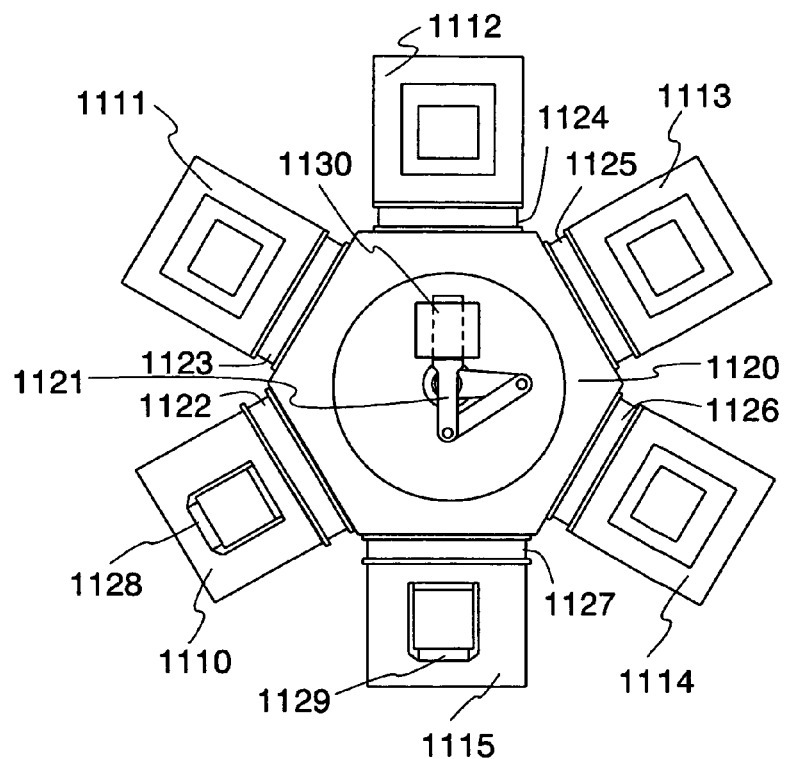
FIGS. 10A and 10B are plane views each illustrating a plasma CVD apparatus which can be applied to the present invention.
Figure 10B:
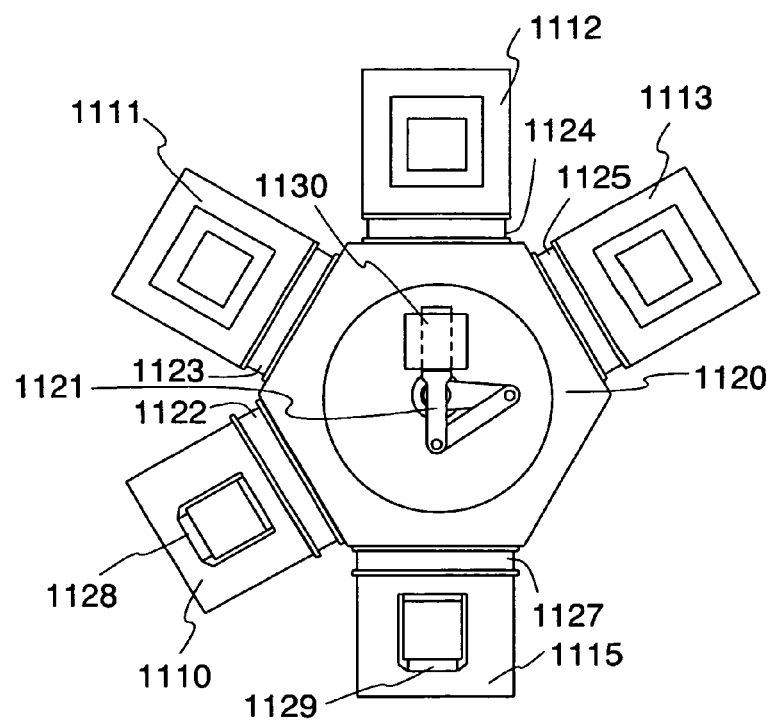

An example of a plasma CVD apparatus which can be applied to the present invention will be described with reference to FIGS. 10A and 10B. FIGS. 10A and 10B each show a microwave plasma CVD apparatus which is capable of forming films successively. FIGS. 10A and 10B each are a schematic view of a plane surface of the microwave plasma CVD apparatus, in which a load chamber 1110, an unload chamber 1115, and reaction chambers (1) to (4) 1111 to 1114 are provided around a common chamber 1120. Each of gate valves 1122 to 1127 is provided between the common chamber 1120 and each chamber so that treatment performed in chambers does not interfere with each other. Note that the number of reaction chambers is not limited to four but may be smaller or larger than four. When the number of reaction chambers is large, the reaction chambers can be allocated according to kinds of films to be stacked; thus the number of cleaning of the reaction chambers can be reduced. FIG. 10A shows an example in which four reaction chambers are provided, while FIG. 10B shows an example in which three reaction chambers are provided.

An example will be described in which a gate insulating film, a microcrystalline semiconductor film, an amorphous semiconductor film, and a semiconductor film to which an impurity imparting one conductivity type is added are formed with use of the plasma CVD apparatuses shown in FIGS. 10A and 10B. A substrate is loaded to cassettes 1128 and 1129 which are provided in the load chamber 1110 and the unload chamber 1115, respectively, and transferred to the reaction chambers (1) to (4) 1111 to 1114 by a transfer unit 1121 in the common chamber 1120. In this apparatus, a reaction chamber can be provided for each film to be deposited, and a plurality of different kinds of films can be formed successively without being exposed to air. In addition, the reaction chamber may be used as a reaction chamber for an etching step or a laser irradiation step in addition to a deposition step. When reaction chambers in which various steps are performed are provided, a plurality of different steps can be performed without exposure to air. For example, when a reaction chamber in which a formation step of a gate insulating film, a microcrystalline semiconductor film, an amorphous semiconductor film, a semiconductor film to which an impurity imparting one conductivity type is added, and a conductive film, and a reaction chamber which includes a laser irradiation apparatus for a laser irradiation step are provided, a step of from stacking the gate insulating film to the conductive film to a step of irradiating the conductive film with laser light can be performed successively without exposure to air. Accordingly, oxidation or contamination of thin film surfaces can be prevented, and thus reliability is improved.

In each of the reaction chambers (1) to (4), the gate insulating film, the microcrystalline semiconductor film, the amorphous semiconductor film, and the semiconductor film to which the impurity imparting one conductivity type is added are stacked. In this case, the plurality of different kinds of films can be stacked successively by change of source gases. In this case, after the gate insulating film is formed, silicon hydride such as silane is introduced into the reaction chamber so that residual oxygen is reacted with silicon hydride, and the reactant is ejected outside the reaction chamber; thus, the concentration of residual oxygen in the reaction chamber can be reduced. As a result, the concentration of oxygen contained in the microcrystalline semiconductor film can be reduced. In addition, crystal grains included in the microcrystalline semiconductor film can be prevented from being oxidized.

Alternatively, the gate insulating film, the microcrystalline semiconductor film, and the amorphous semiconductor film are formed in each of the reaction chambers (1) and (3), and the semiconductor film to which the impurity imparting one conductivity type is added is formed in each of the reaction chambers (2) and (4). When only the semiconductor film to which the impurity imparting one conductivity type is added is formed separately from other films, the impurity imparting one conductivity type which remains in the chamber can be prevented from being mixed into other films.

Alternatively, in a plasma CVD apparatus, films of one kind may be formed in a plurality of chambers in order to improve productivity. When films of one kind can be formed in a plurality of chambers, films can be concurrently formed over a plurality of substrates. For example, in FIG. 10A, each of the reaction chambers (1) and (2) is used as a reaction chamber in which a microcrystalline semiconductor film is formed, the reaction chamber (3) is used as a reaction chamber in which an amorphous semiconductor film is formed, and the reaction chamber (4) is used as a reaction chamber in which a semiconductor film to which an impurity imparting one conductivity type is added is formed. A microcrystalline semiconductor film is formed over a substrate in the reaction chamber (1) or reaction chamber (2), and over the substrate, an amorphous semiconductor film is formed in the reaction chamber (3) and a semiconductor film to which an impurity imparting one conductivity type is added is formed in the reaction chamber (4). An amorphous semiconductor film and a semiconductor film to which an impurity imparting one conductivity type is added may be successively formed in the reaction chamber (3). In this case, the plasma CVD apparatus shown in FIG. 10B in which three reaction chambers are provided may be used. In the case where a plurality of substrates are concurrently processed as described above, a plurality of reaction chambers are provided, in each of which a film with a low deposition rate is formed. Accordingly, productivity can be improved.

Before a substrate is carried in a reaction chamber to perform film formation, cleaning, flushing (washing) treatment (hydrogen flushing, silane flushing, or the like), and coating in which a protective film is formed of a film formed on the inner wall of each reaction chamber (the coating is also referred to as pre-coating treatment) is desirably performed. The pre-coating treatment is treatment in which plasma treatment is performed by flowing of a deposition gas in the reaction chamber to coat the inner wall of the reaction chamber with a thin protective film in advance. For example, before a microcrystalline silicon film is formed as a microcrystalline semiconductor film, pre-coating treatment may be performed in which the inner wall of the reaction chamber is coated with an amorphous silicon film with a thickness of 0.2 to 0.4 µm. Flushing treatment (hydrogen flushing, silane flushing, or the like) may be performed after pre-coating treatment. In the case of performing cleaning and pre-coating treatment, it is necessary that a substrate be carried out from a reaction chamber. However, in the case of performing flush treatment (hydrogen flushing, silane flushing, or the like), a substrate may be carried in a reaction chamber because plasma treatment is not performed.

A protective film formed of an amorphous silicon film is formed on the inner wall of the reaction chamber in which a microcrystalline silicon film is formed, and hydrogen plasma treatment is performed before film formation. In this case, the protective film is etched and an extremely small amount of silicon is deposited on a substrate. The silicon can be a nucleus of crystal growth.

In this manner, with use of the microwave plasma CVD apparatus in which the plurality of chambers are connected, the gate insulating film, the microcrystalline semiconductor film, the amorphous semiconductor film, and the semiconductor film to which the impurity imparting one conductivity type is added can be concurrently formed; thus, mass productivity can be increased. In addition, even when maintenance or cleaning is performed on one reaction chamber, films can be formed in other reaction chambers, and thus the films can be formed efficiently. In addition, each interface between the stacked layers can be formed without being contaminated by atmospheric components or impurity elements contained in air; thus, variations in characteristics of the thin film transistors can be reduced.

The use of the microwave plasma CVD apparatus with such a structure makes it possible to form similar kinds of films or one kind of films in each reaction chamber and form the films successively without exposure to air. Thus, each interface between the stacked layers can be formed without being contaminated by a residue of another film which has already been formed or an impurity element in air.

Furthermore, a high-frequency wave generator may be provided together with a microwave generator; the gate insulating film, the microcrystalline semiconductor film, the amorphous semiconductor film, and the semiconductor film to which the impurity imparting one conductivity type is added may be formed by a microwave plasma CVD method; and the amorphous semiconductor film may be formed by a high-frequency plasma CVD method.

Note that, although the load chamber and the unload chamber are provided separately in each of the microwave plasma CVD apparatuses shown in FIGS. 10A and 10B, they may be provided as one: a load/unload chamber. Pre-heating of the substrate in the spare chamber makes it possible to shorten heating time before formation of the film in each reaction chamber, and thus throughput can be increased. For these deposition steps, a gas supplied from a gas supply portion may be selected in accordance with its purpose.

This embodiment mode can be implemented in combination with any of the structures described in other embodiment modes as appropriate.

Embodiment Mode 6

A manufacturing process of a display device will be described with reference to FIGS. 30A and 30B and FIGS. 31A to 31C. In this embodiment mode, a light-emitting element utilizing electroluminescence will be described as a display element included in the display device. Light-emitting elements utilizing electroluminescence are classified according to whether their light-emitting material is an organic compound or an inorganic compound. In general, the former are referred to as organic EL elements, while the latter are referred to as inorganic EL elements. Thin film transistors 85 and 86 which are used in the display device can be manufactured to have a structure similar to and by a method similar to those of the thin film transistors 74, 274, and 374 described in Embodiment Modes 1 to 4, and each of them is a thin film transistor which has excellent electric characteristics and high reliability and which can be manufactured though a simplified process, with high productivity. The thin film transistors 85 and 86 shown in FIGS. 30A and 30B and thin film transistors 7001, 7011, and 7021 shown in FIGS. 31A to 31C have a similar structure to the thin film transistor 74 in Embodiment Mode 1 and are manufactured by a similar method thereto.

In an organic EL element, by application of voltage to a light-emitting element, electrons and holes are injected from a pair of electrodes into a layer containing a light-emitting organic compound, whereby current flows. Then, the carriers (electrons and holes) are recombined and the light-emitting organic compound comes to an excited state. When the organic compound returns from the excited state to the ground state, light emission is obtained. Because of such a mechanism, such a light-emitting element is referred to as a current-excitation light-emitting element.

Inorganic EL elements are classified into a dispersion type inorganic EL element and a thin film type inorganic EL element depending on its element structure. The dispersion type inorganic EL element has a light-emitting layer in which particles of a light-emitting material are dispersed in a binder.

The mechanism of light emission of the dispersion type inorganic EL element is donor acceptor recombination light emission, which utilizes a donor level and an acceptor level. The thin film type inorganic EL element has a structure in which a light-emitting layer is interposed between dielectric layers, and the obtained object is further interposed between electrodes. The mechanism of light emission of the thin film type inorganic EL element is localized light emission, which utilizes inner-shell electron transition of a metal ion. Note that an organic EL element is used for description, as a light-emitting element. In addition, a thin film transistor of channel-etched type which is shown in FIGS. 3A and 3B is described as a thin film transistor which controls driving of a light-emitting element.

Through the steps similar to those in FIGS. 1A to 1E, FIGS. 2A to 2D, FIGS. 3A and 3B, and FIGS. 4A to 4D, the thin film transistors 85 and 86 are formed over the substrate 100, and an insulating film 87 serving as a protective film is formed over the thin film transistors 85 and 86, as shown in FIGS. 30A and 30B. Subsequently, a planarization film 111 is formed over the insulating film 87, and a pixel electrode 112 which is connected to a source or drain electrode of the thin film transistor 86 is formed over the planarization film 111.

The planarizing film 111 is desirably formed using an organic resin such as acrylic, polyimide, or polyamide, or siloxane.

In FIG. 30A, it is preferable to use a cathode as the pixel electrode 112 because the thin film transistor of a pixel is an n-channel TFT. On the other hand, if the thin film transistor of the pixel is a p-channel TFT, it is preferable to use an anode as the pixel electrode 112. Specifically, for the cathode, a material with a low work function, such as Ca, Al, CaF, MgAg, or AlLi can be used.

Subsequently, as shown in FIG. 30B, a partition wall 113 is formed over the planarization film 111 and an edge of the pixel electrode 112. The partition wall 113 has an opening, and the pixel electrode 112 is exposed in the opening. The partition wall 113 is formed using an organic resin film, an inorganic insulating film, or an organic polysiloxane film. In particular, it is desirable that the partition wall 113 be formed from a photosensitive material, and the opening be formed over the pixel electrode so that a side wall of the opening forms an inclined surface with a continuous curvature.

Next, a light-emitting layer 114 is formed so as to be in contact with the pixel electrode 112 in the opening of the partition wall 113. The light-emitting layer 114 may be formed as either a single layer or stacked layers.

Then, a common electrode 115 is formed using an anode so as to cover the light-emitting layer 114. The common electrode 115 can be formed using a light-transmitting conductive film formed using a light-transmitting conductive material which is given as the pixel electrode 77 in Embodiment Mode 1. The common electrode 115 may also be formed using a titanium nitride film or a titanium film as well as the above-described light-transmitting conductive film. In FIG. 30B, the common electrode 115 is formed using ITO. In the opening of the partition wall 113, the pixel electrode 112, the light-emitting layer 114, and the common electrode 115 overlap with each other, whereby a light-emitting element 117 is formed. After that, a protective film 116 is desirably formed over the common electrode 115 and the partition wall 113 so that oxygen, hydrogen, moisture, carbon dioxide, or the like does not enter the light-emitting element 117. As the protective film 116, a silicon nitride film, a silicon nitride oxide film, a DLC film, or the like can be formed.

Moreover, in a practical case, it is desirable that a display device completed to the state shown in FIG. 30B be further packaged (sealed) with a protective film (e.g., a bonding film, or an ultraviolet curable resin film) or a cover material having high air tightness and little degasification so that the display device is not exposed to outside air.

Next, a structure of a light-emitting element will be described with reference to FIGS. 31A to 31C. A cross-sectional structure of a pixel will be described using an n-channel driving TFT as an example. Driving TFTs 7001, 7011, and 7021 used for display devices shown in FIGS. 31A, 31B, and 31C, respectively, have excellent electric characteristics and high reliability, and can be manufactured through a simplified process with high productivity.

In order to extract light emission of a light-emitting element, at least either an anode or a cathode may be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element with a top emission structure will be described with reference to FIG. 31A.

Figure 31A:
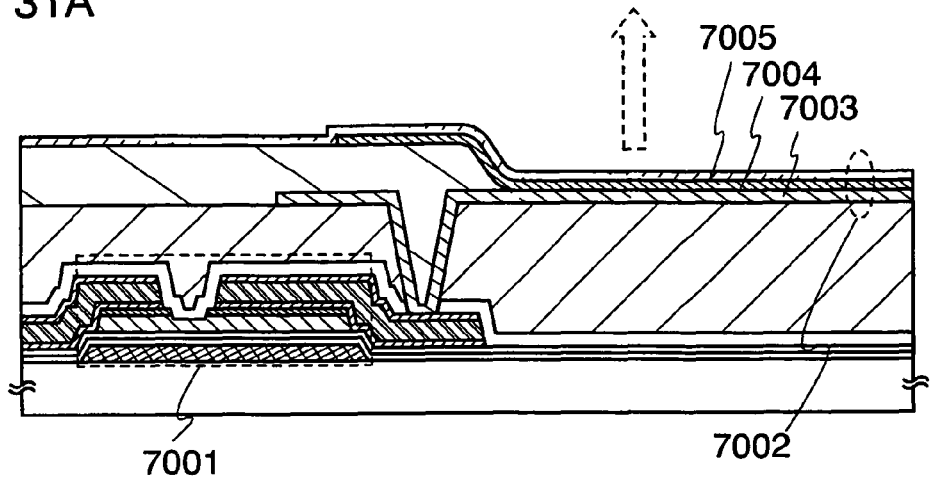
FIGS. 31A to 31C are views each illustrating a display device of the present invention.

FIG. 31A is a cross-sectional view of a pixel in the case where a driving TFT 7001 is an n-channel TFT, and light generated in a light-emitting element 7002 is emitted to pass through an anode 7005. In FIG. 31A, a cathode 7003 of the light-emitting element 7002 and the driving TFT 7001 are electrically connected to each other. A light-emitting layer 7004 and the anode 7005 are stacked in this order over the cathode 7003. As the cathode 7003, a known conductive film can be used as long as it has a low work function and reflects light. For example, Ca, Al, CaF, MgAg, AlLi, or the like is preferably used. The light-emitting layer 7004 may be formed as a single layer or stacked layers. When the light-emitting layer 7004 is formed using a plurality of layers, the light-emitting layer 7004 is formed in such a manner that an electron injecting layer, an electron transporting layer, a light-emitting layer, a hole transporting layer, and a hole injecting layer are stacked in this order over the cathode 7003. Note that it is not necessary to form all of these layers. The anode 7005 is formed using a light-transmitting conductive material which transmits light. For example, a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added may be used.

A region where the cathode 7003 and the anode 7005 sandwich the light-emitting layer 7004 corresponds to the light-emitting element 7002. In the pixel illustrated in FIG. 31A, light generated in the light-emitting element 7002 is emitted to pass through the anode 7005 as shown by an arrow.

Next, a light-emitting element having the bottom emission structure will be described with reference to FIG. 31B. FIG. 31B is a cross-sectional view of a pixel in the case where a driving TFT 7011 is an n-channel TFT, and light generated in a light-emitting element 7012 is emitted to pass through a cathode 7013. In FIG. 31B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A blocking film 7016 for reflecting or blocking light may be formed so as to cover the anode 7015 when the anode 7015 has a light-transmitting property. For the cathode 7013, various materials can be used as in the case of FIG. 31A as long as the material is a conductive material having a low work function. Note that the cathode 7013 has a thickness that can transmit light (preferably, approximately from 5 to 30 nm). For example, an Al film with a thickness of 20 nm can be used as the cathode 7013. The light-emitting layer 7014 may be formed as a single layer or stacked layers as in the case of FIG. 31A. Although the anode 7015 is not required to transmit light, it can be formed using a light-transmitting conductive material as in the case of FIG. 31A. As the blocking film 7016, metal or the like which reflects light can be used; however, it is not limited to a metal film. For example, a resin or the like to which black pigments are added can be used.

A region where the cathode 7013 and the anode 7015 sandwich the light-emitting layer 7014 corresponds to the light-emitting element 7012. In the pixel illustrated in FIG. 31B, light generated in the light-emitting element 7012 is emitted to pass through the cathode 7013 as shown by an arrow.

Next, a light-emitting element having the dual emission structure will be described with reference to FIG. 31C. In FIG. 31C, a cathode 7023 of a light-emitting element 7022 is formed over a light-transmitting conductive film 7027 which is electrically connected to a driving TFT 7021, and a light-emitting layer 7024 and an anode 7025 are stacked in this order over the cathode 7023. As the cathode 7023, a known conductive film can be used as long as it has a low work function as in the case of FIG. 31A. The cathode 7023 has a thickness which can transmit light. For example, an Al film with a thickness of 20 nm can be used as the cathode 7023. The light-emitting layer 7024 may be formed using a single layer or stacked layers as in the case of FIG. 31A. The anode 7025 can be formed using a light-transmitting conductive material as in the case of FIG. 31A.

A region where the cathode 7023, the light-emitting layer 7024, and the anode 7025 overlap corresponds to the light-emitting element 7022. In the pixel illustrated in FIG. 31C, light generated in the light-emitting element 7022 is emitted to pass through both the anode 7025 and the cathode 7023 as shown by arrows.

Note that, although the organic EL element is described as the light-emitting element in this embodiment mode, an inorganic EL element can be provided as the light-emitting element.

Note that, although the example in which the thin film transistor (driving TFT) which controls driving of the light-emitting element is electrically connected to the light-emitting element is described in this embodiment mode, a structure may also be employed in which a current control TFT is formed between the driving TFT and the light-emitting element to be connected to them.

Figure 31B:
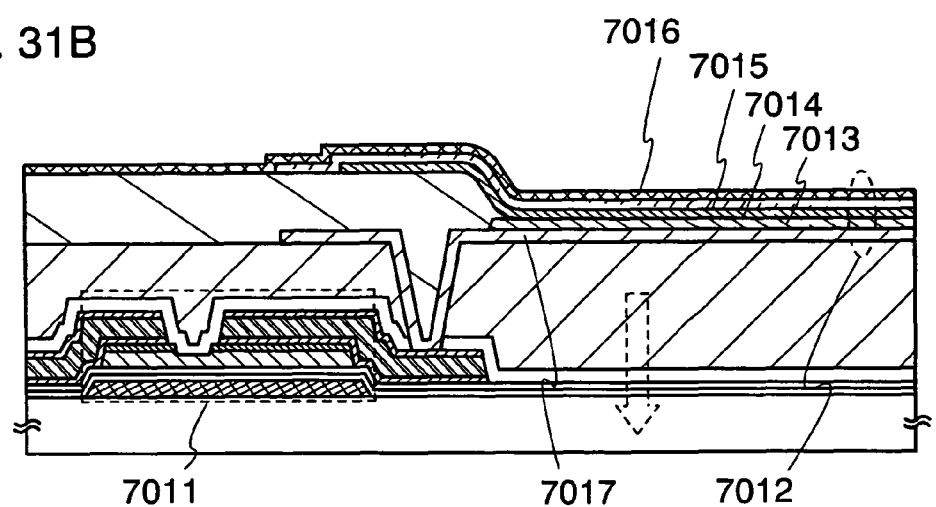
Figure 31C:
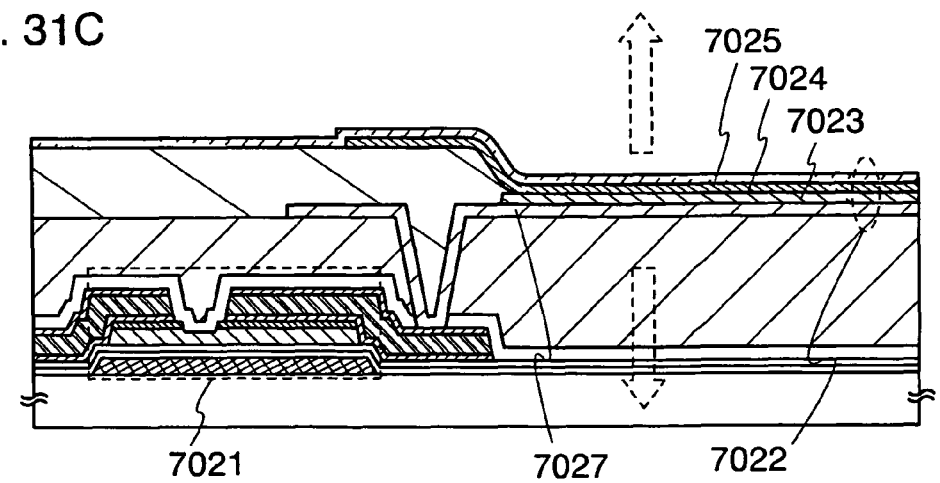

A display device described in this embodiment mode is not limited to the structures illustrated in FIGS. 31A to 31C, and can be modified in various ways based on the spirit of techniques of the present invention.

Through the above-described steps, a light-emitting device can be manufactured as a display device. Since the light-emitting device of this embodiment mode includes a thin film transistor which has excellent electric characteristics and high reliability, it has high contrast and high visibility. Moreover, a simplified process is used, and thus a display device can be manufactured with high productivity.

Embodiment Mode 7

In this embodiment mode, a display device including the thin film transistor described in Embodiment Mode 1 to 4 will be described below. In this embodiment mode, an example of a liquid crystal display device using a liquid crystal element as a display element will be described with reference to FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, and FIG. 25. TFTs 628 and 629 which are used for a liquid crystal display device shown in FIG. 12 to FIG. 25 are thin film transistors which can have a similar structure to the thin film transistors 74, 274, and 374 described in Embodiment Modes 1 to 4 and can be manufactured in a similar manner thereto and have excellent electric characteristics and high reliability. In addition, a pixel electrode and a counter electrode can be formed using the same material and the same step as the pixel electrode 77 described in Embodiment Mode 1.

First, a vertical alignment (VA) liquid crystal display device will be described. The VA liquid crystal display device is a kind of form in which alignment of liquid crystal molecules of a liquid crystal display panel is controlled. The VA liquid crystal display device is a form in which liquid crystal molecules are perpendicular to a panel surface when voltage is not applied. In particular, in this embodiment mode, a pixel is divided into several regions (sub-pixels) so that molecules are aligned in different directions in the respective regions. This is referred to as multi domain or multi-domain design. In the following description, a liquid crystal display device with multi-domain design is described.

Figure 12:
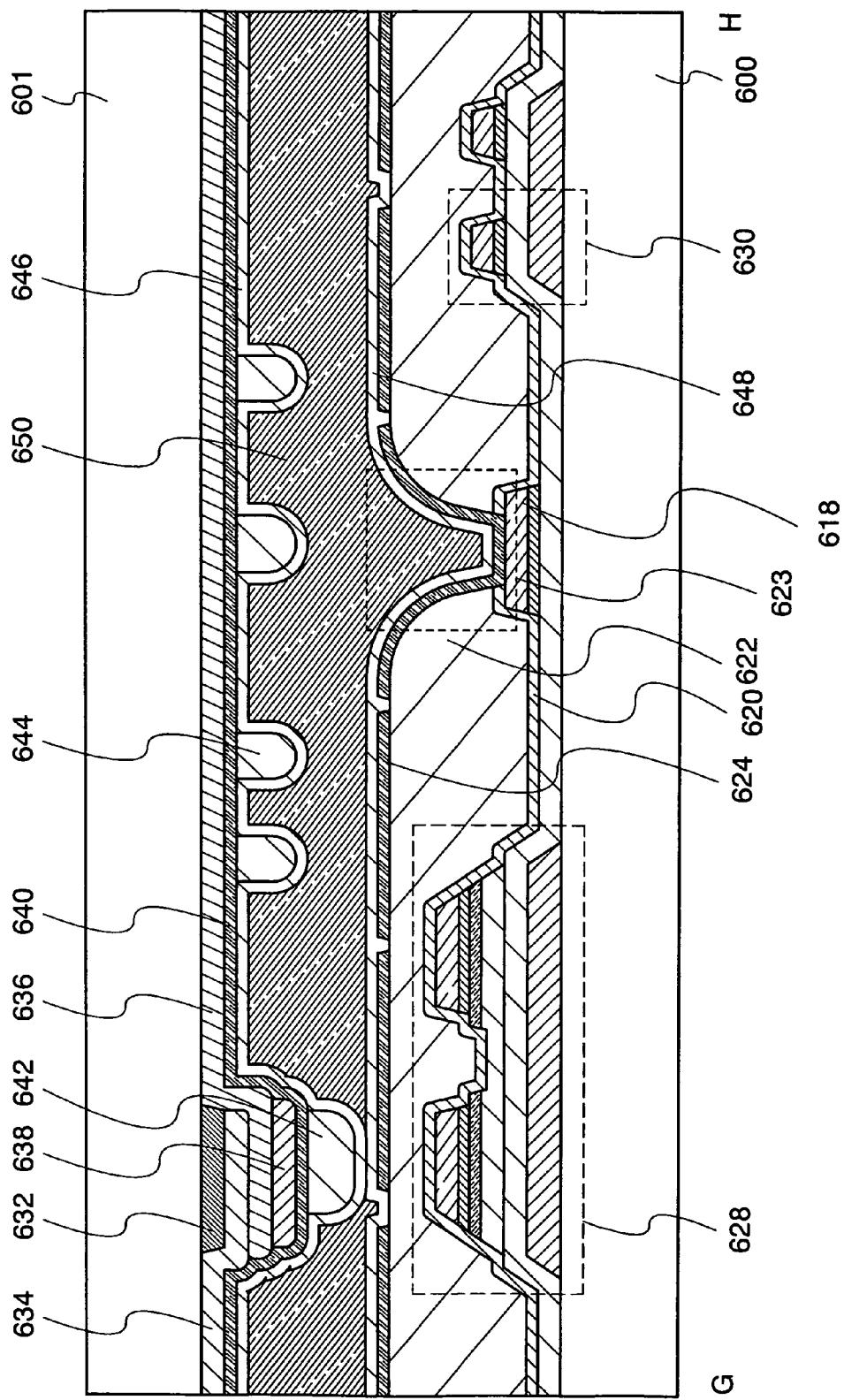
FIG. 12 is a view illustrating a display device of the present invention.
Figure 13:
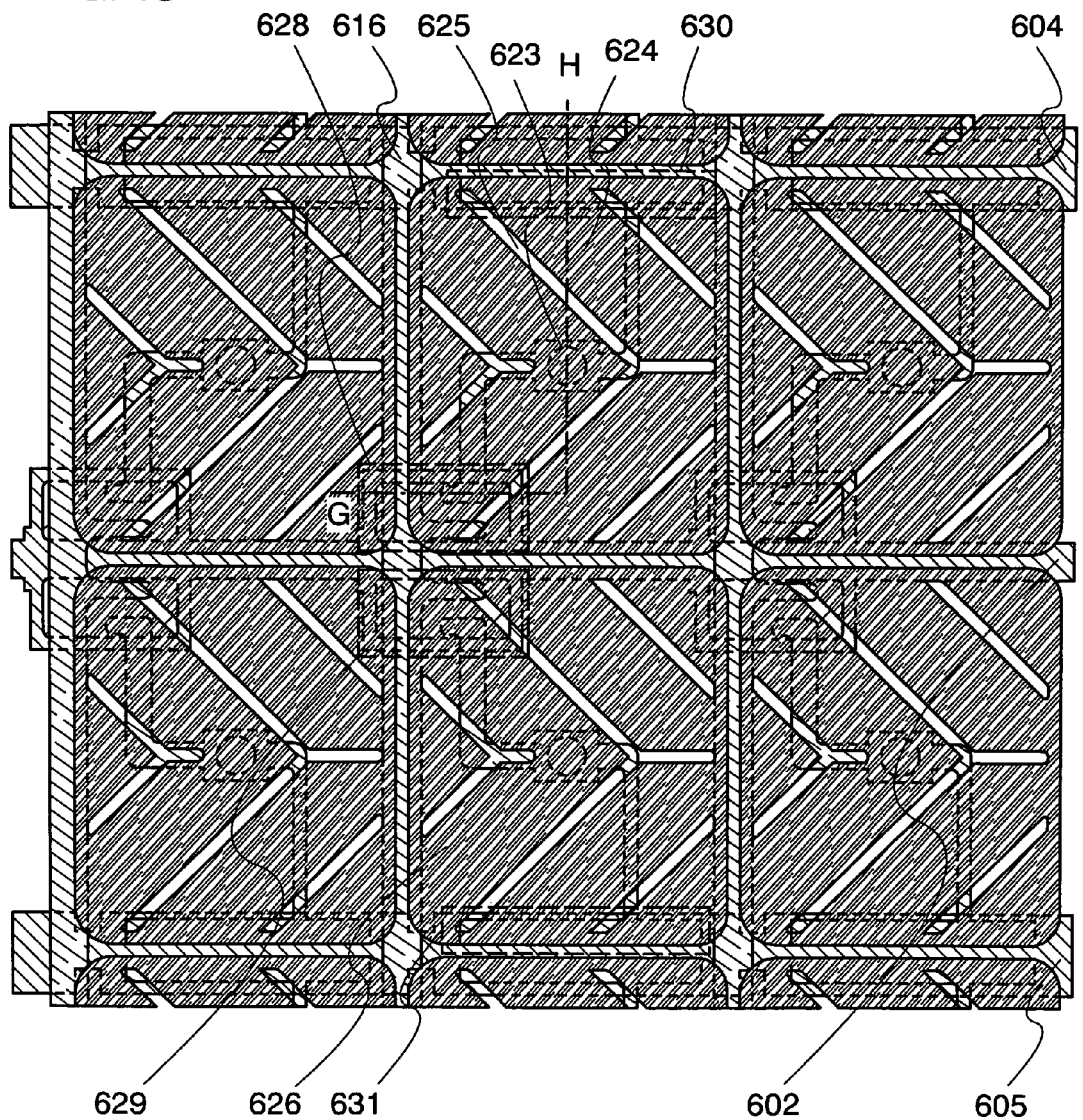
FIG. 13 is a view illustrating a display device of the present invention.
Figure 14:
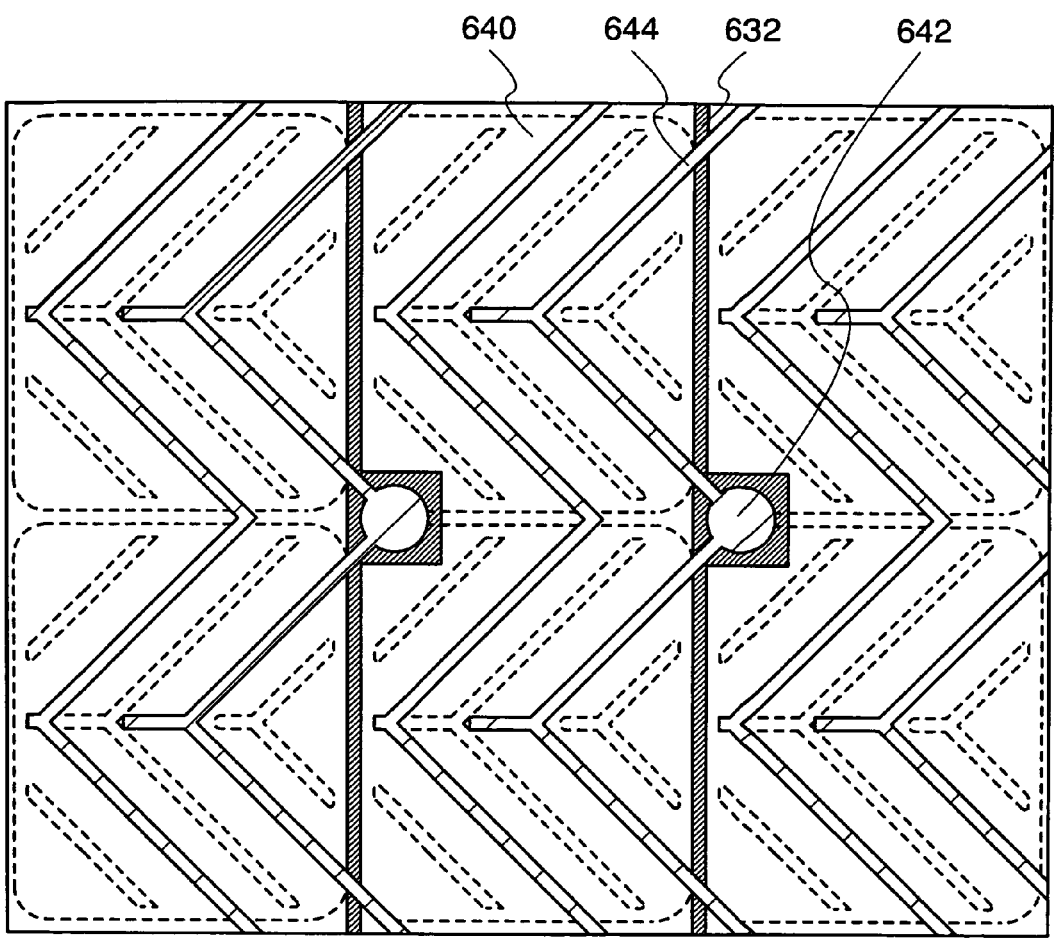
FIG. 14 is a view illustrating a display device of the present invention.

FIGS. 13 and 14 show a pixel electrode and a counter electrode, respectively. FIG. 13 is a plane view of the substrate side on which the pixel electrode is formed. FIG. 12 shows a cross-sectional structure taken along a line G-H in FIG. 13. FIG. 14 is a plane view of the substrate side on which the counter electrode is formed. Hereinafter, description will be made with reference to these drawings.

FIG. 12 shows a state in which a substrate 600 provided with a TFT 628, a pixel electrode 624 connected to the TFT 628, and a storage capacitor portion 630 overlaps with a counter substrate 601 provided with a counter electrode 640 and the like, and liquid crystal is injected.

At the position where the counter substrate 601 is provided with a spacer 642, a light shielding film 632, a first color film 634, a second color film 636, a third color film 638, and the counter electrode 640 are formed. With this structure, the height of a projection 644 for controlling alignment of the liquid crystal and the height of the spacer 642 vary. An alignment film 648 is formed over the pixel electrode 624. Similarly, the counter electrode 640 is also provided with an alignment film 646. A liquid crystal layer 650 is formed between the alignment films 646 and 648.

Although a columnar spacer is used for the spacer 642 in this embodiment mode, a bead spacer may be dispersed. Furthermore, the spacer 642 may be formed over the pixel electrode 624 which is formed over the substrate 600.

The TFT 628, the pixel electrode 624 connected to the TFT 628, and the storage capacitor portion 630 are formed over the substrate 600. The pixel electrode 624 is connected to a wiring 618 via a contact hole 623 which penetrates an insulating film 620 which covers the TFT 628, the wiring, and the storage capacitor portion 630 and also penetrates a third insulating film 622 which covers the insulating film 620. The thin film transistor described in Embodiment Mode 1 can be used as the TFT 628 as appropriate. The storage capacitor portion 630 includes a first capacitor wiring 604 which is formed in a similar manner to a gate wiring 602 of the TFT 628, a gate insulating film 606, and a second capacitor wiring 617 which is formed in a similar manner to a wiring 616 and the wiring 618.

A liquid crystal element is formed by overlapping of the pixel electrode 624, the liquid crystal layer 650, and the counter electrode 640.

FIG. 13 shows a structure over the substrate 600. The pixel electrode 624 is formed using the material described in Embodiment Mode 1. The pixel electrode 624 is provided with a slit 625. The slit 625 is for controlling alignment of the liquid crystal.

A pixel electrode 626 and a storage capacitor portion 631 which are connected to the TFT 629 shown in FIG. 13 can be formed in a similar manner to the pixel electrode 624 and the storage capacitor portion 630, respectively. Both the TFT 628 and the TFT 629 are connected to the wiring 616. A pixel of this liquid crystal display panel includes the pixel electrodes 624 and 626. Each of the pixel electrodes 624 and 626 is a sub-pixel.

FIG. 14 shows a structure of the counter substrate side. The counter electrode 640 is formed over the light shielding film 632. The counter electrode 640 is desirably formed using a material similar to that of the pixel electrode 624. The projection 644 for controlling the alignment of the liquid crystal is formed over the counter electrode 640. Moreover, the spacer 642 is formed corresponding to the position of the light shielding film 632.

Figure 15:
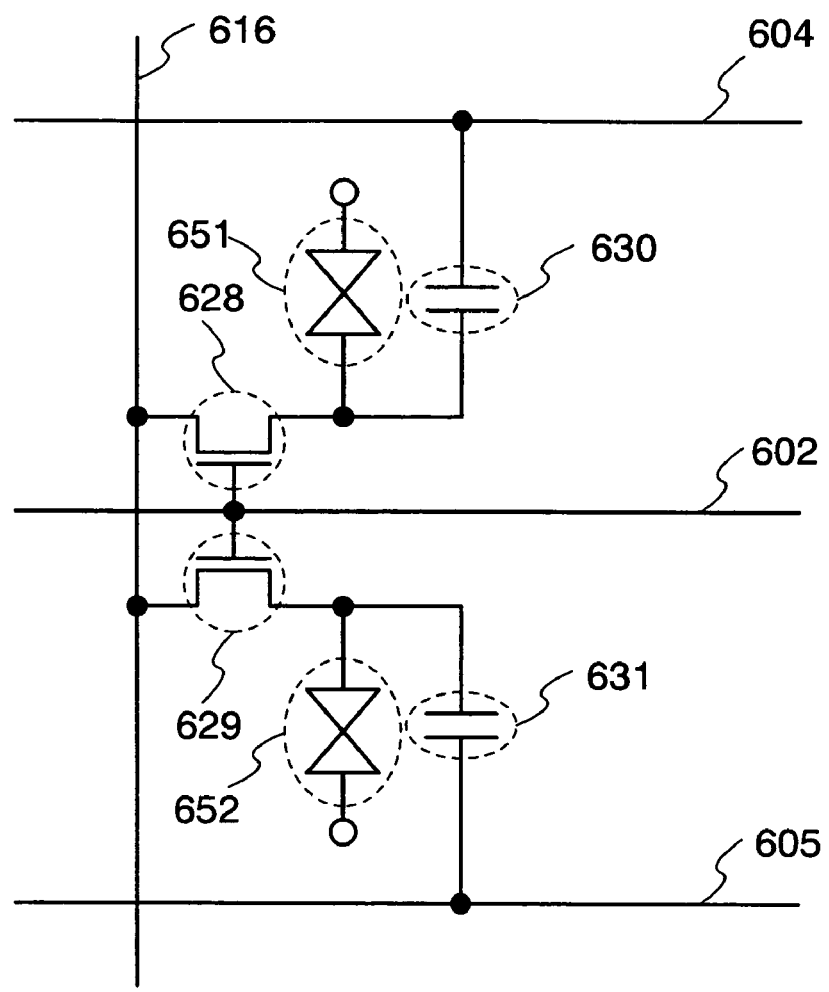
FIG. 15 is a view illustrating a display device of the present invention.

FIG. 15 shows an equivalent circuit of this pixel structure. Both the TFT 628 and the TFT 629 are connected to the gate wiring 602 and the wiring 616. In this case, when potentials of the capacitor wiring 604 and a capacitor wiring 605 are different from each other, operations of liquid crystal elements 651 and 652 can vary. In other words, the alignment of the liquid crystal is precisely controlled and a viewing angle is increased by individual control of potentials of the capacitor wirings 604 and 605.

When voltage is applied to the pixel electrode 624 provided with the slit 625, electric field distortion (an oblique electric field) is generated near the slit 625. The slit 625 and the projection 644 on the counter substrate 601 side are alternately arranged in an engaging manner, and thus an oblique electric field is effectively generated to control the alignment of the liquid crystal. Accordingly, the direction of alignment of the liquid crystal varies depending on location. That is, a viewing angle of the liquid crystal display panel is increased by domain multiplication.

Next, another VA liquid crystal display device, which is different from the above-described device, will be described with reference to FIG. 16, FIG. 17, FIG. 18, and FIG. 19.

Figure 16:
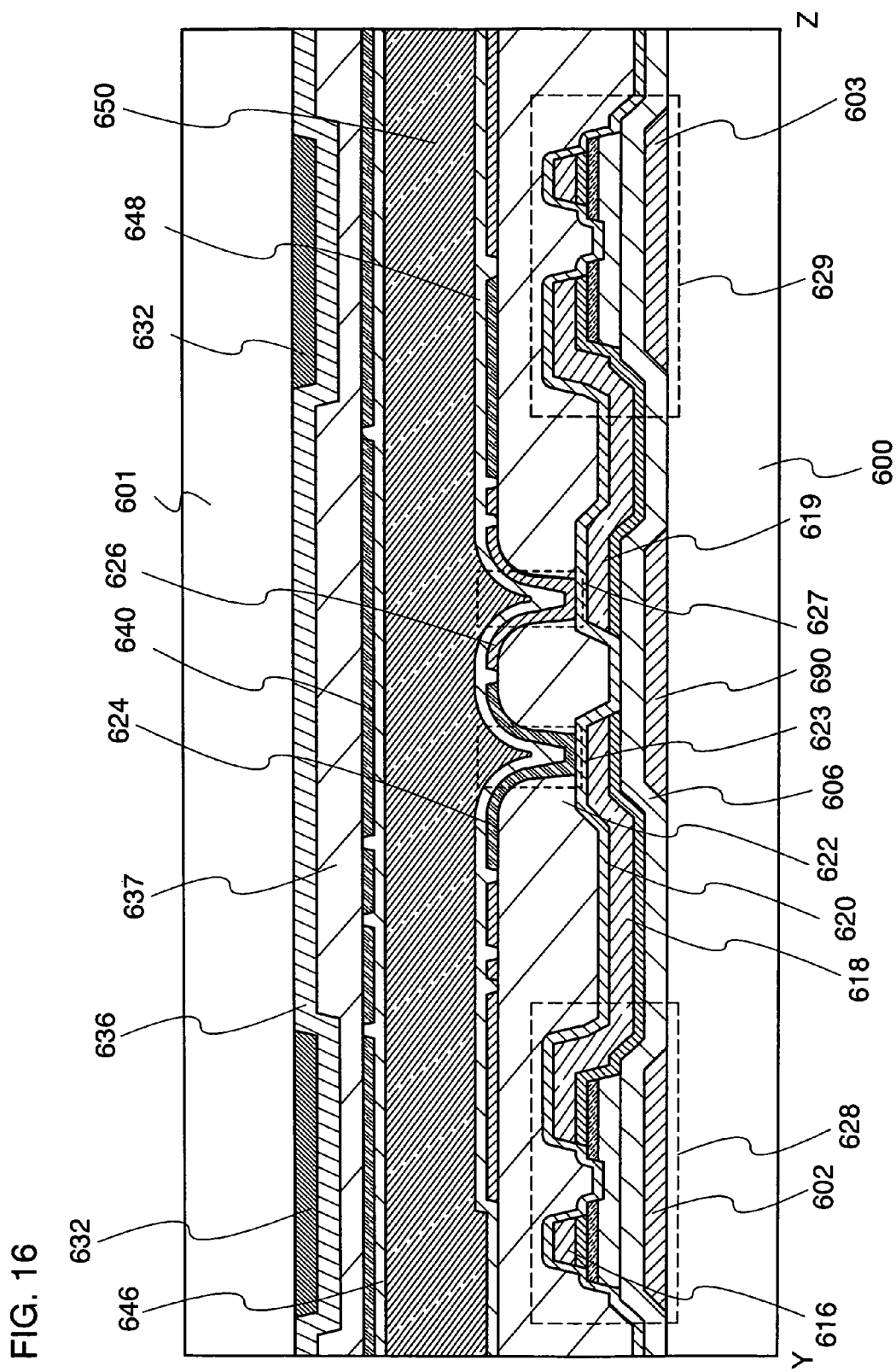
FIG. 16 is a view illustrating a display device of the present invention.
Figure 17:
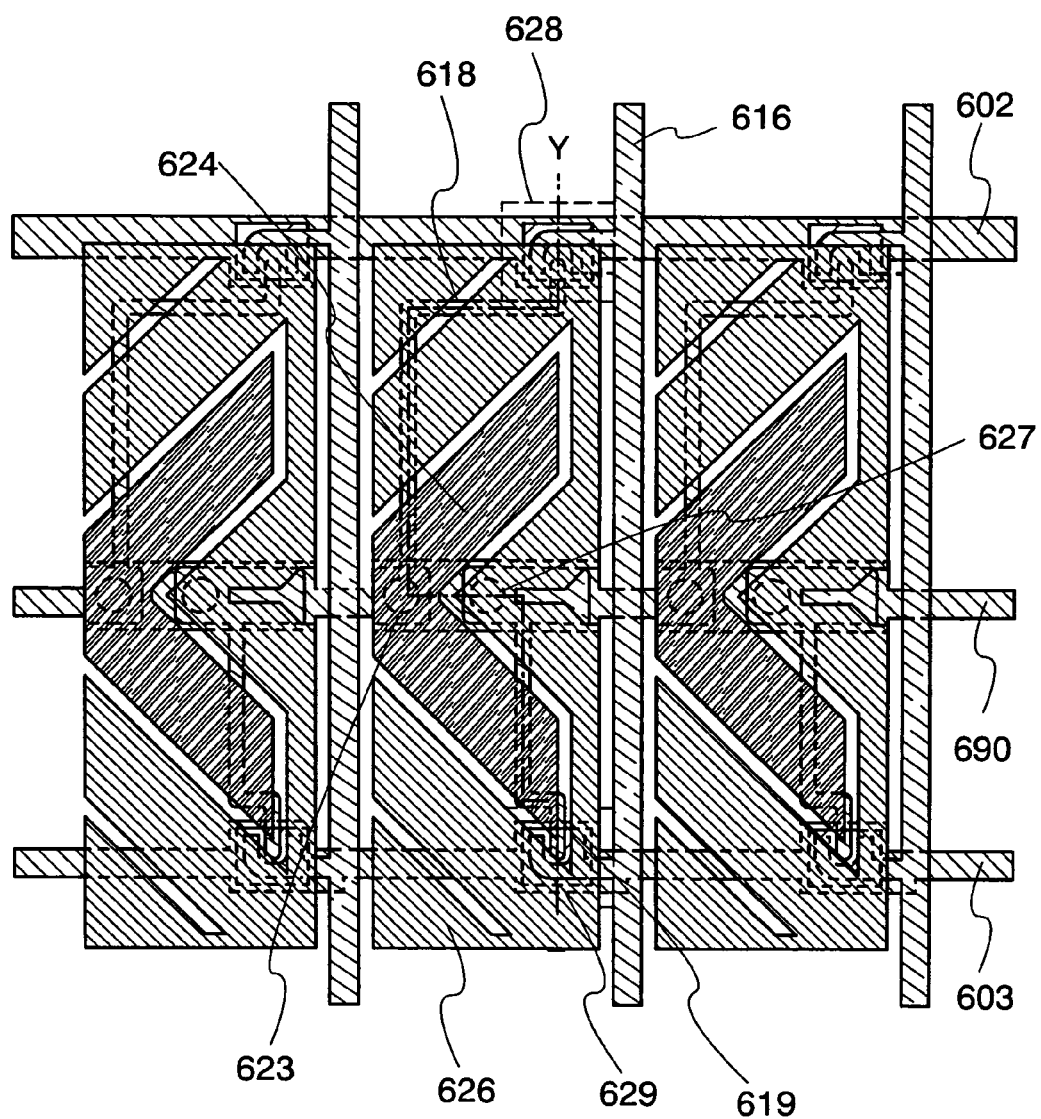
FIG. 17 is a view illustrating a display device of the present invention.

FIG. 16 and FIG. 17 each show a pixel structure of the VA liquid crystal display device. FIG. 17 is a plane view of the substrate 600. FIG. 16 shows a cross-sectional structure taken along a line Y-Z in FIG. 17. Hereinafter, description will be made with reference to these drawings.

In this pixel structure, a plurality of pixel electrodes is included in one pixel, and a TFT is connected to each pixel electrode. Each TFT is driven by a different gate signal. That is, a multi-domain pixel has a structure in which signals supplied to the respective pixel electrodes are individually controlled.

Via the contact hole 623, the pixel electrode 624 is connected to the TFT 628 through the wiring 618. Via a contact hole 627, the pixel electrode 626 is connected to the TFT 629 through a wiring 619. The gate wiring 602 of the TFT 628 and a gate wiring 603 of the TFT 629 are separated so that different gate signals can be given. In contrast, the wiring 616 functioning as a data line is used in common for the TFTs 628 and 629. Moreover, a capacitor wiring 690 is provided.

Figure 19:
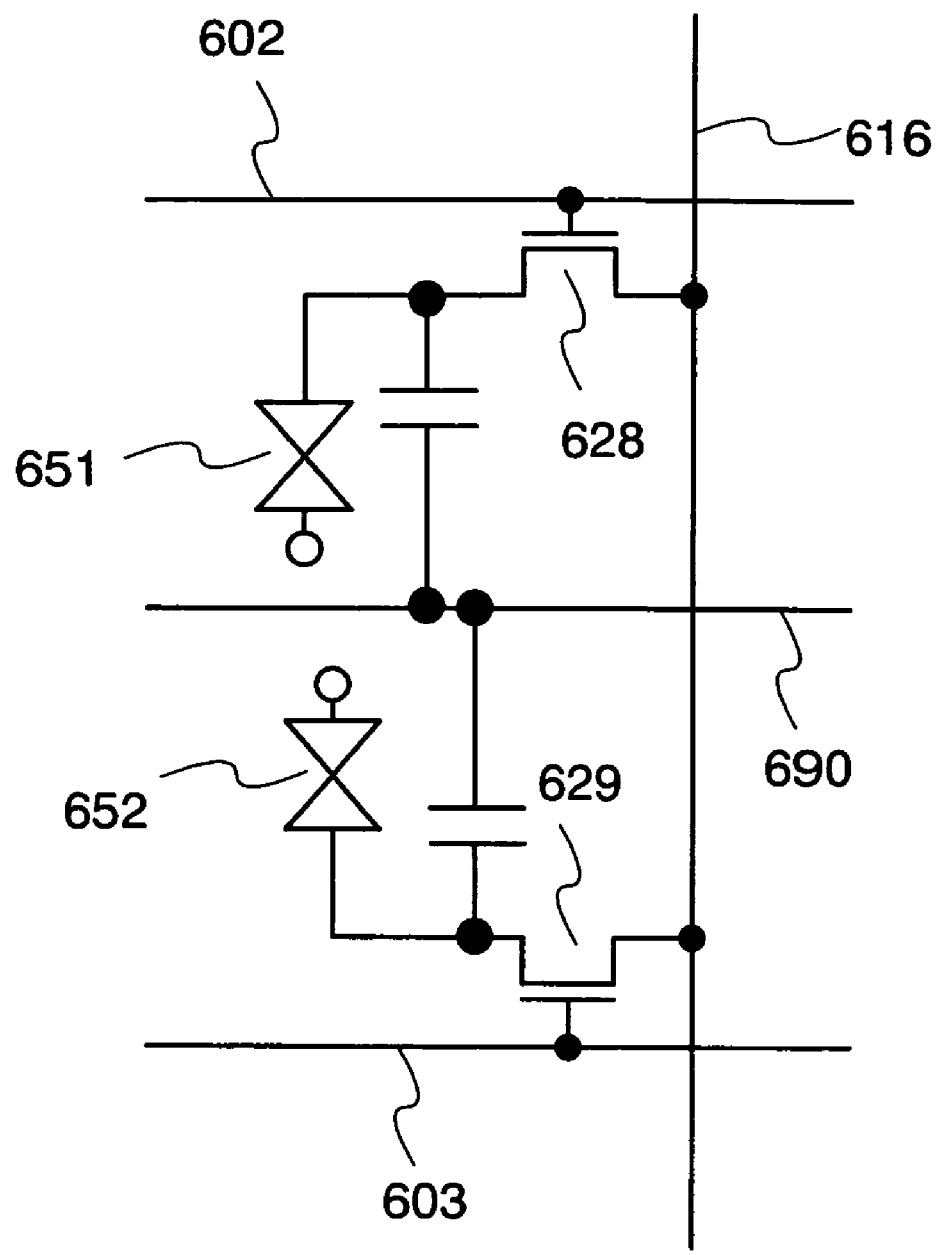
FIG. 19 is a view illustrating a display device of the present invention.

The pixel electrodes 624 and 626 have different shapes and are separated by the slit 625. The pixel electrode 626 is formed so as to surround the external side of the pixel electrode 624 which is spread in a V shape. Timing of voltage application is made to vary between the pixel electrodes 624 and 626 by the TFTs 628 and 629 in order to control the alignment of the liquid crystal. FIG. 19 shows an equivalent circuit of this pixel structure. The TFT 628 is connected to the gate wiring 602. The TFT 629 is connected to the gate wiring 603. When different gate signals are supplied to the gate wirings 602 and 603, the operation timing of the TFT 628 and the operation timing of the TFT 629 can vary.

Figure 18:
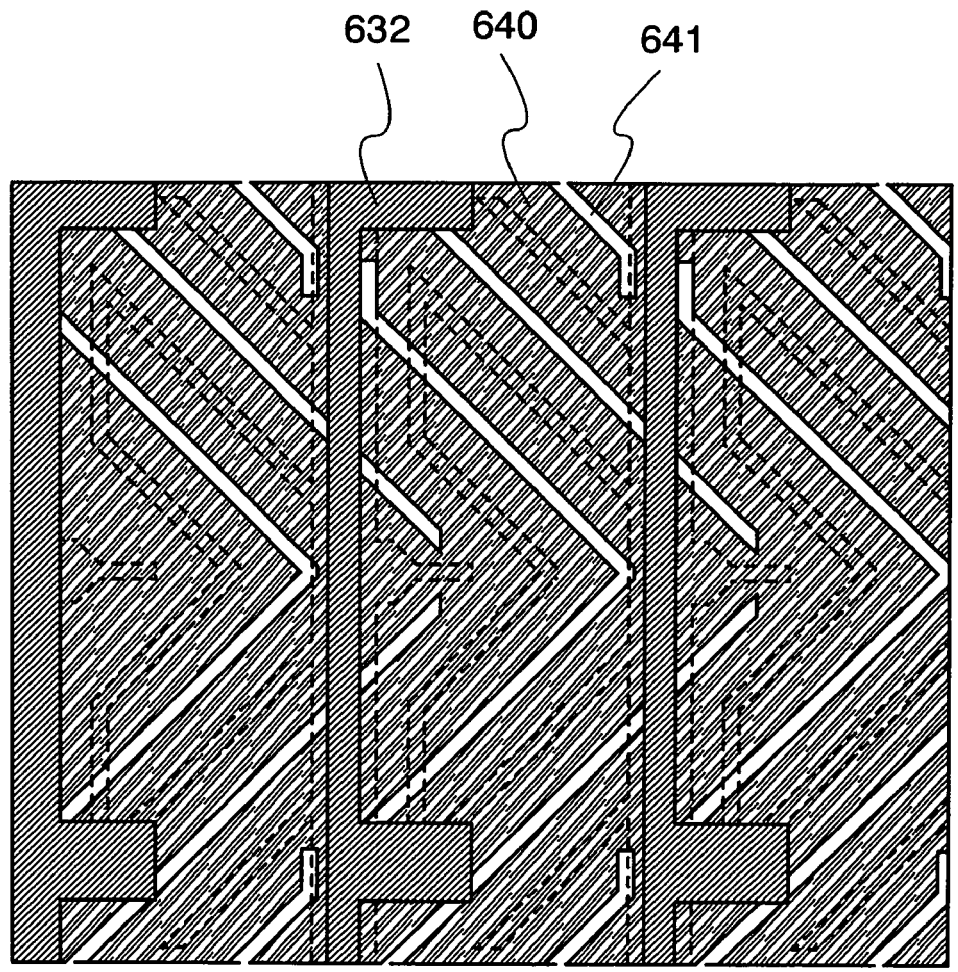
FIG. 18 is a view illustrating a display device of the present invention.

The counter substrate 601 is provided with the light shielding film 632, the second color film 636, and the counter electrode 640. Moreover, a planarization film 637 is formed between the second color film 636 and the counter electrode 640 to prevent alignment disorder of the liquid crystal. FIG. 18 shows a structure of the counter substrate side. A slit 641 is formed in the counter electrode 640, which is used in common between different pixels. The slit 641 and the slit 625 on the pixel electrodes 624 and 626 side are alternately arranged in an engaging manner; thus, an oblique electric field is effectively generated, and the alignment of the liquid crystal can be controlled. Accordingly, the direction of the alignment of the liquid crystal varies depending on location, and a viewing angle is increased.

A first liquid crystal element is formed by overlapping of the pixel electrode 624, the liquid crystal layer 650, and the counter electrode 640. A second liquid crystal element is formed by overlapping of the pixel electrode 626, the liquid crystal layer 650, and the counter electrode 640. This is a multi-domain structure in which the first liquid crystal element and the second liquid crystal element are included in one pixel.

Next, a horizontal electric field liquid crystal display device will be described. The horizontal electric field mode is a method in which an electric field is horizontally applied to liquid crystal molecules in a cell, whereby the liquid crystal is driven to express a gray scale. By this method, a viewing angle can be increased to approximately 180 degrees. Hereinafter, a liquid crystal display device employing the horizontal electric field mode is described.

Figure 20:
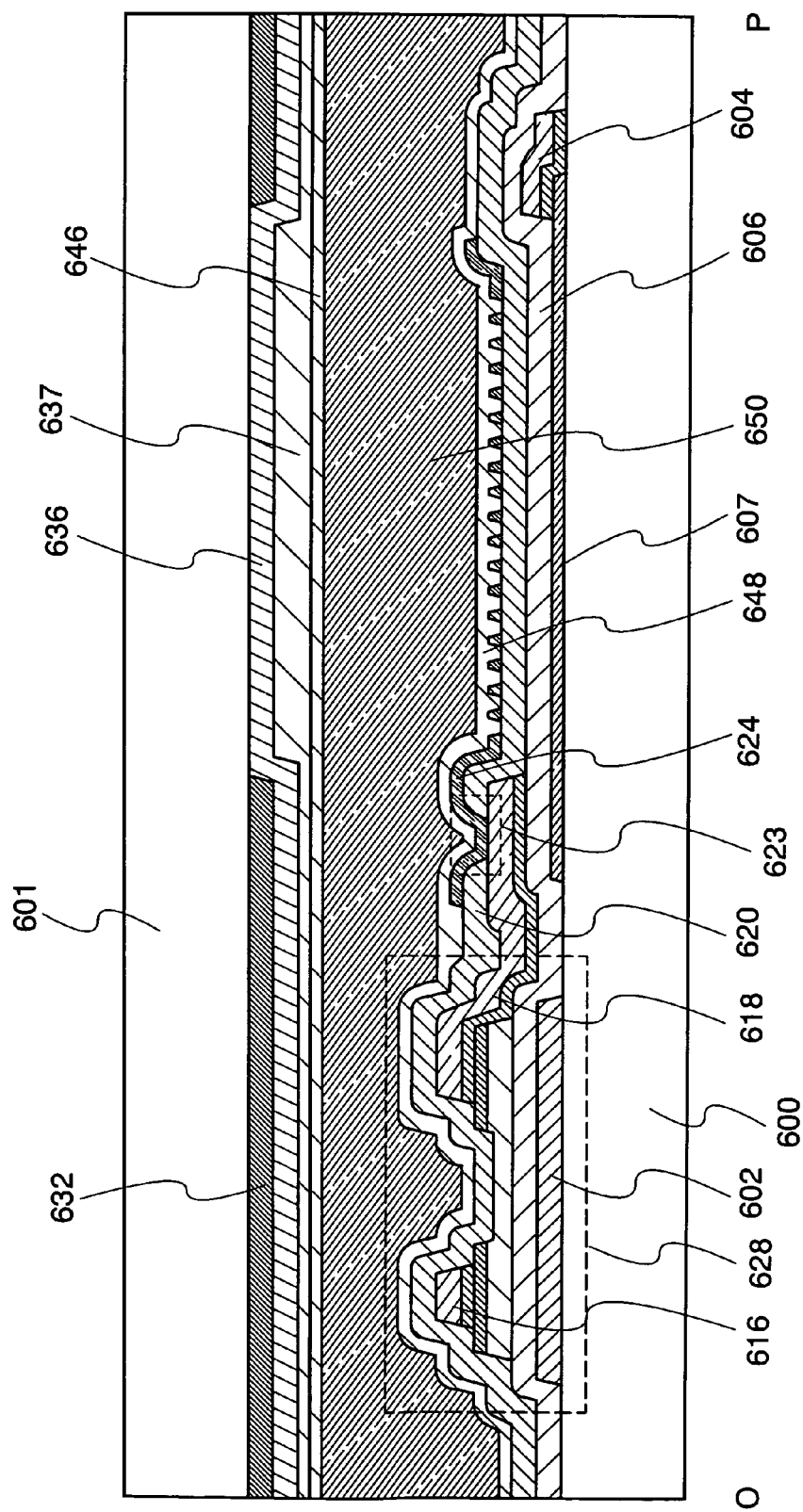
FIG. 20 is a view illustrating a display device of the present invention.

FIG. 20 shows a state in which the substrate 600 provided with the TFT 628 and the pixel electrode 624 connected to the TFT 628 overlaps with the counter substrate 601, and liquid crystal is injected. The counter substrate 601 is provided with the light shielding film 632, the second color film 636, the planarization film 637, and the like. Since the pixel electrode is provided on the substrate 600 side, it is not provided on the counter substrate 601 side. The liquid crystal layer 650 is formed between the substrate 600 and the counter substrate 601.

A first pixel electrode 607, the capacitor wiring 604 connected to the first pixel electrode 607, and the TFT 628 described in Embodiment Mode 1 are formed over the substrate 600. The first pixel electrode 607 can be formed using a material similar to that of the pixel electrode 77 described in Embodiment Mode 1. The first pixel electrode 607 is formed in a shape which is compartmentalized roughly in a pixel shape. Note that the gate insulating film 606 is formed over the first pixel electrode 607 and the capacitor wiring 604.

The wirings 616 and 618 of the TFT 628 are formed over the gate insulating film 606. The wiring 616 serves as a data line extending in one direction, through which a video signal is transmitted in a liquid crystal display panel, and is connected to a source region of the TFT 628 and serves as one of a source electrode and a drain electrode. The wiring 618 serves as the other of the source electrode and the drain electrode, and is connected to the second pixel electrode 624.

The second insulating film 620 is formed over the wirings 616 and 618. Over the insulating film 620, the second pixel electrode 624 connected to the wiring 618 via a contact hole formed in the insulating film 620 is formed. The pixel electrode 624 is formed using a material similar to that of the pixel electrode 77 described in Embodiment Mode 1.

In such a manner, the TFT 628 and the second pixel electrode 624 connected to the TFT 628 are formed over the substrate 600. Note that a storage capacitor is formed between the first pixel electrode 607 and the second pixel electrode 624.

Figure 21:
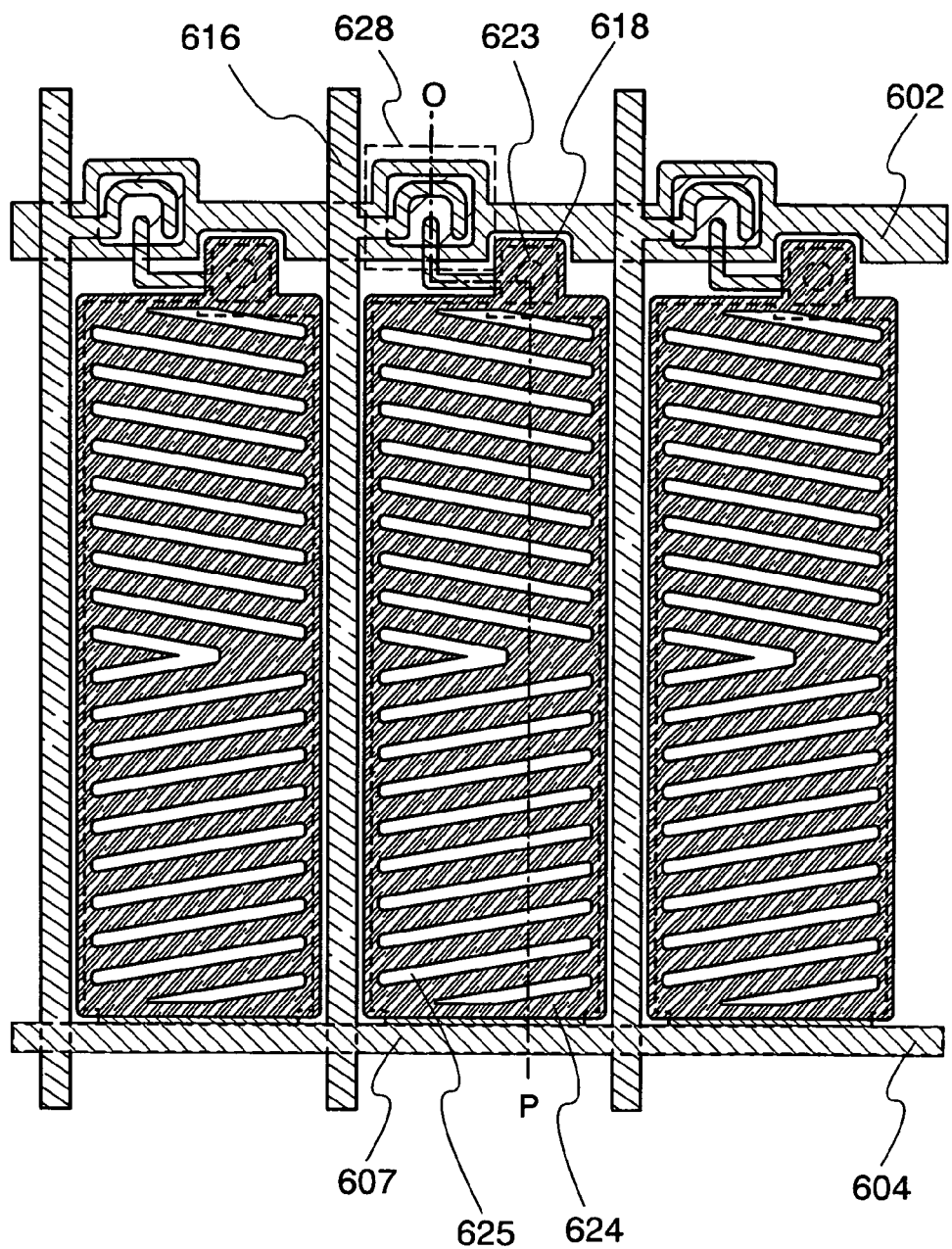
FIG. 21 is a view illustrating a display device of the present invention.

FIG. 21 is a plane view illustrating a structure of the pixel electrode. FIG. 20 shows a cross-sectional structure taken along a line O-P in FIG. 21. The pixel electrode 624 is provided with the slit 625. The slit 625 is for controlling the alignment of the liquid crystal. In this case, an electric field is generated between the first pixel electrode 607 and the second pixel electrode 624. The thickness of the gate insulating film 606, which is formed between the first pixel electrode 607 and the second pixel electrode 624, is 50 to 200 nm, which is thin enough compared with the liquid crystal layer with a thickness of 2 to 10 μm. Accordingly, an electric field is generated substantially in parallel (in a horizontal direction) to the substrate 600. The alignment of the liquid crystal is controlled by the electric field. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased. Moreover, since both the first pixel electrode 607 and the second pixel electrode 624 are a light-transmitting electrode, an aperture ratio can be increased.

Next, another example of a horizontal electric field liquid crystal display device will be described.

Figure 22:
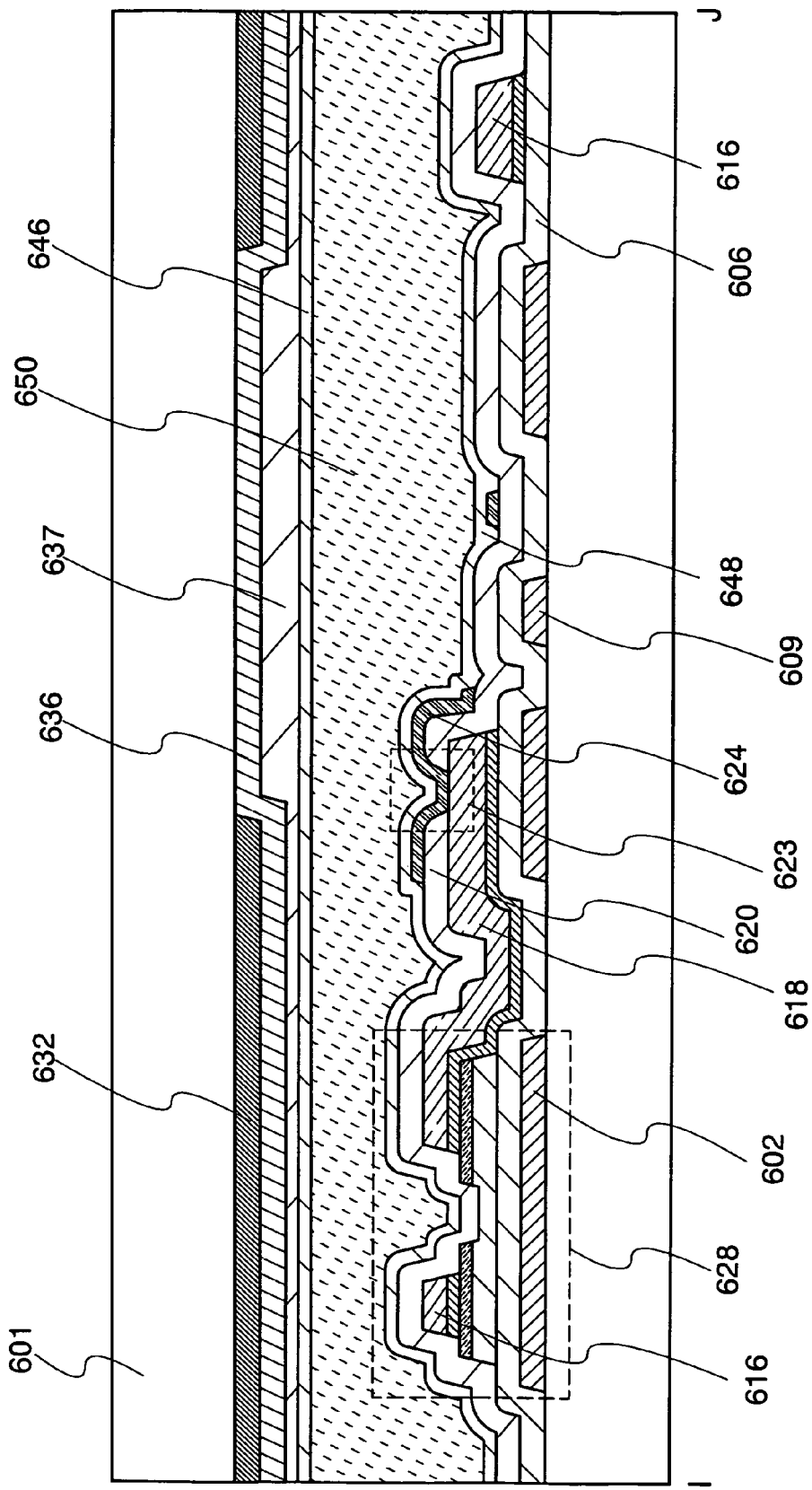
FIG. 22 is a view illustrating a display device of the present invention.
Figure 23:
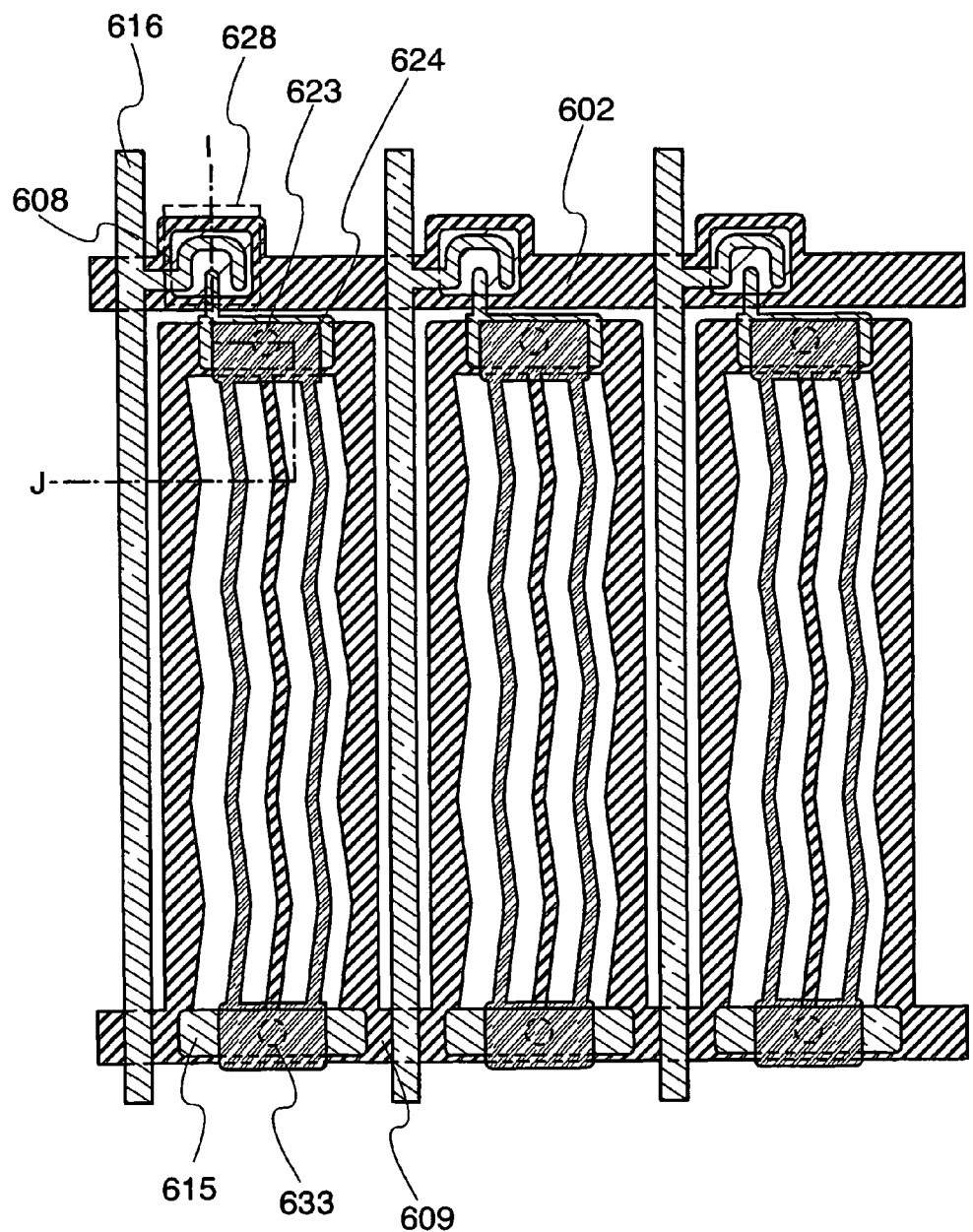
FIG. 23 is a view illustrating a display device of the present invention.

FIG. 22 and FIG. 23 each show a pixel structure of an in-plane switching (IPS) liquid crystal display device. FIG. 23 is a plane view. FIG. 22 shows a cross-sectional structure taken along a line I-J in FIG. 23. Hereinafter, description will be made with reference to these drawings.

FIG. 22 shows a state in which the substrate 600 provided with the TFT 628 and the pixel electrode 624 connected to the TFT 628 overlaps with the counter substrate 601, and liquid crystal is injected. The counter substrate 601 is provided with the light shielding film 632, the second color film 636, the planarization film 637, and the like. Since the pixel electrode is provided on the substrate 600 side, it is not provided on the counter substrate 601 side. The liquid crystal layer 650 is formed between the substrate 600 and the counter substrate 601.

A common potential line 609 and the TFT 628 are formed over the substrate 600. The common potential line 609 can be formed at the same time as the gate wiring 602 of the TFT 628. The first pixel electrode 607 is formed in a shape which is compartmentalized roughly in a pixel shape.

The wirings 616 and 618 of the TFT 628 are formed over the gate insulating film 606. The wiring 616 serves as a data line extending in one direction, through which a video signal is transmitted in a liquid crystal display panel, and is connected to the source region of the TFT 628 and serves as one of a source electrode and a drain electrode. The wiring 618 serves as the other of the source electrode and the drain electrode, and is connected to the second pixel electrode 624.

The second insulating film 620 is formed over the wirings 616 and 618. Over the insulating film 620, the second pixel electrode 624 connected to the wiring 618 via the contact hole 623 formed in the insulating film 620 is formed. The second pixel electrode 624 is formed using a material similar to that of the pixel electrode 77 described in Embodiment Mode 1. Note that, as shown in FIG. 23, the pixel electrode 624 is formed so as to generate a horizontal electric field with a comb-shaped electrode which is formed at the same time as the common potential line 609. Moreover, the pixel electrode 624 is formed so that comb-teeth portions of the pixel electrode 624 are alternately engaged with the comb-shaped electrode which is formed at the same time as the common potential line 609.

Alignment of the liquid crystal is controlled by an electric field generated between a potential applied to the pixel electrode 624 and a potential of the common potential line 609. The liquid crystal molecules are horizontally rotated using the electric field which is approximately parallel to the substrate. In this case, since the liquid crystal molecules are parallel to the substrate in any state, contrast or the like is less affected by change in angle of viewing, and a viewing angle is increased.

In such a manner, the TFT 628 and the pixel electrode 624 connected to the TFT 628 are formed over the substrate 600. A storage capacitor is formed by the common potential line 609, a capacitor electrode 615, and the gate insulating film 606 provided therebetween. The capacitor electrode 615 and the pixel electrode 624 are connected via a contact hole 633.

Next, a mode of a TN liquid crystal display device will be described.

Figure 24:
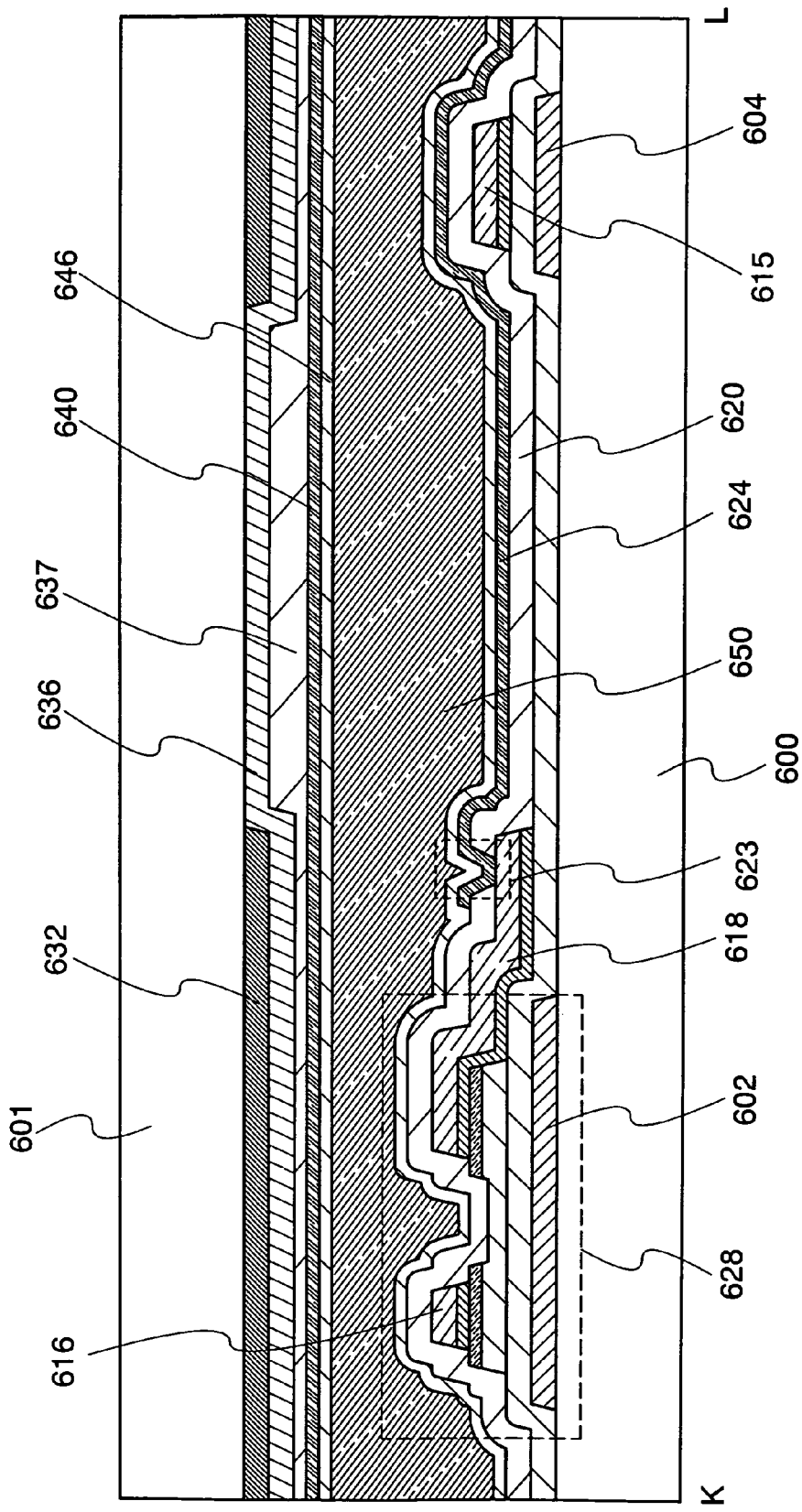
FIG. 24 is a view illustrating a display device of the present invention.
Figure 25:
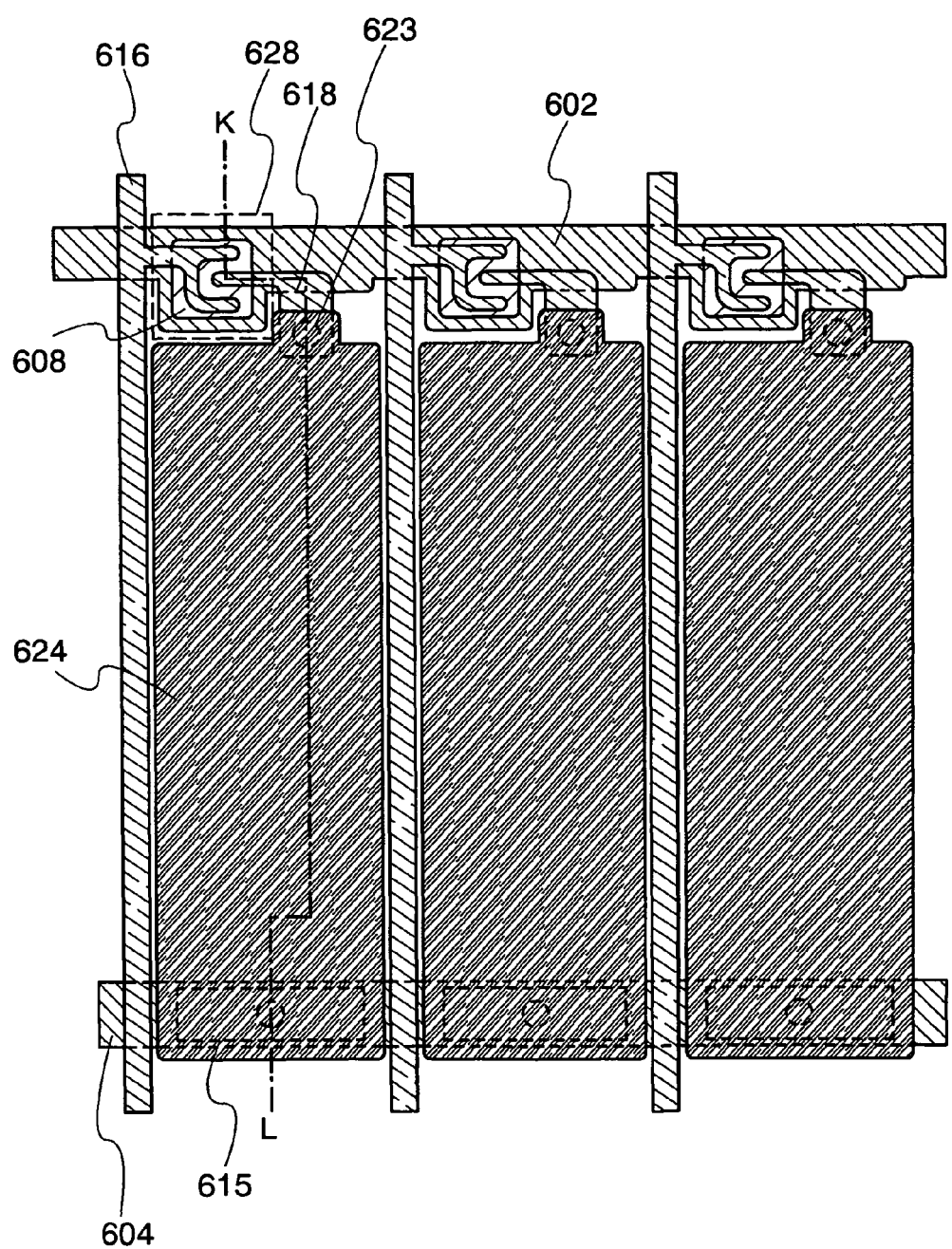
FIG. 25 is a view illustrating a display device of the present invention.

FIGS. 24 and 25 each show a pixel structure of a TN liquid crystal display device. FIG. 25 is a plane view. FIG. 24 shows a cross-sectional structure taken along a line K-L in FIG. 25. Hereinafter, description will be made with reference to these drawings.

The pixel electrode 624 is connected to the TFT 628 by the wiring 618 via the contact hole 623. The wiring 616 functioning as a data line is connected to the TFT 628.

The counter substrate 601 is provided with the light shielding film 632, the second color film 636, and the counter electrode 640. The planarization film 637 is formed between the second color film 636 and the counter electrode 640 to prevent alignment disorder of liquid crystal. The liquid crystal layer 650 is formed between the pixel electrode 624 and the counter electrode 640 with the alignment film 648 interposed between the liquid crystal layer 650 and the pixel electrode 624, and the alignment film 646 interposed between the liquid crystal layer 650 and the counter electrode 640.

A liquid crystal element is formed by overlapping of the pixel electrode 624, the liquid crystal layer 650, and the counter electrode 640.

The substrate 600 or the counter substrate 601 may be provided with a color filter, a shielding film (a black matrix) for preventing disclination, or the like. In addition, a polarizing plate is attached to a surface of the substrate 600, which is opposite to a surface over which the thin film transistor is formed. Moreover, a polarizing plate is attached to a surface of the counter substrate 601, which is opposite to a surface over which the counter electrode 640 is formed.

Through the above-described steps, the liquid crystal display device can be manufactured as a display device. Since a thin film transistor which has small off current, high reliability, and high electric properties is used in the liquid crystal display device of this embodiment mode, the liquid crystal display device has high contrast and high visibility.

Embodiment Mode 8

Next, a structure of a display panel, which is one mode of a display device of the present invention, will be described below. In this embodiment mode, the following will be described: a liquid crystal display panel which is one mode of a liquid crystal display device having a liquid crystal display element as a display element (such a liquid crystal display panel is also referred to as a liquid crystal panel) and a light-emitting display panel which is one mode of a display device having a light-emitting element as a display element (such a light-emitting display panel is also referred to as a light-emitting panel).

Figure 9A:
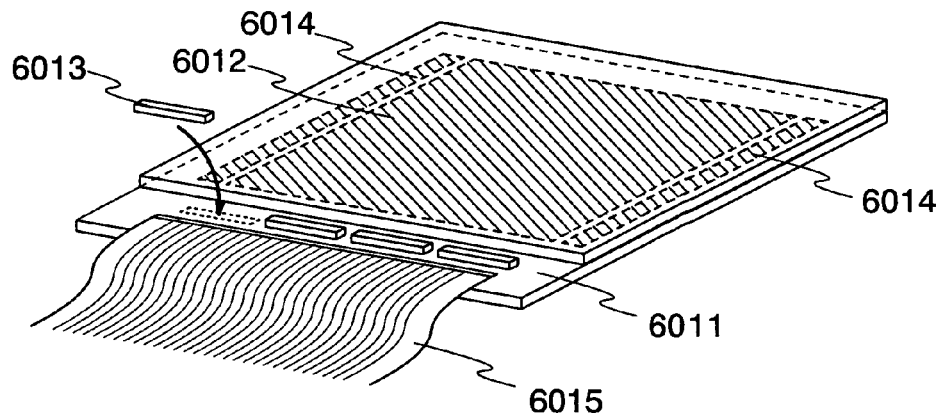
FIGS. 9A to 9C are perspective views each illustrating a display panel of the present invention.

FIG. 9A shows a mode of a light-emitting display panel in which a signal line driver circuit 6013 which is separately formed is connected to a pixel portion 6012 formed over a substrate 6011. The pixel portion 6012 and a scan line driver circuit 6014 are each formed using a thin film transistor in which a microcrystalline semiconductor film is used. When the signal line driver circuit is formed using a transistor in which mobility is higher than that of the thin film transistor in which the microcrystalline semiconductor film can be obtained is used, the operation of the signal line driver circuit which demands higher driving frequency than that of the scan line driver circuit can be stabilized. Note that the signal line driver circuit 6013 may be formed using a transistor using a single crystalline semiconductor, a thin film transistor using a polycrystalline semiconductor, or a transistor using SOI. The pixel portion 6012, the signal line driver circuit 6013, and the scan line driver circuit 6014 are each supplied with a potential of a power supply, a variety of signals, and the like via an FPC 6015.

Note that both the signal line driver circuit and the scan line driver circuit may be formed over the same substrate as the pixel portion.

Figure 9B:
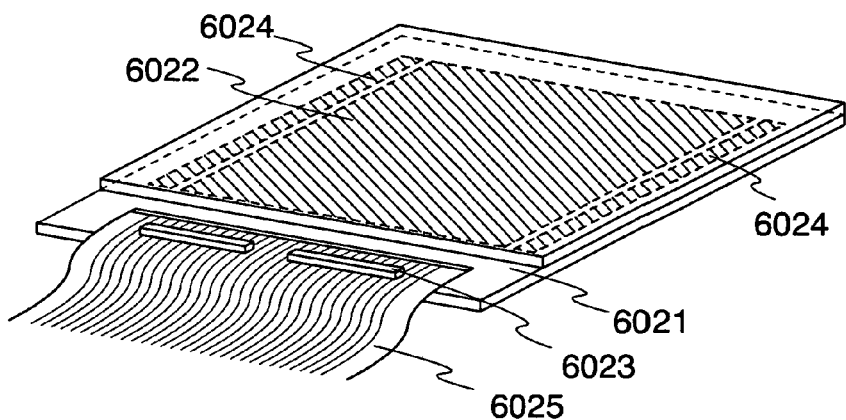

When a driver circuit is separately formed, a substrate over which the driver circuit is formed is not necessarily attached to a substrate over which a pixel portion is formed, and may be attached on an FPC, for example. FIG. 9B shows a mode of a light-emitting device panel in which a signal line driver circuit 6023 which is separately formed is connected to a pixel portion 6022 and a scan line driver circuit 6024 formed over a substrate 6021. The pixel portion 6022 and the scan line driver circuit 6024 are each formed using a thin film transistor in which a microcrystalline semiconductor film is used. The signal line driver circuit 6023 is connected to the pixel portion 6022 via an FPC 6025. The pixel portion 6022, the signal line driver circuit 6023, and the scan line driver circuit 6024 are each supplied with a potential of a power supply, a variety of signals, and the like via the FPC 6025.

Figure 9C:
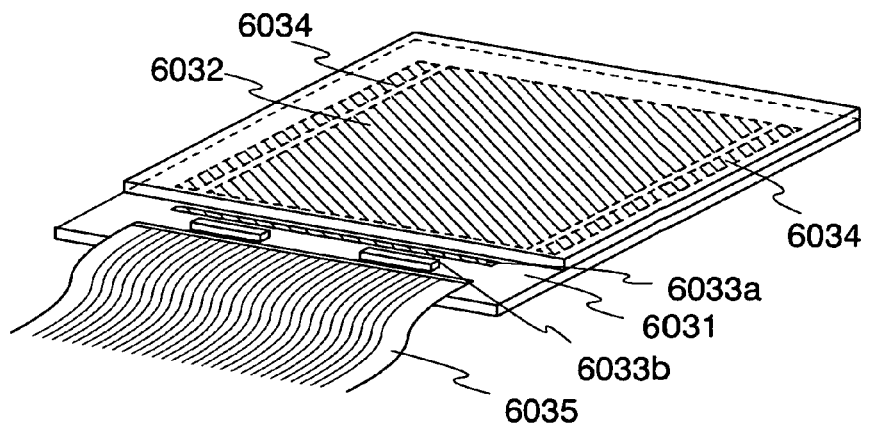

Alternatively, only part of a signal line driver circuit or part of a scan line driver circuit may be formed over the same substrate as a pixel portion with use of a thin film transistor in which a microcrystalline semiconductor film is used, and the other part of the driver circuit may be separately formed and electrically connected to the pixel portion. FIG. 9C shows a mode of a light-emitting device panel in which an analog switch 6033a included in a signal line driver circuit is formed over a substrate 6031, which is the same substrate as that of a pixel portion 6032 and a scan line driver circuit 6034, and a shift register 6033b included in the signal line driver circuit is separately formed over a different substrate and attached to the substrate 6031. The pixel portion 6032 and the scan line driver circuit 6034 are each formed using a thin film transistor in which a microcrystalline semiconductor film is used. The shift register 6033b included in the signal line driver circuit is connected to the pixel portion 6032 via an FPC 6035. The pixel portion 6032, the signal line driver circuit, and the scan line driver circuit 6034 are each supplied with a potential of a power supply, a variety of signals, and the like via the FPC 6035.

As shown in FIGS. 9A to 9C, in a light-emitting device of the present invention, all or part of the driver circuit can be formed over the same substrate as the pixel portion, using the thin film transistor in which the microcrystalline semiconductor film is used.

Note that there is no particular limitation on a connection method of a substrate which is separately formed, and a known COG method, wire bonding method, TAB method, or the like can be used. Moreover, a connection position is not limited to the positions shown in FIGS. 9A to 9C as long as electrical connection is possible. Furthermore, a controller, a CPU, a memory, or the like may be formed separately and connected.

Note that a signal line driver circuit used in the present invention is not limited to a structure including only a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Figure 32A:
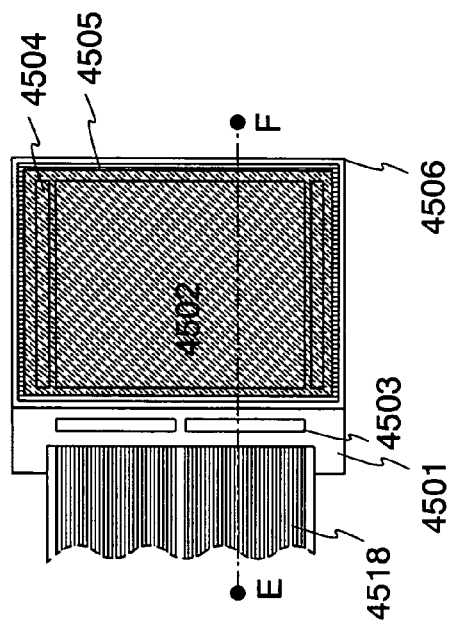
FIGS. 32A and 32B are views illustrating a display device of the present invention.
Figure 32B:
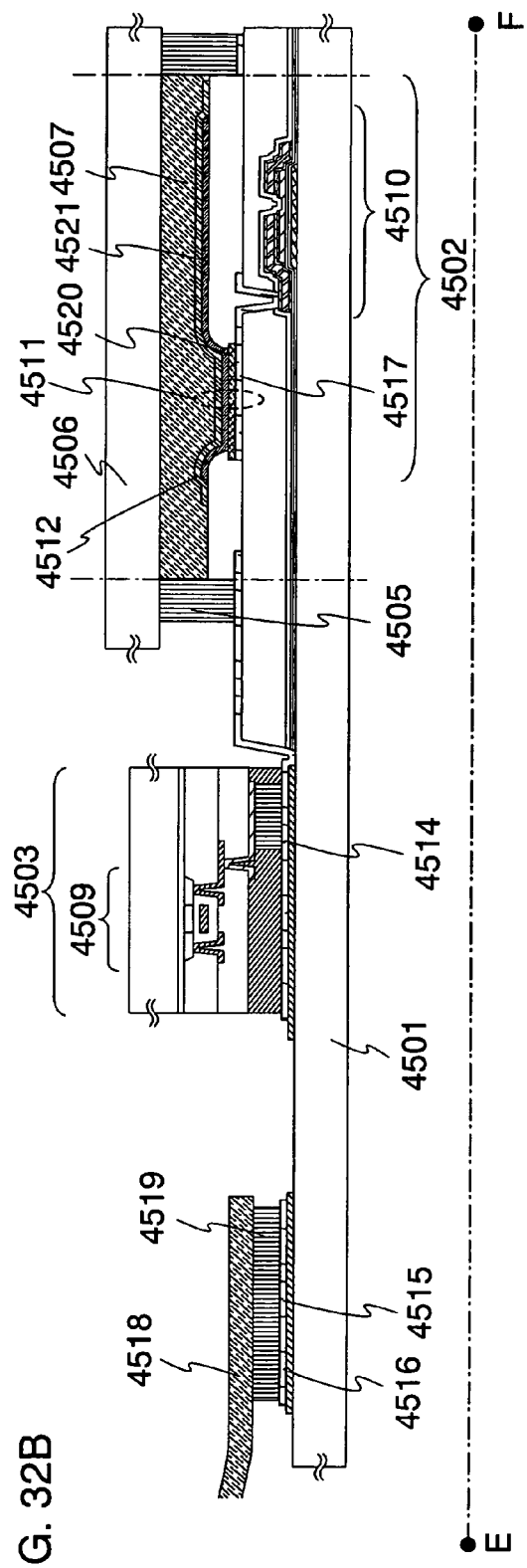

Next, the appearance and a cross section of a light-emitting display panel which corresponds to one mode of the display device of the present invention will be described with reference to FIGS. 32A and 32B. FIG. 32A is a top plane view of a panel. In the panel, a thin film transistor in which a microcrystalline semiconductor film is used and a light-emitting element which are formed over a first substrate are sealed between the first substrate and a second substrate by a sealing material. FIG. 32B is a cross-sectional view taken along a line E-F in FIG. 32A.

The sealing material 4505 is provided so as to surround a pixel portion 4502 and a scan line driver circuit 4504 which are provided over the first substrate 4501. The second substrate 4506 is provided over the pixel portion 4502 and the scan line driver circuit 4504. Accordingly, the pixel portion 4502 and the scan line driver circuit 4504 are tightly sealed together with a filler 4507 by the first substrate 4501, the sealing material 4505, and the second substrate 4506. In addition, a signal line driver circuit 4503 formed using a polycrystalline semiconductor film over a different substrate is mounted on a region over the first substrate 4501, which is different from the region surrounded by the sealing material 4505. Note that in this embodiment mode, an example is described in which the signal line driver circuit including a thin film transistor using a polycrystalline semiconductor film is attached to the first substrate 4501; however, a signal line driver circuit may be formed using a transistor using a single crystalline semiconductor and attached to a substrate. FIGS. 32A and 32B illustrate a thin film transistor 4509 formed using a polycrystalline semiconductor film, which is included in the signal line driver circuit 4503.

Each of the pixel portion 4502 and the scan line driver circuit 4504 which are provided over the first substrate 4501 includes a plurality of thin film transistors. FIG. 32B shows the thin film transistor 4510 included in the pixel portion 4502. Note that in this embodiment mode, description is made on the assumption that the thin film transistor 4510 is a driving TFT; however, the thin film transistor 4510 may be a TFT for current control or a TFT for erasing. The thin film transistor 4510 corresponds to a thin film transistor in which a microcrystalline semiconductor film is used, and can be similarly manufactured through the steps described in Embodiment Modes 1 to 4.

Reference numeral 4511 denotes a light-emitting element. A pixel electrode 4520 included in the light-emitting element 4511 is electrically connected to a source or drain electrode of the thin film transistor 4510 via a wiring 4517. Moreover, in this embodiment mode, a conductive film 4512 formed of a light-transmitting conductive material is electrically connected to a common electrode of the light-emitting element 4511. Although an example is shown in which the light-emitting element 4511 in FIG. 32B includes the pixel electrode 4520, the light-emitting layer 4521, and the conductive film 4512, the structure of the light-emitting element 4511 is not limited to that described in this embodiment mode. The structure of the light-emitting element 4511 can be changed as appropriate depending on a direction in which light is extracted from the light-emitting element 4511, the polarity of the thin film transistor 4510, or the like.

Although not shown in the cross-sectional view of FIG. 32B, a variety of signals and a potential supplied to signal line driver circuit 4503, the pixel portion 4502, and the scan line driver circuit 4504, which are formed separately, are supplied from an FPC 4518 through lead wirings 4514 and 4515.

In this embodiment mode, a connection terminal 4516 is formed using the same conductive film as that of the pixel electrode included in the light-emitting element 4511. Further, the lead wirings 4514 and 4515 are formed using the same conductive film as the wiring 4517.

The connection terminal 4516 is electrically connected to a terminal included in the FPC 4518 through an anisotropic conductive film 4519.

The substrate located in the direction in which light is extracted from the light-emitting element 4511 needs to be transparent. In this case, a light-transmitting material such as a glass plate, a plastic plate, a polyester film, or an acrylic film is used.

As the filler 4507, an ultraviolet curable resin or a thermosetting resin as well as an inert gas such as nitrogen or argon can be used. For example, polyvinyl chloride (PVC), acrylic, polyimide, an epoxy resin, a silicone resin, polyvinyl butyral (PVB), or ethylene vinyl acetate (EVA) can be used. In this embodiment mode, nitrogen is used for the filler 4507.

If needed, an optical film such as a polarizing plate, a circular polarizing plate (including an elliptical polarizing plate), a retardation plate (a quarter-wave plate or a half-wave plate), or a color filter may be provided on an emission surface of the light-emitting element as appropriate. In addition, the polarizing plate or the circular polarizing plate may be provided with an antireflection film. For example, anti-glare treatment for diffusing reflected light by unevenness of the surface and reducing reflection can be performed.

Although FIGS. 32A and 32B illustrate the example in which the signal line driver circuit 4503 is separately formed and attached to the first substrate 4501, this embodiment mode is not limited to this structure. A scan line driver circuit may be separately formed and attached to a substrate, or only part of a signal line driver circuit or part of a scan line driver circuit may be separately formed and attached to a substrate.

Figure 33A:
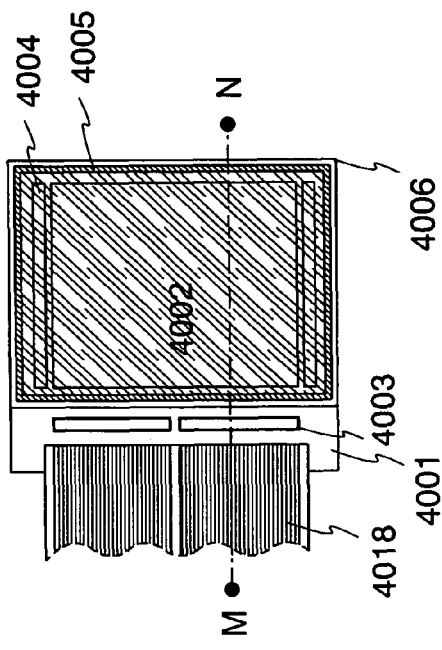
FIGS. 33A and 33B are views illustrating a display device of the present invention.
Figure 33B:
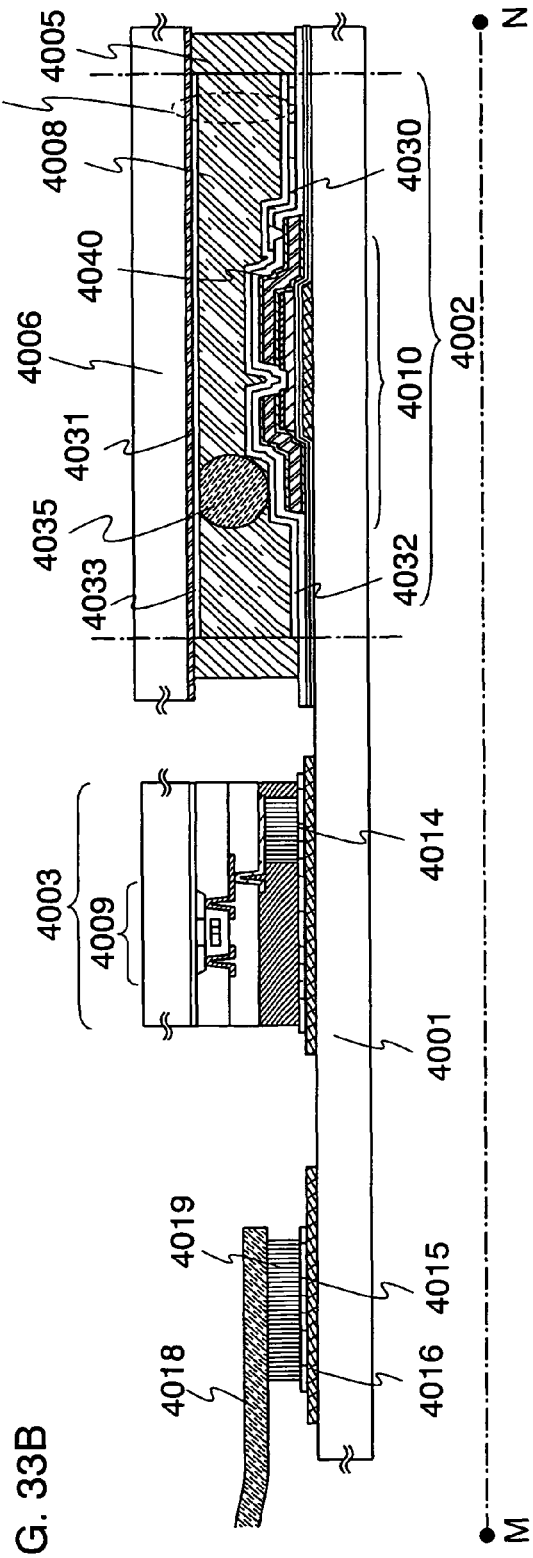

Next, the appearance and a cross section of a liquid crystal display panel which corresponds to one mode of the liquid crystal display device of the present invention will be described with reference to FIGS. 33A and 33B. FIG. 33A is a top plane view of a panel. In the panel, a thin film transistor 4010 in which a microcrystalline semiconductor film is used and a liquid crystal element 4013 which are formed over a first substrate 4001 are sealed between the first substrate 4001 and a second substrate 4006 by a sealing material 4005. FIG. 33B is a cross-sectional view taken along a line M-N in FIG. 33A.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. Accordingly, the pixel portion 4002 and the scan line driver circuit 4004 are sealed together with liquid crystal 4008 by the first substrate 4001, the sealing material 4005, and the second substrate 4006. In addition, a signal line driver circuit 4003 formed using a polycrystalline semiconductor film over a different substrate is mounted on a region over the first substrate 4001, which is different from the region surrounded by the sealing material 4005. Note that in this embodiment mode, an example is described in which the signal line driver circuit including a thin film transistor using a polycrystalline semiconductor film is attached to the first substrate 4001; however, a signal line driver circuit may be formed using a transistor using a single crystalline semiconductor and attached to a substrate. FIGS. 33A and 33B illustrate a thin film transistor 4009 formed using a polycrystalline semiconductor film, which is included in the signal line driver circuit 4003.

Each of the pixel portion 4002 and the scan line driver circuit 4004 which are provided over the first substrate 4001 includes a plurality of thin film transistors. FIG. 33B shows the thin film transistor 4010 included in the pixel portion 4002. The thin film transistor 4010 corresponds to a thin film transistor in which a microcrystalline semiconductor film is used, and can be similarly manufactured through the steps described in Embodiment Modes 1 to 4.

Reference numeral 4011 denotes a liquid crystal element, and a pixel electrode 4030 included in the liquid crystal element 4013 is electrically connected to the thin film transistor 4010 through a wiring 4040. A counter electrode 4031 of the liquid crystal element 4013 is formed on the second substrate 4006. A portion where the pixel electrode 4030, the counter electrode 4031, and the liquid crystal 4008 overlap corresponds to the liquid crystal element 4013. Note that an alignment film 4032 is provided between the pixel electrode 4030 and the liquid crystal, and an alignment film 4033 is provided between the counter electrode 4031 and the liquid crystal 4008.

Note that for each of the first substrate 4001 and the second substrate 4006, glass, metal (typically, stainless steel), ceramic, or plastic can be used. As plastic, a fiberglass-reinforced plastics (FRP) plate, a polyvinyl fluoride (PVF) film, a polyester film, or an acrylic resin film can be used. Moreover, a sheet in which aluminum foil is interposed between PVF films or polyester films can also be used.

A spherical spacer 4035 is provided in order to control a distance (a cell gap) between the pixel electrode 4030 and the counter electrode 4031. Note that a spacer obtained by selective etching of an insulating film may be used.

A variety of signals and a potential supplied to the signal line driver circuit 4003, and either the scan line driver circuit 4004 or the pixel portion 4002, which are formed separately, are supplied from an FPC 4018 through lead wirings 4014 and 4015.

In this embodiment mode, a connection terminal 4016 is formed using the same conductive film as that of the pixel electrode 4030 included in the liquid crystal element 4013. In addition, the lead wirings 4014 and 4015 are formed using the same conductive film as that of the wiring 4041.

The connection terminal 4016 is electrically connected to a terminal included in the FPC 4018 through an anisotropic conductive film 4019.

Note that, although not shown, the liquid crystal display device shown in this embodiment mode includes an alignment film and a polarizing plate, and may also include a color filter or a shielding film.

Although FIGS. 33A and 33B also illustrate an example in which the signal line driver circuit 4003 is separately formed and attached to the first substrate 4001, this embodiment mode is not limited to this structure. A scan line driver circuit may be separately formed and attached to a substrate, or only part of a signal line driver circuit or part of a scan line driver circuit may be separately formed and attached to a substrate.

This embodiment mode can be implemented in combination with any of the structures described in other embodiment modes.

Embodiment Mode 9

The display device or the like obtained by the present invention can be used for a display module (an active matrix EL module or a liquid crystal module). That is, the present invention can be implemented in any of electronic devices having a display portion into which such a display module is incorporated.

As examples of such electronic devices, the following can be given: cameras such as video cameras and digital cameras, head-mounted displays (goggle-type displays), car navigation systems, projectors, car stereos, personal computers, and portable information terminals (e.g., mobile computers, cellular phones, and e-book readers). FIGS. 35A to 35D show examples of such electronic devices.

Figure 35A:
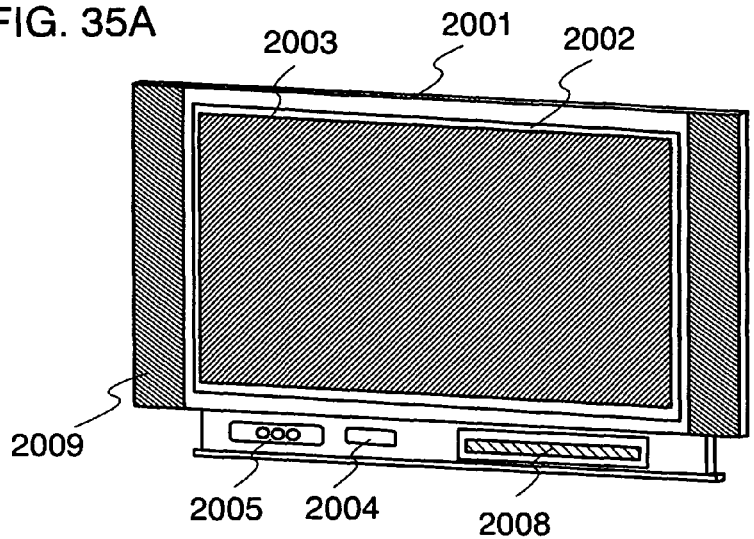
FIGS. 35A to 35D are diagrams showing electronic devices to which the present invention is applied.

FIG. 35A shows a television device. A display module is incorporated into a housing as shown in FIG. 35A, whereby the television device can be completed. A display panel at the stage after an FPC is attached is also referred to as a display module. A main screen 2003 is formed using the display module, and other accessories such as speaker portions 2009 and an operation switch are provided. Thus, the television device can be completed.

As shown in FIG. 35A, a display panel 2002 using a display element is incorporated into a housing 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be performed. The television device can be operated by a switch incorporated into the housing or a separate remote control unit 2006. The remote control unit may include a display portion 2007 for displaying information to be output.

In addition, the television device may include a sub screen 2008 formed using a second display panel for displaying channels, sound volume, and the like, in addition to the main screen 2003. In this structure, the main screen 2003 may be formed using a light-emitting display panel with an excellent viewing angle, and the sub screen may be formed using a liquid crystal display panel in which display is performed with low power consumption. Alternatively, when reduction in power consumption is prioritized, a structure may be employed in which the main screen 2003 is formed using a light-emitting display panel, the sub screen is formed using a liquid crystal display panel, and the sub screen can be turned on and off.

Figure 34:
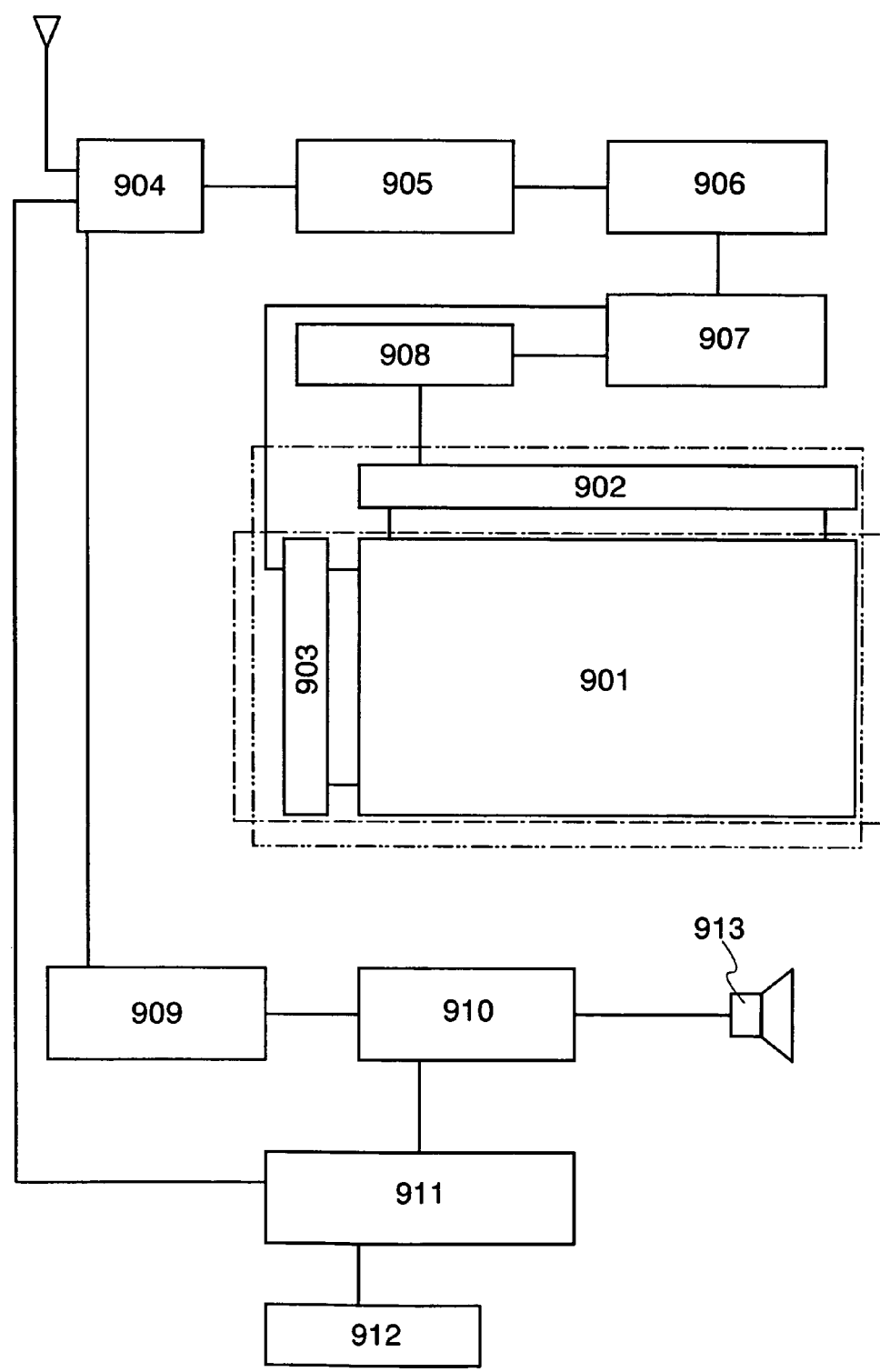
FIG. 34 is a block diagram showing a main structure of an electronic device to which the present invention is applied.

FIG. 34 is a block diagram of a main structure of a television device. A display panel is provided with a pixel portion 901. A signal line driver circuit 902 and a scan line driver circuit 903 may be mounted on the display panel by a COG method.

As other external circuits, a video signal amplifier circuit 905 which amplifies a video signal among signals received by a tuner 904; a video signal processing circuit 906 which converts a signal output from the video signal amplifier circuit 905 into a color signal corresponding to each color of red, green, and blue; a control circuit 907 which converts the video signal into an input specification of a driver IC; and the like are provided on the input side of the video signal. The control circuit 907 outputs signals to each of the scan line side and the signal line side. When digital driving is performed, a structure may be employed in which a signal dividing circuit 908 is provided on the signal line side and an input digital signal is divided into m signals to be supplied.

Among the signals received by the tuner 904, an audio signal is transmitted to an audio signal amplifier circuit 909, and an output thereof is supplied to a speaker 913 through an audio signal processing circuit 910. A control circuit 911 receives control information on receiving station (receiving frequency) and volume from an input portion 912 and transmits a signal to the tuner 904 and the audio signal processing circuit 910.

Needless to say, the present invention is not limited to a television device and can be applied to various uses ranging from a monitor of a personal computer to a large display medium such as an information display board at the train station, the airport, or the like, or an advertisement display board on the street, and the like.

Figure 35B:
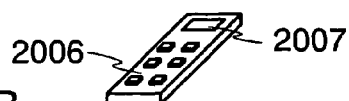

FIG. 35B shows an example of a cellular phone 2301. The cellular phone 2301 includes a display portion 2302, an operation portion 2303, and the like. When the display device described in the above-described embodiment mode is used for the display portion 2302, mass productivity can be increased.

Figure 35C:
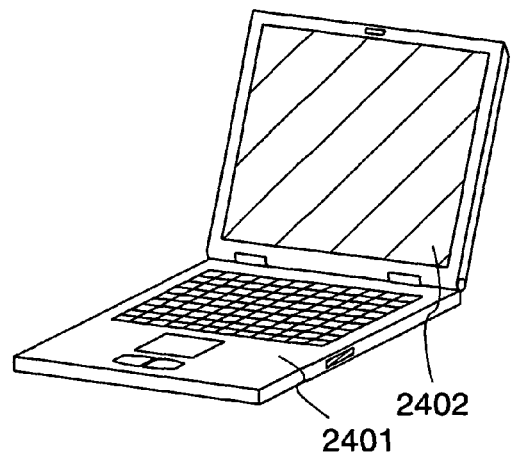

A portable computer shown in FIG. 35C includes a main body 2401, a display portion 2402, and the like. When the display device described in the above-described embodiment mode is used for the display portion 2402, mass productivity can be increased.

Figure 35D:
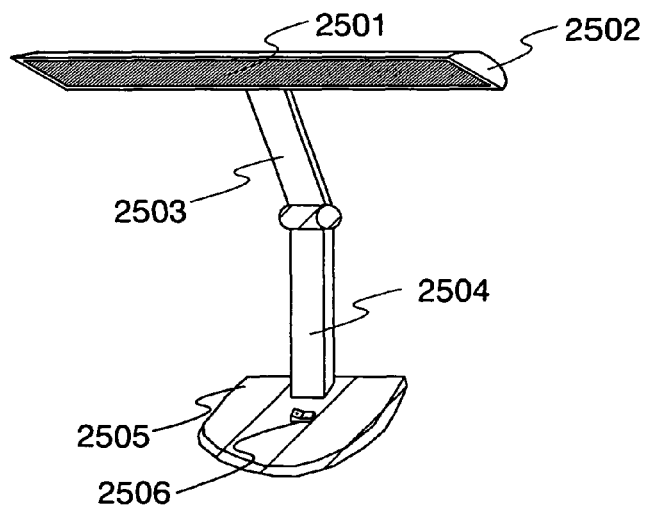

FIG. 35D shows a desk lamp including a lighting portion 2501, a shade 2502, an adjustable arm 2503, a support 2504, a base 2505, and a power supply switch 2506. The desk lamp is formed using the display device, which is formed using a manufacturing apparatus of the present invention, for the lighting portion 2501. Note that a lamp includes a ceiling light, a wall light, and the like in its category. The manufacturing method of a display device of the present invention which enables high mass productivity makes it possible to reduce manufacturing cost, and thus an inexpensive desk lamp can be provided.

This application is based on Japanese Patent Application serial no. 2007-196272 filed with Japan Patent Office on Jul. 27, 2007, the entire contents of which are hereby incorporated by reference.

What is claimed is:

1. A method for manufacturing a semiconductor device comprising:
   forming a gate electrode over a substrate;
   forming a gate insulating film over the gate electrode;
   forming a microcrystalline semiconductor film over the gate insulating film;
   forming an amorphous semiconductor film over the microcrystalline semiconductor film;

forming a semiconductor film to which an impurity imparting one conductivity type is added over the amorphous semiconductor film;

forming a conductive film over the semiconductor film to which the impurity imparting the one conductive type is added;

emitting a laser light to the conductive film to modify at least the amorphous semiconductor film into a microcrystalline semiconductor film; and forming a channel-etch type thin film transistor while the conductive film remains over the semiconductor film to which the impurity imparting one conductivity type is added.

2. The method for manufacturing a semiconductor device according to claim 1, wherein a source electrode and a drain electrode of the channel-etch type thin film transistor are formed by using the conductive film.

3. The method for manufacturing a semiconductor device according to claim 1, wherein the gate insulating film is formed as a stacked layer of a silicon nitride film, a silicon oxynitride film, and a silicon nitride film over the gate electrode.

4. The method for manufacturing a semiconductor device according to claim 1, wherein the gate insulating film, the microcrystalline semiconductor film, the amorphous semiconductor film, and the semiconductor film to which the impurity imparting one conductivity type is added are successively formed without being exposed to air.

5. The method for manufacturing a semiconductor device according to claim 1, wherein the semiconductor device is one selected from the group consisting of a television device, a telephone, a computer, and a lamp.

6. A method for manufacturing a semiconductor device comprising:

forming a gate electrode over a substrate;

forming a gate insulating film over the gate electrode;

forming a microcrystalline semiconductor film over the gate insulating film;

forming an amorphous semiconductor film over the microcrystalline semiconductor film;

forming a semiconductor film to which an impurity imparting one conductivity type is added over the amorphous semiconductor film;

forming a conductive film over the semiconductor film to which the impurity imparting the one conductive type is added;

emitting a laser light to the conductive film to modify the amorphous semiconductor film into a microcrystalline semiconductor film and to modify the semiconductor film to which the impurity imparting one conductivity type is added into a microcrystalline semiconductor film to which the impurity imparting the one conductivity type is added; and forming a channel-etch type thin film transistor while the conductive film remains over the semiconductor film to which the impurity imparting one conductivity type is added.

7. The method for manufacturing a semiconductor device according to claim 6, wherein a source electrode and a drain electrode of the channel-etch type thin film transistor are formed by using the conductive film.

8. The method for manufacturing a semiconductor device according to claim 6, wherein the gate insulating film is formed as a stacked layer of a silicon nitride film, a silicon oxynitride film, and a silicon nitride film over the gate electrode.

9. The method for manufacturing a semiconductor device according to claim 6, wherein the gate insulating film, the microcrystalline semiconductor film, the amorphous semiconductor film, and the semiconductor film to which the impurity imparting one conductivity type is added are successively formed without being exposed to air.

10. The method for manufacturing a semiconductor device according to claim 6, wherein the semiconductor device is one selected from the group consisting of a television device, a telephone, a computer, and a lamp.

11. A method for manufacturing a semiconductor device comprising:

forming a gate electrode over a substrate;

forming a gate insulating film over the gate electrode;

forming a microcrystalline semiconductor film over the gate insulating film;

forming an amorphous semiconductor film over the microcrystalline semiconductor film;

forming a semiconductor film to which an impurity imparting one conductivity type is added over the amorphous semiconductor film;

forming a conductive film over the semiconductor film to which the impurity imparting the one conductive type is added;

emitting a laser light to the conductive film to modify at least the amorphous semiconductor film into a microcrystalline semiconductor film;

forming a channel-etch type thin film transistor while the conductive film remains over the semiconductor film to which the impurity imparting one conductivity type is added; and forming a pixel electrode electrically connected to the channel-etch type thin film transistor.

12. The method for manufacturing a semiconductor device according to claim 11, wherein a source electrode and a drain electrode of the channel-etch type thin film transistor are formed by using the conductive film.

13. The method for manufacturing a semiconductor device according to claim 11, wherein the gate insulating film is formed as a stacked layer of a silicon nitride film, a silicon oxynitride film, and a silicon nitride film over the gate electrode.

14. The method for manufacturing a semiconductor device according to claim 11, wherein the gate insulating film, the microcrystalline semiconductor film, the amorphous semiconductor film, and the semiconductor film to which the impurity imparting one conductivity type is added are successively formed without being exposed to air.

15. The method for manufacturing a semiconductor device according to claim 11, wherein the semiconductor device is one selected from the group consisting of a television device, a telephone, a computer, and a lamp.

16. A method for manufacturing a semiconductor device comprising:

forming a gate electrode over a substrate;

forming a gate insulating film over the gate electrode;

forming a microcrystalline semiconductor film over the gate insulating film;

forming an amorphous semiconductor film over the microcrystalline semiconductor film;

forming a semiconductor film to which an impurity imparting one conductivity type is added over the amorphous semiconductor film;

forming a conductive film over the semiconductor film to which the impurity imparting the one conductive type is added;

emitting a laser light to the conductive film to modify the amorphous semiconductor film into a microcrystalline semiconductor film and to modify the semiconductor film to which the impurity imparting one conductivity type is added into a microcrystalline semiconductor film to which the impurity imparting the one conductivity type is added;

forming a channel-etch type thin film transistor while the conductive film remains over the semiconductor film to which the impurity imparting one conductivity type is added; and forming a pixel electrode electrically connected to the channel-etch type thin film transistor.

17. The method for manufacturing a semiconductor device according to claim 16, wherein a source electrode and a drain electrode of the channel-etch type thin film transistor are formed by using the conductive film.

18. The method for manufacturing a semiconductor device according to claim 16, wherein the gate insulating film is formed as a stacked layer of a silicon nitride film, a silicon oxynitride film, and a silicon nitride film over the gate electrode.

19. The method for manufacturing a semiconductor device according to claim 16, wherein the gate insulating film, the microcrystalline semiconductor film, the amorphous semiconductor film, and the semiconductor film to which the impurity imparting one conductivity type is added are successively formed without being exposed to air.

20. The method for manufacturing a semiconductor device according to claim 16, wherein the semiconductor device is one selected from the group consisting of a television device, a telephone, a computer, and a lamp.

* * * * *